(12) United States Patent
Toyoda et al.

(10) Patent No.: US 7,396,707 B2
(45) Date of Patent: Jul. 8, 2008

(54) FABRICATION METHOD OF A SEMICONDUCTOR DEVICE

(75) Inventors: Yoshihiko Toyoda, Hyogo (JP); Takao Sakamoto, Hyogo (JP); Kazuyuki Sugahara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/565,429

(22) Filed: Nov. 30, 2006

(65) Prior Publication Data

US 2007/0087535 A1 Apr. 19, 2007

Related U.S. Application Data

(63) Continuation of application No. 11/091,570, filed on Mar. 29, 2005, now Pat. No. 7,176,491.

(30) Foreign Application Priority Data

Apr. 21, 2004 (JP) .............................. 2004-125409

(51) Int. Cl.
*H01L 29/47* (2006.01)
(52) U.S. Cl. .................. 438/149; 438/151; 257/59; 257/72; 257/347; 257/E21.413
(58) Field of Classification Search ................ 438/149, 438/151; 257/59, 72, 347, E21.413
See application file for complete search history.

(56) References Cited

U.S. PATENT DOCUMENTS 6,501,098 B2 * 12/2002 Yamazaki ..................... 257/72

| 6,624,473 | B1 | 9/2003 | Takehashi et al. |
| 6,963,083 | B2 | 11/2005 | Nam |
| 2003/0025161 | A1 | 2/2003 | Sera |
| 2003/0211664 | A1 | 11/2003 | Fujimoto et al. |
| 2005/0253195 | A1 | 11/2005 | Toyoda et al. |

FOREIGN PATENT DOCUMENTS

| CN | 1402357 A | 3/2003 |
| JP | 2001-345448 | 12/2001 |
| JP | 2002-76351 | 3/2002 |

* cited by examiner

*Primary Examiner*—Andy Huynh
(74) *Attorney, Agent, or Firm*—Oblon, Spivak, McClelland, Maier & Neustadt, P.C.

(57) ABSTRACT

A silicon nitride film and a silicon oxide film are formed on a glass substrate. On the silicon oxide film is formed a thin film transistor T including a source region, a drain region, a channel region having a predetermined channel length, a first GOLD region having an impurity concentration lower than the impurity concentration of the source region, a second GOLD region having an impurity concentration lower than the impurity concentration of the drain region, a gate insulation film, and a gate electrode. The length of an overlapping portion in plane between the gate electrode and the second GOLD region in the direction of the channel length is set longer than the length in the direction of the channel region of an overlapping portion in plane between the gate electrode and the first GOLD region.

1 Claim, 42 Drawing Sheets

4ad 4ab G1 4aa G2 4ac 4ae

4ad 4ab 4aa 4ac 4ae

FIG.13
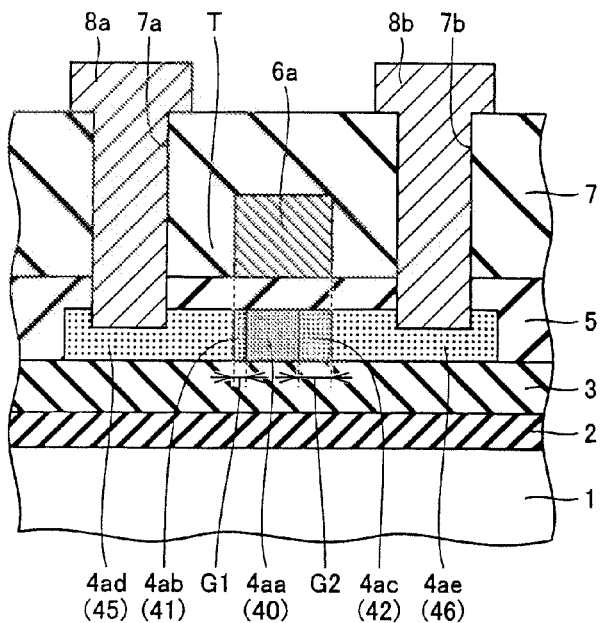
FIG.14
| SOURCE-DRAIN BREAKDOWN VOLTAGE OF THIN FILM TRANSISTOR | |
|---|---|
| THIN FILM TRANSISTOR OF PRESENT EMBODIMENT | 17.9V |
| THIN FILM TRANSISTOR OF CONVENTIONAL GOLD STRUCTURE | 17.7V |
FIG.15
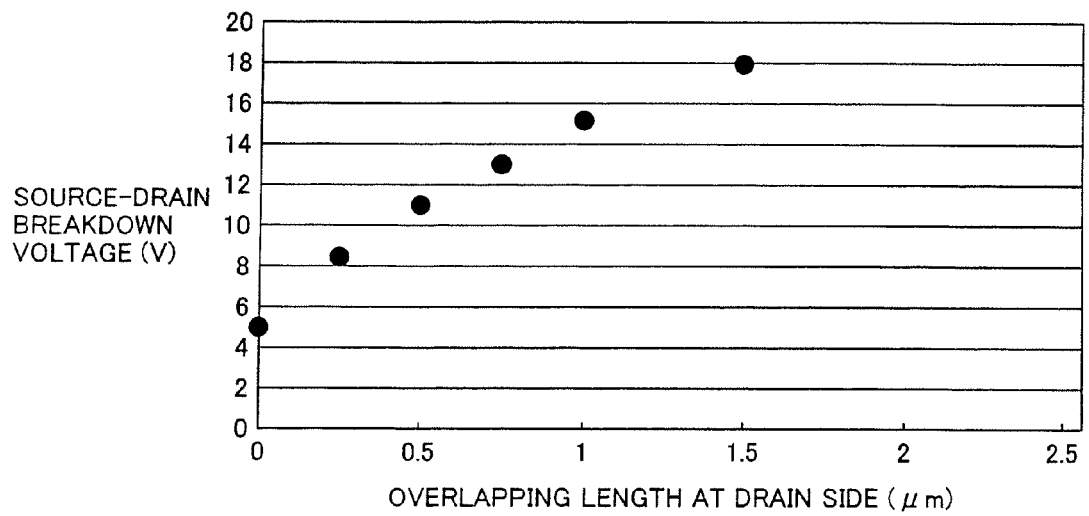

| SOURCE-DRAIN BREAKDOWN VOLTAGE OF THIN FILM TRANSISTOR | |
|---|---|
| THIN FILM TRANSISTOR OF PRESENT EMBODIMENT | 20.9V |
| THIN FILM TRANSISTOR OF CONVENTIONAL GOLD STRUCTURE | 20.3V |

| SOURCE-DRAIN BREAKDOWN VOLTAGE OF THIN FILM TRANSISTOR | |
|---|---|
| THIN FILM TRANSISTOR OF PRESENT EMBODIMENT | 17.7V |
| THIN FILM TRANSISTOR OF FIRST EMBODIMENT | 17.9V |
| THIN FILM TRANSISTOR OF CONVENTIONAL GOLD STRUCTURE | 17.7V |

| SOURCE-DRAIN BREAKDOWN VOLTAGE OF THIN FILM TRANSISTOR | |
|---|---|
| THIN FILM TRANSISTOR OF PRESENT EMBODIMENT | 20.7V |
| THIN FILM TRANSISTOR OF SECOND EMBODIMENT | 20.9V |
| THIN FILM TRANSISTOR OF CONVENTIONAL GOLD STRUCTURE | 20.3V |

| SOURCE-DRAIN BREAKDOWN VOLTAGE OF THIN FILM TRANSISTOR | |
|---|---|
| THIN FILM TRANSISTOR OF PRESENT EMBODIMENT | 19.4V |
| THIN FILM TRANSISTOR OF FIRST EMBODIMENT | 17.9V |
| THIN FILM TRANSISTOR OF CONVENTIONAL GOLD STRUCTURE | 17.7V |

| SOURCE-DRAIN BREAKDOWN VOLTAGE OF THIN FILM TRANSISTOR | |
|---|---|
| THIN FILM TRANSISTOR OF PRESENT EMBODIMENT | 22.9V |
| THIN FILM TRANSISTOR OF SECOND EMBODIMENT | 20.9V |
| THIN FILM TRANSISTOR OF CONVENTIONAL GOLD STRUCTURE | 20.3V |

| SOURCE-DRAIN BREAKDOWN VOLTAGE OF THIN FILM TRANSISTOR | |
|---|---|
| THIN FILM TRANSISTOR OF PRESENT EMBODIMENT | 19.3V |
| THIN FILM TRANSISTOR OF FIRST EMBODIMENT | 17.9V |
| THIN FILM TRANSISTOR OF CONVENTIONAL GOLD STRUCTURE | 17.7V |

| SOURCE-DRAIN BREAKDOWN VOLTAGE OF THIN FILM TRANSISTOR | |
|---|---|
| THIN FILM TRANSISTOR OF PRESENT EMBODIMENT | 22.7V |
| THIN FILM TRANSISTOR OF SECOND EMBODIMENT | 20.9V |
| THIN FILM TRANSISTOR OF CONVENTIONAL GOLD STRUCTURE | 20.3V |

| SOURCE-DRAIN BREAKDOWN VOLTAGE OF THIN FILM TRANSISTOR | |
|---|---|
| THIN FILM TRANSISTOR OF PRESENT EMBODIMENT | 22.7V |
| THIN FILM TRANSISTOR OF FIRST EMBODIMENT | 17.9V |
| THIN FILM TRANSISTOR OF CONVENTIONAL GOLD STRUCTURE | 17.7V |

| SOURCE-DRAIN BREAKDOWN VOLTAGE OF THIN FILM TRANSISTOR | |
|---|---|
| THIN FILM TRANSISTOR OF PRESENT EMBODIMENT | 27.2V |
| THIN FILM TRANSISTOR OF SECOND EMBODIMENT | 20.9V |
| THIN FILM TRANSISTOR OF CONVENTIONAL GOLD STRUCTURE | 20.3V |

| SOURCE-DRAIN BREAKDOWN VOLTAGE OF THIN FILM TRANSISTOR | |
|---|---|
| THIN FILM TRANSISTOR OF PRESENT EMBODIMENT | 22.2V |
| THIN FILM TRANSISTOR OF FIRST EMBODIMENT | 17.9V |
| THIN FILM TRANSISTOR OF CONVENTIONAL GOLD STRUCTURE | 17.7V |

| SOURCE-DRAIN BREAKDOWN VOLTAGE OF THIN FILM TRANSISTOR | |
|---|---|
| THIN FILM TRANSISTOR OF PRESENT EMBODIMENT | 26.7V |
| THIN FILM TRANSISTOR OF SECOND EMBODIMENT | 20.9V |
| THIN FILM TRANSISTOR OF CONVENTIONAL GOLD STRUCTURE | 20.3V |

|  | GATE OCCUPYING AREA |
|---|---|
| THIN FILM TRANSISTOR OF GOLD STRUCTURE OF PRESENT EMBODIMENT | 70 μ m² |
| THIN FILM TRANSISTOR OF CONVENTIONAL LDD STRUCTURE | 50 μ m² |

FIG.84
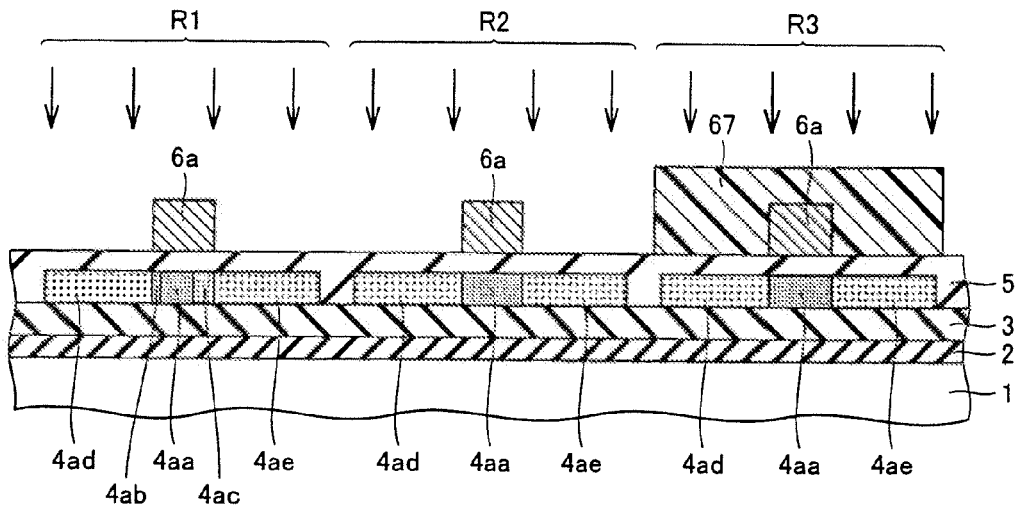
FIG.85
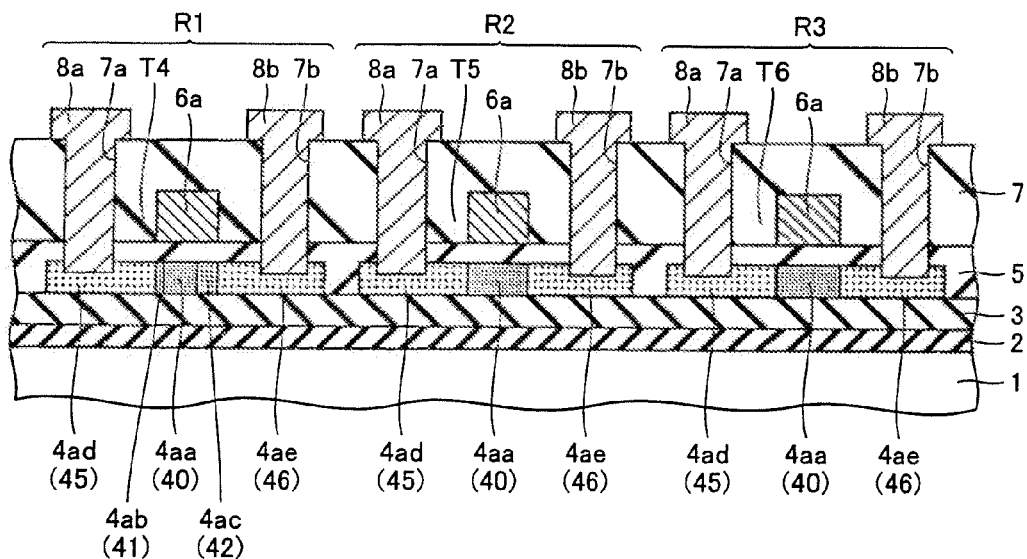
FIG.86
| | GATE OCCUPYING AREA |
|---|---|
| THIN FILM TRANSISTOR OF GOLD STRUCTURE OF PRESENT EMBODIMENT | 70 $\mu m^2$ |
| THIN FILM TRANSISTOR OF CONVENTIONAL SD STRUCTURE | 50 $\mu m^2$ |

FABRICATION METHOD OF A SEMICONDUCTOR DEVICE

CROSS-REFERENCE TO RELATED APPLICATIONS

This application is a continuation of, and claims the benefit of priority under 35 U.S.C. §120 from, U.S. Ser. No. 11/091,570, filed Mar. 29, 2005, now U.S. Pat. No. 7,176,491, and claims the benefit of priority under 35 U.S.C. §119 from Japanese Patent Application No. 2004-125409, filed Apr. 21, 2004. The entire contents of each of the above applications are incorporated herein by reference.

BACKGROUND OF THE INVENTION

1. Field of the Invention

The present invention relates to a semiconductor device. More particularly, the present invention relates to a semiconductor device applied to display devices such as a liquid crystal display device and organic EL (Electro Luminescence) display device.

2. Description of the Background Art

A thin film transistor is used in a display device. As an example of such a thin film transistor, an n type thin film transistor of an LDD (Lightly Doped Drain) structure disclosed in Japanese Patent Laying-Open No. 2001-345448 will be described hereinafter.

An n type thin film transistor of an LDD structure has a source region, a drain region, a channel region, an LDD region, a gate insulation film, a gate electrode, and the like formed on a glass substrate. In the n type thin film transistor, a voltage higher than that applied to the gate is applied to the drain to produce a relatively large electric field at the junction region of the drain side.

Electrons accelerated by the electric field induce impact ionization, whereby a pair of an electron and hole is generated. Impact ionization is repeated to induce more pairs of electrons and holes, whereby the drain current is increased to result in avalanche breakdown. The drain voltage thereof becomes the source-drain breakdown voltage.

In a thin film transistor of the LDD structure, an LDD region is formed at a region between the channel region and the source region, and at a region between the channel region and the drain region. The impurity concentration of the LDD region is set higher than that of the channel region and set lower than that of the source region and drain region. By alleviating the electric field in the proximity of the drain region through the LDD region, impact ionization is suppressed, whereby the source-drain breakdown voltage can be improved.

A thin film transistor of an LDD structure had the problem that the ON current of the thin film transistor is low since the resistance of the LDD region functions as parasitic resistance.

To solve this problem, a thin film transistor of a GOLD (Gate Overlapped Lightly Doped Drain) structure is proposed in Japanese Patent Laying-Open No. 2002-076351. An n type thin film transistor of a GOLD structure has a source region, a drain region, a channel region, a GOLD region, a gate insulation film, a gate electrode, and the like formed on a glass substrate.

The GOLD region is formed at a region between the channel region and the source region, and a region between the channel region and the drain region, particularly at a region located right under the gate electrode. The GOLD region is formed overlapping with the gate electrode in plane. Since the GOLD region is located right under the gate with a relatively low impurity concentration, a relatively high ON current can be obtained. Furthermore, relatively favorable source-drain breakdown voltage can be ensured.

However, the resistance of the GOLD region in a thin film transistor of a GOLD structure similarly becomes a factor of parasitic resistance.

SUMMARY OF THE INVENTION

An object of the present invention is to provide a semiconductor device directed to further reducing parasitic resistance.

According to an aspect of the present invention, a semiconductor device includes a semiconductor element having a semiconductor layer, an insulation film, and an electrode formed on a predetermined substrate. The semiconductor element includes a first element. The first element includes a first impurity region, a second impurity region, a channel region, a third impurity region, and a fourth impurity region. The first impurity region is formed at the semiconductor layer, and has a predetermined impurity concentration. The second impurity region is formed at the semiconductor layer with a distance from the first impurity region, and has a predetermined impurity concentration. The channel region is formed, functioning as a channel having a predetermined channel length, at a portion of the semiconductor layer located between the first and second impurity regions, with respective distances from the first and second impurity regions. The third impurity region is formed at a portion of the semiconductor layer located between the first impurity region and the channel region, and in contact with the channel region. The third impurity region has an impurity concentration lower than that of the first impurity region. The fourth impurity region is formed at a portion of the semiconductor layer located between the second impurity region and the channel region, and in contact with the channel region. The fourth impurity region has an impurity concentration lower than that of the second impurity region. At the first element, the electrode has one side and another side, opposite to each other, and is formed overlapping with and facing the channel region, a portion of the third impurity region, and a portion of the fourth impurity region. The insulation film is formed between the semiconductor layer and electrode so as to come into contact respectively with the semiconductor layer and the electrode. The first overlapping length in the direction of the channel length of the overlapping region between the electrode and the third impurity region arranged facing each other, starting from the region where a plane including one side intersects the semiconductor layer up to the channel region, is shorter than the second overlapping length in the direction of the channel length of the overlapping region between the electrode and the fourth impurity region arranged facing each other, starting from the region where a plane including the another side intersects the semiconductor layer up to the channel region.

In accordance with the above-described structure, a thin film transistor including first to fourth impurity regions, an electrode and a channel region is implemented. The thin film transistor includes an overlapping region between the electrode and the third impurity region, and also an overlapping region between the electrode and the fourth impurity region. The first overlapping length in the direction of the channel length of the overlapping region between the electrode and the third impurity region is set shorter than the second overlapping length in the direction of the channel length of the overlapping region between the electrode and the fourth impurity region. Accordingly, the parasitic capacitance of the thin film transistor can be reduced without degrading the breakdown voltage between the first impurity region and the second impurity region, as compared to a thin film transistor in which the first overlapping length and the second overlapping length are identical.

According to another aspect of the present invention, a semiconductor device includes a semiconductor element having a semiconductor layer, an insulation film, and an electrode formed on a predetermined substrate. The semiconductor element includes a first element. The first element includes a first impurity region, a second impurity region, a channel region, and a third impurity region. The first impurity region is formed at the semiconductor layer, and has a predetermined impurity concentration. The second impurity region is formed at the semiconductor layer with a distance from the first impurity region, and has a predetermined impurity concentration. The channel region is formed, functioning as a channel having a predetermined channel length, at a portion of the semiconductor layer located between the first and second impurity regions, with a distance from the second impurity region. The third impurity region is formed at a portion of the semiconductor layer located between the second impurity region and the channel region, and in contact with the channel region. The third impurity region has an impurity concentration lower than that of the second impurity region. At the first element, the electrode has one side and another side, opposite to each other, and is formed overlapping with and facing the channel region and a portion of the third impurity region. The insulation film is formed between the semiconductor layer and electrode so as to come into contact respectively with the semiconductor layer and the electrode. The junction between the first impurity region and the channel region is located substantially on the same plane as the one side. Also, the length in the direction of the channel length of the overlapping region between the electrode and the third impurity region, up to the region where the plane including the another side intersects the semiconductor layer has a predetermined length.

In accordance with the above-described structure, a thin film transistor including first to third impurity regions, an electrode, and a channel region is implemented. In this thin film transistor, the electrode overlaps with only the third impurity region in addition to the channel region by just a predetermined length. Accordingly, the parasitic capacitance of the thin film transistor can be reduced without degrading the breakdown voltage between the first and second impurity regions, as compared to a conventional thin film transistor.

A fabrication method of a semiconductor device according to the present invention includes the steps of: forming an electrode on a substrate having a main surface; forming a predetermined semiconductor layer on the substrate; forming an insulation film on a substrate between the step of forming an electrode and the step of forming a semiconductor layer; forming a first mask material so as to cross the semiconductor layer; introducing impurity ions of a predetermined conductive type into the semiconductor layer using the first mask material as a mask to form a pair of first impurity regions having a predetermined impurity concentration at regions of the semiconductor layer located at one region and another region sandwiching the mask material with a portion of the semiconductor layer located right under the mask material as a channel region; forming on the semiconductor layer a second mask material covering the channel region entirely and respective portions of the first impurity regions constituting a pair; introducing impurity ions of a predetermined conductivity type to the semiconductor layer using the second mask material as a mask to form a pair of second impurity regions having an impurity concentration higher than the predetermined impurity concentration at a portion of the first impurity regions located at one side and the other side with the channel region therebetween. In the step of forming an electrode, the electrode has one side and another side opposite to each other, and is formed overlapping with and facing the channel region entirely and respective portions of the first impurity regions constituting a pair. The distance starting from the region where a plane including the another side of the electrode intersecting one of the first impurity regions constituting a pair up to the channel region is set to shorter than the distance starting from the region where a plane including the other side of the electrode intersecting the other of the first impurity regions constituting a pair up to the channel region.

In accordance with the present fabrication method, a thin film transistor including a first impurity region, a second impurity region, an electrode, and a channel region is formed. In the thin film transistor, the electrode is formed having both sides, and overlapping with and facing respective portions of the first impurity regions constituting a pair. The distance starting from a region of one of the first impurity regions located right under one of sides of the both sides of the electrode up to the channel region is set shorter than the distance starting from a region of the other first impurity region located right under the other side of the electrode up to the channel region. Accordingly, the parasitic capacitance of the thin film transistor can be reduced without degrading the breakdown voltage between the second impurity regions constituting a pair, as compared to a conventional thin film transistor.

A method of fabricating a semiconductor device according to another aspect of the present invention includes the steps of: forming an electrode on a substrate having a main surface; forming a predetermined semiconductor layer on the substrate, forming an insulation film on a substrate between the step of forming an electrode and the step of forming a semiconductor layer; forming a first mask material so as to cross the semiconductor layer; introducing impurity ions of a predetermined conductive type into the semiconductor layer using the first mask material as a mask to form a pair of first impurity regions having a predetermined impurity concentration at regions of the semiconductor layer located at one region and another region sandwiching the first mask material, with a portion of the semiconductor layer located right under the first mask material as a channel region; forming on the semiconductor layer a second mask material covering the channel region entirely and a portion of the other of the first impurity regions constituting a pair, not covering the one of the first impurity regions constituting a pair; introducing impurity ions of a predetermined conductivity type to the semiconductor layer with the second mask material as a mask to form a pair of second impurity regions having an impurity concentration higher than the predetermined impurity concentration at a region of the first impurity regions located at one side and the other side sandwiching the channel region. In the step of forming an electrode, the electrode has one side and another side opposite to each other, and is formed overlapping with and facing all the channel region and the portion of the other of the first impurity regions constituting a pair. The one side of the electrode is located substantially on the same plane as the junction between the channel region and one of the second impurity regions constituting a pair. Also, the region starting from where a plane including the another side of the electrode intersects the other of the first impurity regions up to the channel region has a predetermined length.

In accordance with the present fabrication method, a thin film transistor including a first impurity region, a second impurity region, an electrode, and a channel region is formed.

In the thin film transistor, the electrode is formed having opposite facing sides, right above a channel region, overlapping with and opposite to only the other of the first impurity regions constituting a pair. Accordingly, the parasitic capacitance of a thin film transistor can be reduced without degrading the breakdown voltage between the second impurity regions constituting a pair, as compared to a conventional thin film transistor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a sectional view of a semiconductor device of the first embodiment, representing a step carried out after the step of FIG. 12.

FIG. 14 represents the results of source-drain breakdown voltage of a thin film transistors in the first embodiment.

FIG. 15 is a graph representing the relationship between source-drain breakdown voltage and the overlapping length at the drain side in the first embodiment.

FIG. 84 is a sectional view of the semiconductor device of the fourteenth embodiment, representing a step carried out after the step of FIG. 83.

FIG. 85 is a sectional view of the semiconductor device of the fourteenth embodiment, representing a step carried out after the step of FIG. 84.

FIG. 86 represents the gate occupying area of a thin film transistor of the fourteenth embodiment.

DESCRIPTION OF THE PREFERRED EMBODIMENTS

First Embodiment

Figure 1:
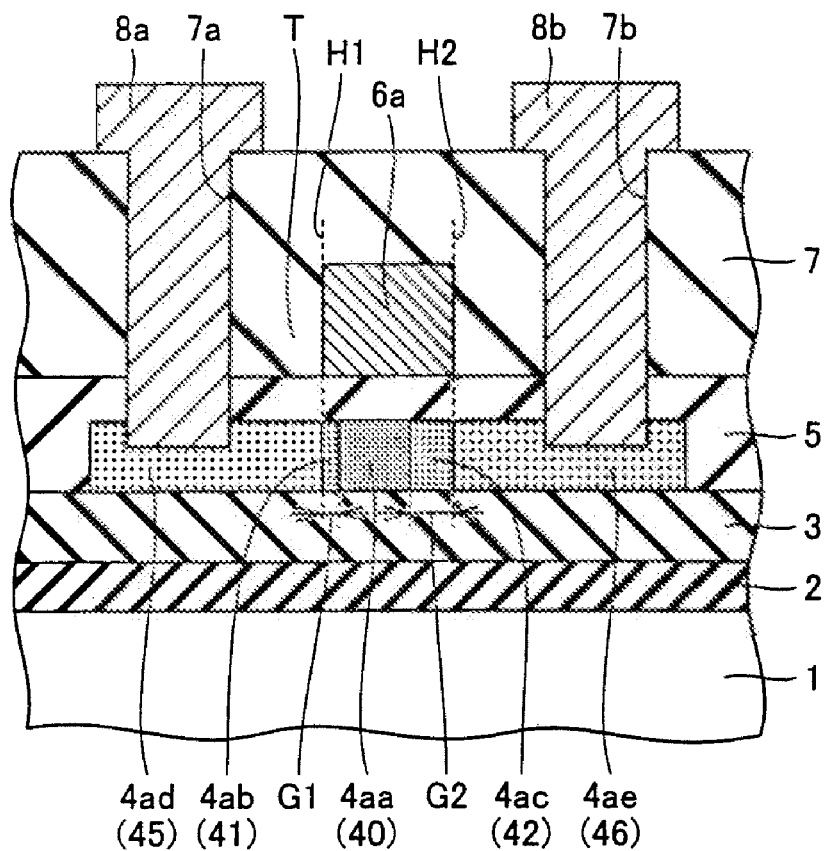
FIG. 1 is a sectional view of a semiconductor device according to a first embodiment of the present invention.

A semiconductor device according to a first embodiment of the present invention will be described hereinafter. Referring to FIG. 1, a silicon nitride film 2 is formed on a glass substrate 1. A silicon oxide film 3 is formed on silicon nitride film 2. An island-shaped polycrystalline silicon film is formed on silicon oxide film 3. At the polycrystalline silicon film are formed a source region 45 having a first impurity concentration, and a drain region 46 spaced apart from source region 45, and having a second impurity concentration.

At the region located between source region 45 and drain region 46, a channel region 40 having a predetermined channel length is formed with respective distance from source region 45 and drain region 46.

Across the region from source region 45 to channel region 40 is formed a GOLD region 41 having an impurity concentration lower than the first impurity concentration. Across the region from drain region 46 to channel region 40 is formed a GOLD region 42 having an impurity concentration lower than the second impurity concentration.

A gate insulation film 5 formed of a silicon oxide film is deposited so as to cover the island-shaped polycrystalline silicon film. A gate electrode 6a is formed on gate insulation film 5. An interlayer insulation film 7 formed of a silicon oxide film, for example, is deposited so as to cover gate electrode 6a. A contact hole 7a and a contact hole 7b exposing the surface of source region 45 and drain region 46, respectively, are formed in interlayer insulation film 7. A source electrode 8a and a drain electrode 8b are formed on interlayer insulation film 7 so as to fill contact holes 7a and 7b, respectively.

A thin film transistor T is implemented including gate electrode 6a, source region 45, drain region 46, GOLD regions 41 and 42, and channel region 40. In particular, gate electrode 6a is formed right above channel region 40 with opposite sides, overlapping with GOLD regions 41 and 42 in plane.

A length G2 in the direction of the channel length of the overlapping region between gate electrode 6a and GOLD region 42 in plane is set longer than a length G1 in the direction of the channel length of the overlapping region between gate electrode 6a and GOLD region 41 in plane.

Assuming a plane H1 including one side of gate electrode 6a and another plane H2 including the other side of gate electrode 6a, as indicated in FIG. 1, length G1 in the direction of the channel length of the overlapping region between gate electrode 6a and GOLD region 41 arranged opposite to each other, starting from the region where plane H1 intersects the semiconductor layer up to channel region 40, is set shorter than length G2 in the direction of the channel length of the overlapping region between gate electrode 6a and GOLD region 42 arranged opposite to each other, starting from the region where plane H2 intersects the semiconductor layer up to channel region 40. This configuration envisaging planes H1 and H2 is not limited to the present embodiment, and will also apply to respective embodiments set forth afterwards.

Figure 2:
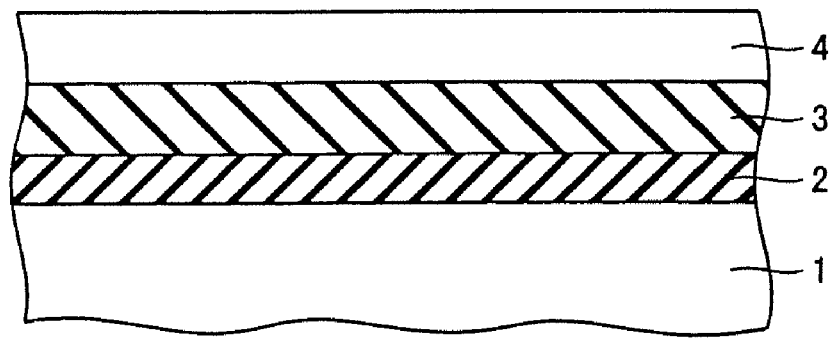
FIG. 2 is a sectional view of the semiconductor device of the first embodiment, representing a step in a method of fabricating the semiconductor device of FIG. 1.

An example of a method of fabricating the semiconductor device set forth above will be described hereinafter. Referring to FIG. 2, silicon nitride film 2 of approximately 100 nm in film thickness is deposited by plasma CVD (Chemical Vapor Deposition), for example, on the main surface of a glass substrate 1 of Type 1737 made by Corning Inc. Silicon oxide film 3 is formed to a thickness of approximately 100 nm on silicon nitride film 2. Then, an amorphous silicon film 4 of approximately 50 nm in film thickness is formed on silicon oxide film 3.

Silicon nitride film 2 is provided to prevent the impurities included in glass substrate 1 from diffusing upwards. As a film to prevent such impurity diffusion, the material of SiON, SiC, AlN, $Al_2O_3$, and the like may be applied in addition to the silicon nitride film. Although a double-layer structure of silicon nitride film 2 and silicon oxide film 3 is provided as the underlying film of amorphous silicon film 4, the present invention is not limited to such a double-layer structure. Such films may be omitted, or another film may be additionally layered.

By subjecting amorphous silicon film 4 to heat treatment in predetermined vacuum, hydrogen, present in amorphous silicon film 4 and that is not required, is removed. Then, amorphous silicon film 4 is irradiated with a laser beam by XeCl laser, for example, to be rendered polycrystalline, resulting in a polycrystalline silicon film. The polycrystalline silicon film has a grain size of approximately 0.5 μm.

Additionally, YAG laser, CW laser, or the like can be used instead of the XeCl laser. Furthermore, the amorphous silicon film may be rendered polycrystalline by thermal annealing. In the event of applying thermal annealing, polycrystalline silicon of a larger grain size can be obtained by using a catalyst such as nickel.

Figure 3:
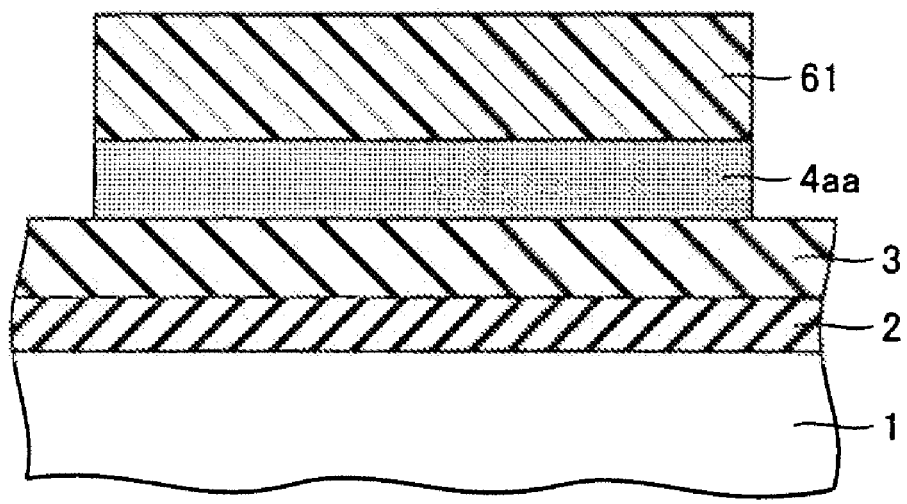
FIG. 3 is a sectional view of the semiconductor device of the first embodiment, representing a step carried out after the step of FIG. 2.

A predetermined resist pattern 61 (refer to FIG. 3) is formed on the polycrystalline silicon film. As shown in FIG. 3, the polycrystalline silicon film is subjected to anisotropic etching with resist pattern 61 as a mask, resulting in an island-shaped polycrystalline silicon film 4a. Then, ashing and chemical treatment are applied to remove resist pattern 61.

Figure 4:
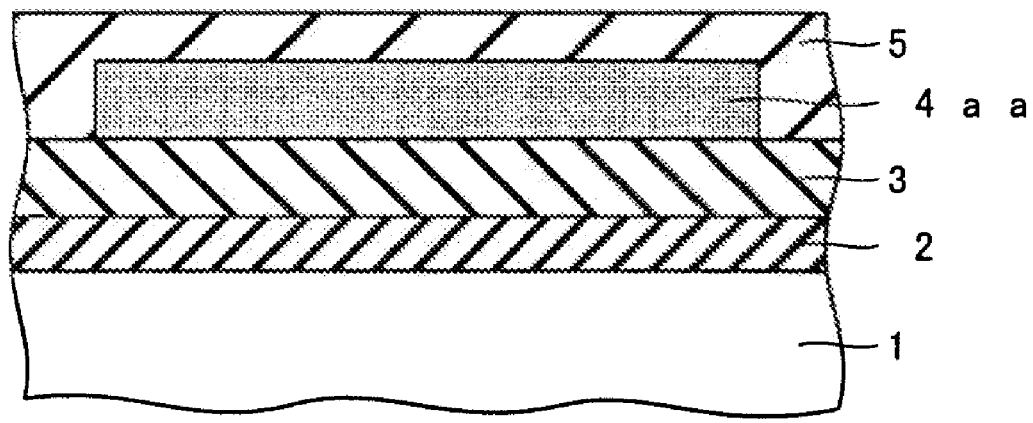
FIG. 4 is a sectional view of a semiconductor device of the first embodiment, representing a step carried out after the step of FIG. 3.

Referring to FIG. 4, a gate insulating film 5 formed of a silicon oxide film is deposited by plasma CVD, for example, to a thickness of approximately 100 nm so as to cover polycrystalline silicon film 4a. In this case, liquid TEOS (Tetra Ethyl Ortho Silicate) is employed as the base material of the silicon oxide film.

To control the threshold value of the thin film transistor, boron is implanted into polycrystalline silicon film 4a with a dosage of $1 \times 10^{12}$ atom/cm$^2$ and acceleration energy of 60 KeV, for example. This implantation process is to be carried out as necessary, and may be omitted.

Figure 5:
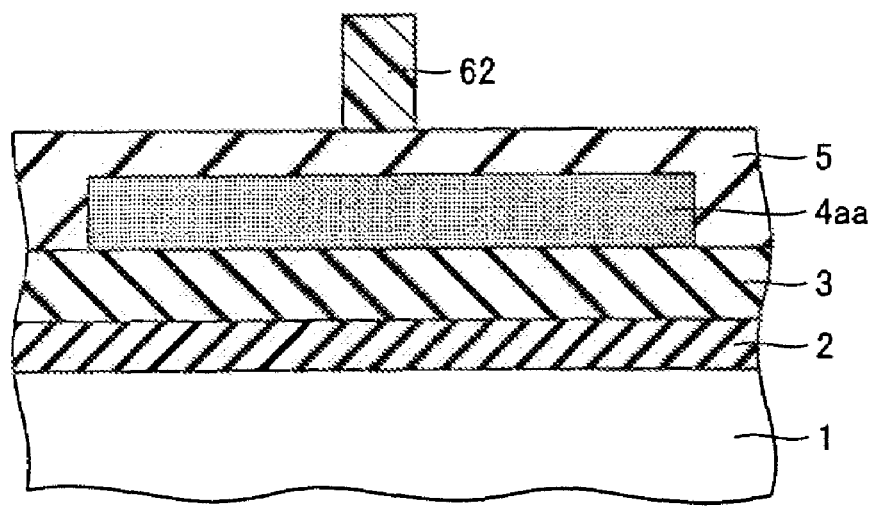
FIG. 5 is a sectional view of a semiconductor device of the first embodiment, representing a step carried out after the step of FIG. 4.
Figure 6:
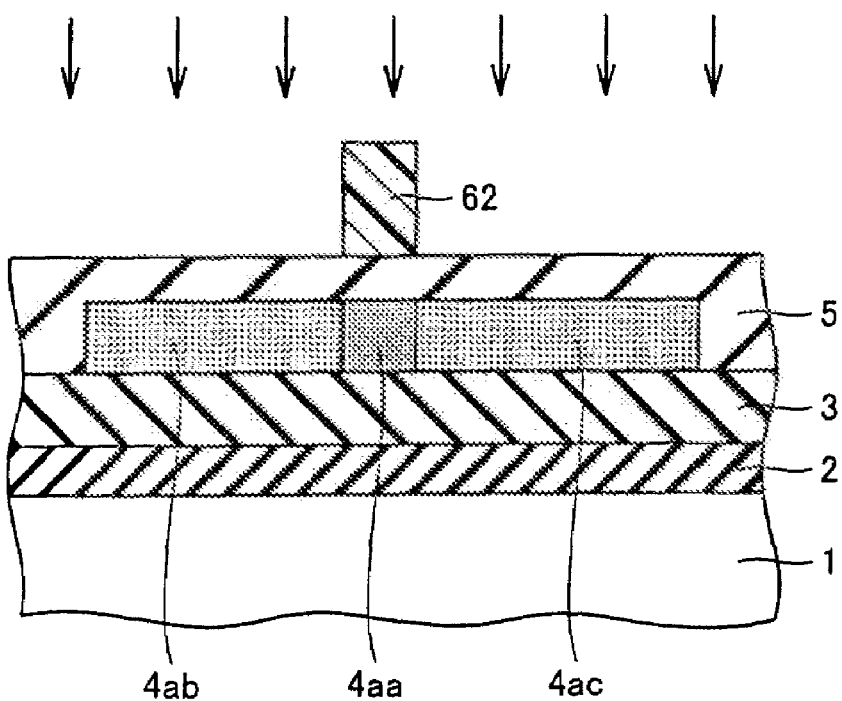
FIG. 6 is a sectional view of a semiconductor device of the first embodiment, representing a step carried out after the step of FIG. 5.

Referring to FIG. 5, predetermined photolithography is applied to form a resist pattern 62. Referring to FIG. 6, phosphorus is implanted into polycrystalline silicon film 4a with a dosage of $1 \times 10^{13}$ atom/cm$^2$ and acceleration energy of 80 KeV, for example, using resist pattern 62 as a mask, to obtain impurity regions 4ab and 4ac. The implanted amount thereof corresponds to the amount of implantation (impurity concentration) of the GOLD region. An impurity region 4aa functioning as a channel is formed between impurity regions 4ab and 4ac. Then, ashing and chemical treatment are applied to remove resist pattern 62.

Figure 7:
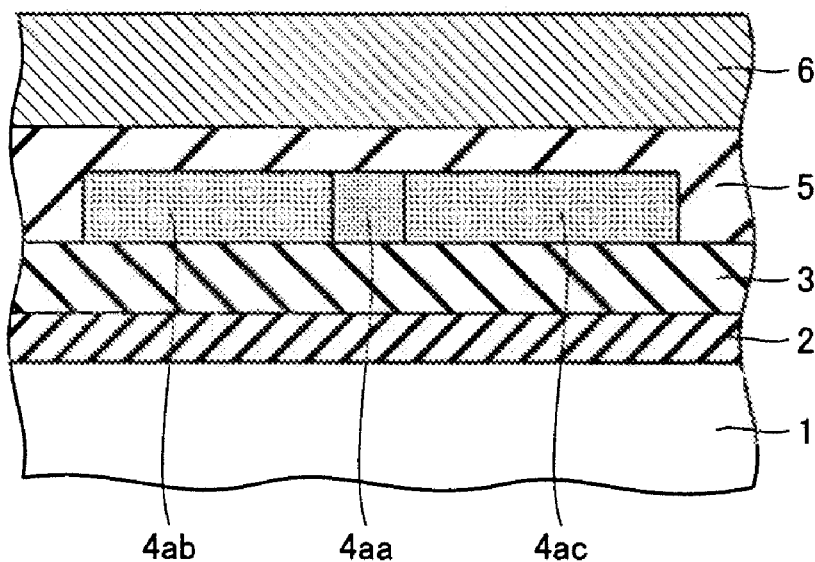
FIG. 7 is a sectional view of a semiconductor device of the first embodiment, representing a step carried out after the step of FIG. 6.
Figure 8:
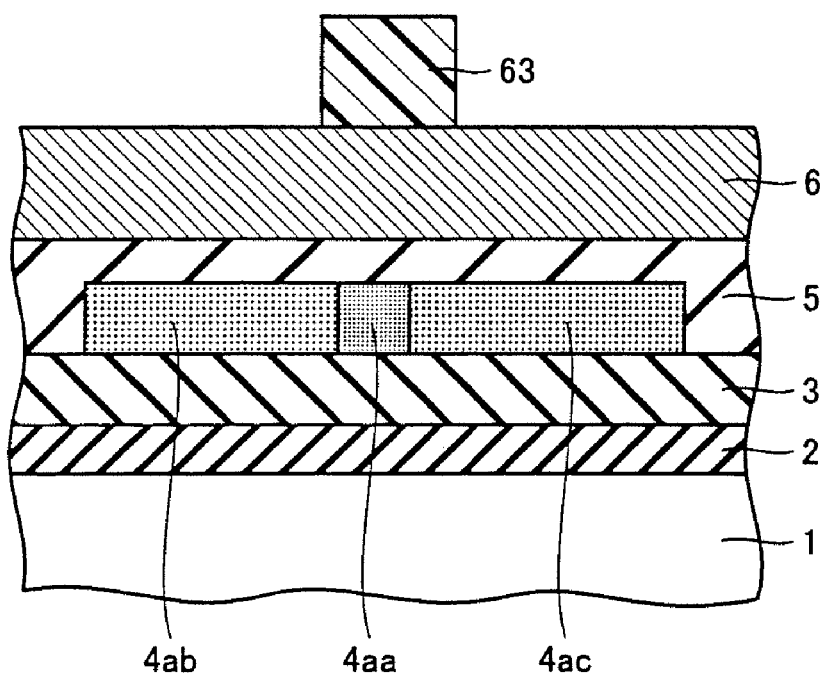
FIG. 8 is a sectional view of a semiconductor device of the first embodiment, representing a step carried out after the step of FIG. 7.
Figure 9:
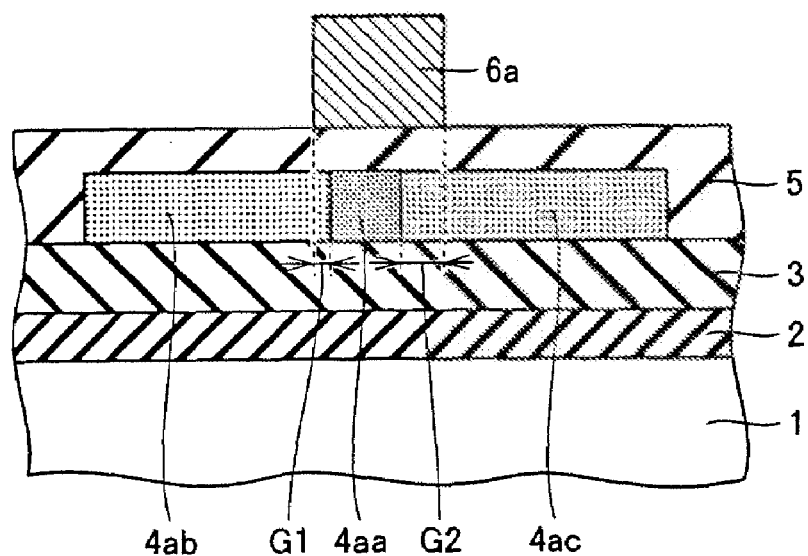
FIG. 9 is a sectional view of a semiconductor device of the first embodiment, representing a step carried out after the step of FIG. 8.

Referring to FIG. 7, a chromium film 6 of approximately 200 nm in film thickness is formed all over gate insulation film 5 by sputtering. Referring to FIG. 8, predetermined photolithography is applied to form a resist pattern 63. Chromium film 6 is subjected to wet etching using resist pattern 63 as a mask, whereby a gate electrode 6a is obtained as shown in FIG. 9.

Gate electrode 6a is formed so as to overlap in plane with impurity regions 4ab and 4ac located with impurity region 4aa therebetween. The overlapping length G1 between gate electrode 6a and impurity region 4ab located at the source side is set to be shorter than overlapping length G2 between gate electrode 6a and impurity region 4ac located at the drain side. For example, length G2 is set to 1.5 μm, and length G1 is set to 0.5 μm. Then, ashing and chemical treatment are applied to remove resist pattern 63.

Figure 10:
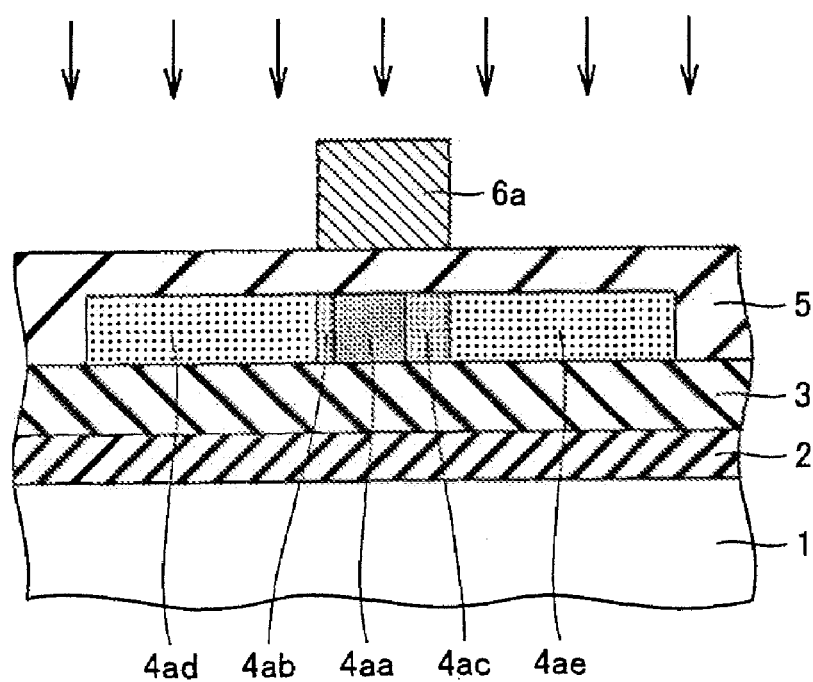
FIG. 10 is a sectional view of a semiconductor device of the first embodiment, representing a step carried out after the step of FIG. 9.

Referring to FIG. 10, phosphorus is applied to impurity regions 4ab and 4ac with a dosage of $1\times10^{14}$ atom/cm$^2$ and acceleration energy of 80 KeV, for example, using gate electrode 6a as a mask, whereby impurity regions 4ad and 4ae identified as the source region and drain region are obtained. The remaining impurity regions 4ab and 4ac left from the formation of impurity regions 4ad and 4ae are respectively identified as GOLD regions overlapping in plane with gate electrode 6a. Both GOLD regions have impurity concentrations lower than those of the source region and drain region.

Figure 11:
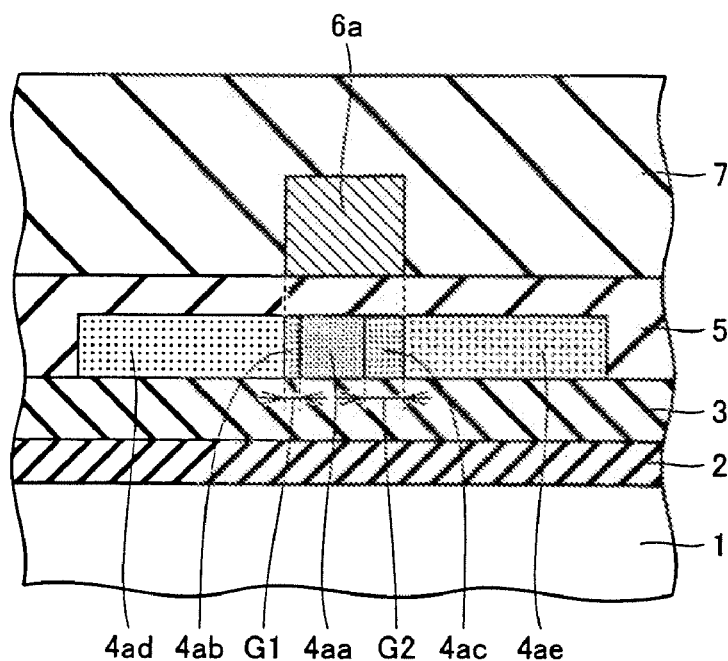
FIG. 11 is a sectional view of a semiconductor device of the first embodiment, representing a step carried out after the step of FIG. 10.
Figure 12:
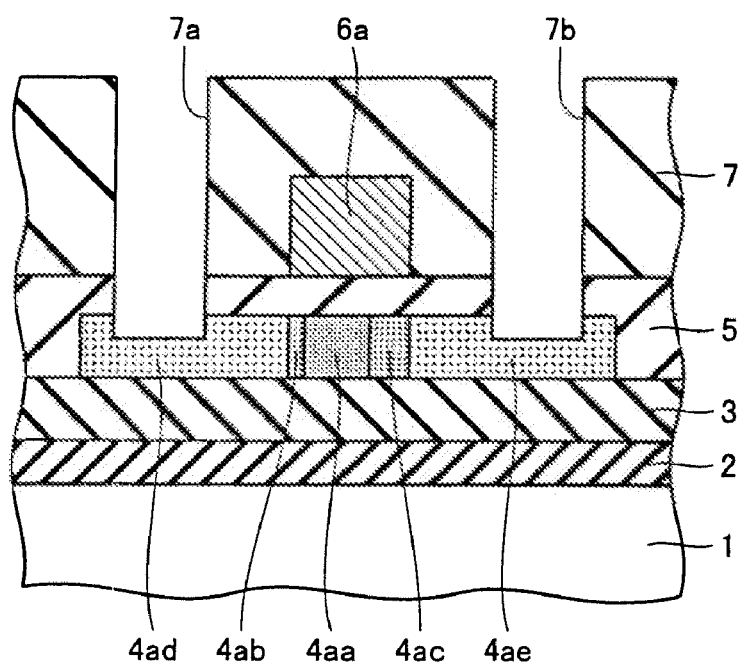
FIG. 12 is a sectional view of a semiconductor device of the first embodiment, representing a step carried out after the step of FIG. 11.

Referring to FIG. 11, an interlayer insulation film 7 formed of a silicon oxide film is deposited to a thickness of approximately 400 nm by plasma CVD, for example, so as to cover gate electrode 6a. Predetermined photolithography is applied on interlayer insulation film 7, whereby a resist pattern (not shown) required to form a contact hole is provided. Interlayer insulation film 7 and gate insulating film 5 are subjected to anisotropic etching using the resist pattern as a mask, whereby a contact hole 7a exposing the surface of impurity region 4ad and a contact hole 7b exposing the surface of impurity region 4ae are formed, as shown in FIG. 12.

A multilayer film of a chromium film and aluminum film (not shown) is formed on interlayer insulation film 7 so as to fill contact holes 7a and 7b. Predetermined photolithography is applied on the multilayer film, whereby a resist pattern (not shown) required to form an electrode is provided. Wet etching is applied using this resist pattern as a mask to obtain a source electrode 8a and a drain electrode 8b, as shown in FIG. 13. In the case where the semiconductor device constitutes a display device, a pixel thin film transistor (not shown) formed at the display unit will have a pixel electrode formed after source and drain electrode formation.

Thus, the major portion of a semiconductor device including a thin film transistor T is formed. In this thin film transistor T, impurity regions 4ad and 4ae are identified as source region 45 and drain region 46, respectively. Impurity regions 4ab and 4ac are identified as GOLD regions 41 and 42, respectively. Impurity region 4aa is identified as channel region 40.

GOLD regions 41 and 42 are formed such that length G2 in the direction of the channel length of GOLD region 42 located at the drain side is longer than length G1 in the direction of the channel length of GOLD region 41 located at the source side, as shown in FIG. 1.

In other words, the overlapping length G1 in the direction of the channel length of GOLD region 41 with respect to gate electrode 6a in plane, starting from the region located right under one side of gate electrode 6a having opposite sides up to channel region 40, is set shorter than overlapping length G2 in the direction of the channel length of GOLD region 42 overlapping in plane with respect to gate electrode 6a, starting from the region located right under the other side of gate electrode 6b up to channel region 40.

Measurements of the source-drain breakdown voltage of thin film transistor T set forth above will be described hereinafter. For the measurement, a thin film transistor of the following parameters was employed: gate width 10 μm; effective gate length 5 μm; overlapping length G2 of GOLD region 42 at drain side 1.5 μm; overlapping length G1 of GOLD region 41 at source side 0.5 μm; width of gate electrode 6a in direction of channel length (horizontal direction in the drawing sheet) 7 μm.

For comparison, measurement was conducted using a thin film transistor of a conventional GOLD structure in which the overlapping length of the GOLD region located at the drain side is equal to the overlapping length of the GOLD region located at the source side. This conventional thin film transistor had the following parameters: overlapping length 1.5 μm; gate length 10 μm; and width of the gate electrode in direction of channel length 8 μm.

The measured results of the source-drain breakdown voltage are shown in FIG. 14. In the measurement, the gate voltage was set to 0V, and the source was connected to ground. The source-drain breakdown voltage is defined as the drain voltage when the drain current is 0.1 μA. As shown in FIG. 14, it is appreciated that the thin film transistor of a GOLD structure of the present embodiment (thin film transistor of the present invention) exhibits a source-drain breakdown voltage of a level identical to that of a thin film transistor of a conventional GOLD structure.

Respective configurations of the thin film transistor of the GOLD structure of the present embodiment and the thin film transistor of a conventional GOLD structure were actually observed to estimate the parasitic capacitance. As a result, it was estimated that the parasitic capacitance caused by GOLD regions 41 and 42 having different overlapping lengths with respect to gate electrode 6a in the thin film transistor of a GOLD structure of the present embodiment is approximately 68% of the parasitic capacitance caused by GOLD regions having the same overlapping lengths with respect to the gate electrode in the thin film transistor of a conventional GOLD structure.

It is identified that the thin film transistor of a GOLD structure of the present embodiment can have the parasitic capacitance caused by the GOLD region reduced while ensuring the same level of source-drain breakdown voltage, as compared to a thin film transistor of a conventional GOLD structure.

The semiconductor device set forth above was described in which GOLD regions 41 and 42 have the same impurity concentration. This is merely exemplary, and GOLD regions 41 and 42 may be formed to have different impurity concentrations within the range of not exceeding the impurity concentrations of source region 45 and drain region 46. Achieving a plurality of impurity concentrations is advantageous in that electric field congregation can be avoided to allow improvement of the source-drain breakdown voltage.

Modifications in association with the overlapping length will be described hereinafter.

First Modification

The thin film transistor of the GOLD structure set forth above was described in which GOLD region 42 located at the drain side has an overlapping length of 1.5 μm. The overlapping length is not limited thereto. The source-drain breakdown voltage can be improved by setting a longer overlapping length. It is therefore desirable to have a longer overlapping length from the standpoint of source-drain breakdown voltage.

FIG. 15 is a graph representing the relationship between the overlapping length of the drain side and source-drain breakdown voltage. In general, a thin film transistor is operated with the source-drain voltage of approximately 10V. In view of this voltage and the source-drain breakdown voltage, the overlapping length is preferably at least 0.5 μm.

It is to be noted that a longer overlapping length will require increase in the width of the gate electrode in the direction of the channel length, leading to a larger thin film transistor. This will increase the occupying area. Therefore, the overlapping length cannot be set too long.

The size of a thin film transistor of a GOLD structure of the present embodiment will be equal to that of a thin film transistor of a conventional GOLD structure when the overlapping length is approximately 2.5 μm. Therefore, it is not desirable to set the overlapping length longer than 2.5 μm from the standpoint of size (occupying area). Accordingly, the upper limit of the overlapping length is 2.5 μm.

Second Modification

The overlapping length will vary in-plane of the substrate or between substrates due to the variation in the exposure process (photolithographic process). This variation in the overlapping length depends on the alignment accuracy in forming resist pattern 63 (refer to FIG. 8) required to form a pattern of a gate electrode.

It is therefore necessary to take into account the alignment accuracy in the exposure process in setting the overlapping length. In order to ensure a target overlapping length, the overlapping length must be set larger than the sum of the target value and the alignment accuracy. In a modern exposure apparatus (stepper), the alignment accuracy is 0.3 μm (3 σ). In order to ensure an overlapping length of a target value of 0.5 μm at the drain side, the value of the overlapping length at the drain side must be set to at least 0.8 μm.

If the overlapping length is set without taking the alignment accuracy into account, there may be a case where the source-drain breakdown voltage is lower than 10V in the range of variation of the alignment accuracy with respect to a target overlapping length of 0.5 μm at the drain side, according to the graph of FIG. 15. In this case, there is a problem that the source-drain breakdown voltage cannot be ensured.

The alignment accuracy is taken into account sufficiently in patterns where the superimposition accuracy is particularly critical. With regards to alignment accuracy, superimposition with the underlying pattern in forming a contact hole or a pad opening generally requires the highest accuracy. Therefore, deviation in the position of a contact hole or the like with respect to the underlying pattern (difference from the design value) is taken as the value corresponding to the alignment accuracy.

Third Modification

The thin film transistor of a GOLD structure set forth above was described in which the overlapping length of GOLD region 41 at the source side is 0.5 μm. This overlapping length is not limited thereto. The parasitic capacitance can be reduced by setting a shorter overlapping length. Therefore, it is desirable to set a shorter overlapping length from the standpoint of parasitic capacitance.

As described in the second modification, the overlapping length will vary in-plane of the substrate or between substrates due to the variation in the exposure process (photolithographic process). The variation in overlapping length depends on the alignment accuracy in forming a resist pattern required to provide a pattern of a gate electrode.

In order to ensure the overlapping length at the source side, the overlapping length must be set larger than the alignment accuracy. Since the alignment accuracy is 0.3 μm (3 σ) in modern exposure apparatuses, the overlapping length of the source side must be set larger than 0.3 μm.

If the overlapping length is set without taking the alignment accuracy into account, the overlapping length at the source side cannot be ensured within the range of variation of the overlapping length, disallowing formation of a GOLD region.

In a thin film transistor of a GOLD structure, the channel length is equal to the length (distance) between the GOLD region located at the source side and the GOLD region located at the drain side. If the overlapping length at the source side cannot be ensured, the channel length will be determined by the distance between the source region and the GOLD region located at the drain side. Accordingly, the channel length will become shorter than the predetermined channel length to reduce the breakdown voltage between the source and drain, and/or exhibit great variation in the characteristics such as the threshold voltage and mutual conductance.

Since the highest alignment accuracy is required for the superimposition with the underlying pattern in forming a contact hole or a pad opening, as mentioned in the foregoing, deviation in the position of a contact hole or the like with respect to the underlying pattern (difference from the design value) becomes the value corresponding to the alignment accuracy.

Fourth Modification

The thin film transistor of a GOLD structure set forth above was described in which the overlapping length of GOLD region 41 at the source side is 0.5 μm. The overlapping length is not limited to this length. Gate electrode 6a and source region 45 exhibit capacitive coupling by the parasitic capacitance therebetween. Similarly, gate electrode 6a and drain region 46 exhibit capacitive coupling by the parasitic capacitance therebetween.

Such parasitic capacitance will be charged when a positive voltage is applied to gate electrode 6a and the thin film transistor is turned ON. When the thin film transistor is turned OFF, the charge accumulated at the parasitic capacitance will be altered due to the change of the voltage of gate electrode 6a to the negative side.

In the case where load capacitance is coupled to source region 45 or drain region 46, the voltage acting on the load capacitance will be altered due to the change in the charge accumulated by the parasitic capacitance. Such change in voltage will cause degradation in the display properties such as the contrast in a display device.

Figure 16:
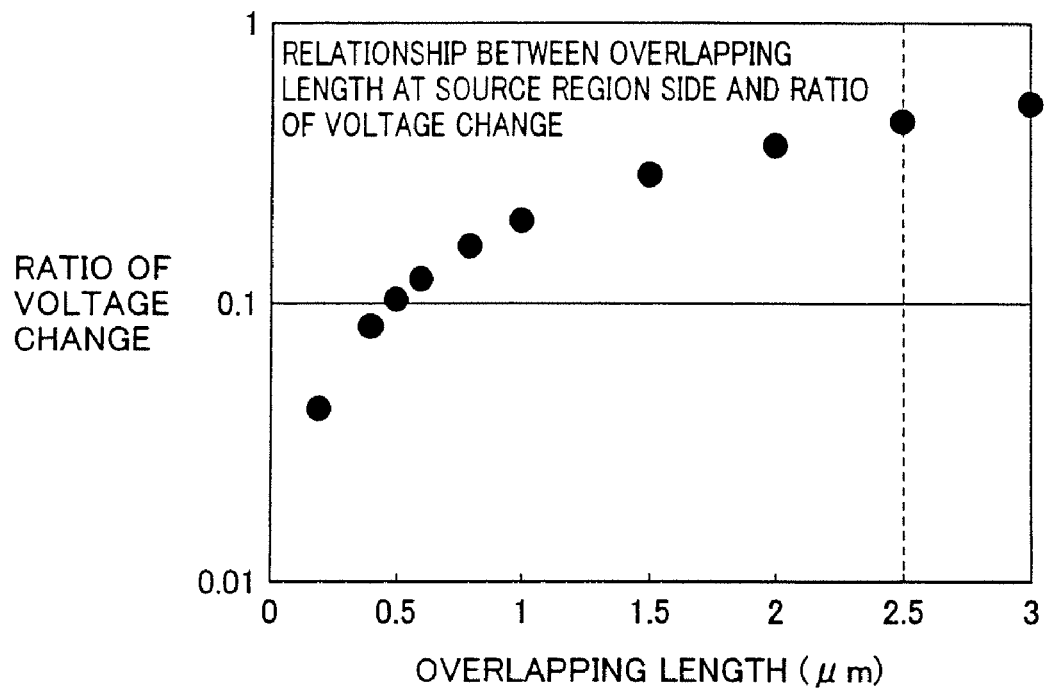
FIG. 16 is a graph representing the relationship between the overlapping length at the source side and the ratio of the voltage change to the voltage at the time of charging in a fourth modification of the first embodiment.

The relationship between the overlapping length at the source side and the ratio of the voltage change to the voltage in a charging mode when load capacitance is coupled to the source side is shown in FIG. 16. It is assumed that the load capacitance is 3 pF. It is appreciated from FIG. 16 that the ratio of the change in voltage increases as the overlapping length of the source side becomes longer. Particularly, the ratio of the change in voltage is relatively small in the range where the overlapping length does not exceed 1.0 μm. It is therefore appreciated that the overlapping length at the source side is effective to be set to not more than 1.0 μm from the standpoint of minimizing the change in voltage acting on the load capacitance.

Fifth Modification

The thin film transistor of a GOLD structure set forth above was described in which GOLD region 52 of the drain side has an overlapping length of 1.5 μm and GOLD region 41 at the source side has an overlapping length of 0.5 μm. In this case, the difference between the overlapping length of GOLD region 42 at the drain side and the overlapping length of GOLD region 41 at the source side is 1.0 μm. The difference in the overlapping length is not limited thereto.

As mentioned previously, variation in the overlapping length is determined by the alignment accuracy in forming a resist pattern required to produce a pattern of gate electrode, and the alignment accuracy thereof is 0.3 μm (3 σ). Therefore, in order to set the overlapping length of the source side shorter than the overlapping length of the drain side, the difference between the overlapping length of the source side and the overlapping length of the drain side must be set to at least 0.6 μm.

The description related to the overlapping length in each of the modification set forth above is also applicable to respective embodiments set forth below.

Second Embodiment

The method of fabricating a semiconductor device set forth above is based on an n channel thin film transistor as the thin film transistor. It is to be noted that a p type thin film transistor is also formed at the same time on the glass substrate. The main steps in the method of fabricating a p type thin film transistor will be described hereinafter.

Figure 17:
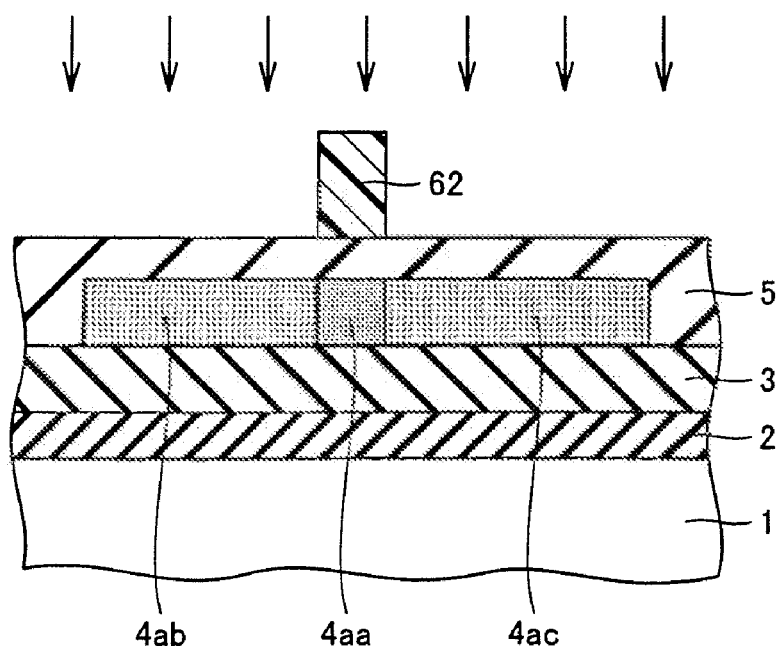
FIG. 17 is a sectional view of a semiconductor device according to a second embodiment of the present invention, representing a step in a fabrication method thereof.

Following the above-described step shown in FIG. 4, predetermined photolithography is applied to form a resist pattern 62, as shown in FIG. 17. Using resist pattern 62 as a mask, boron is implanted into the polycrystalline silicon with a dosage of $5 \times 10^{13}$ atom/cm$^2$ and acceleration energy of 60 KeV, for example, to obtain impurity regions 4ab and 4ac. The implanted amount thereof corresponds to the amount of implantation of the GOLD region. Impurity region 4aa functioning as a channel is formed between impurity regions 4ab and 4ac. Then, ashing and agent processing are applied to remove resist pattern 62.

Figure 18:
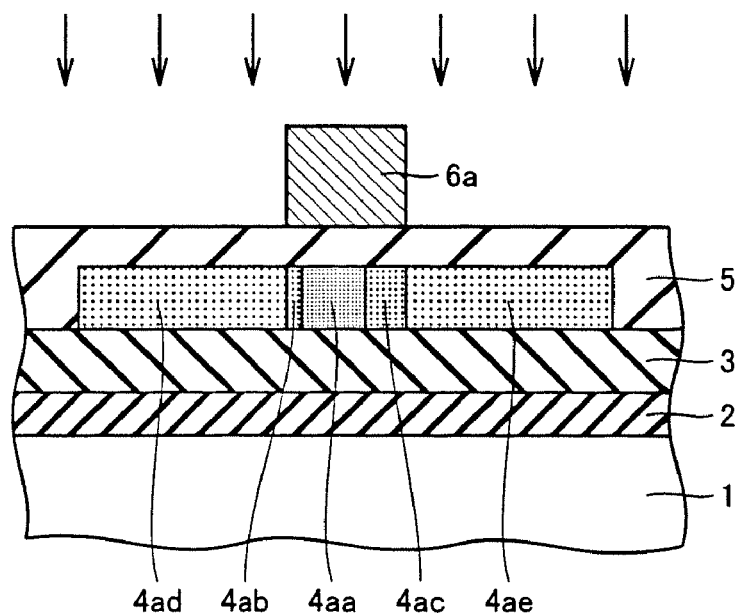
FIG. 18 is a sectional view of the semiconductor device of the second embodiment, representing a step carried out after the step of FIG. 17.

Then, a process similar to that corresponding to the steps shown in FIGS. 7-9 is carried out to obtain gate electrode 6a, as shown in FIG. 18. Using gate electrode 6a as a mask, boron is implanted into impurity regions 4ab and 4ac with a dosage of $1 \times 10^{15}$ atom/cm$^2$ and acceleration energy of 60 KeV, for example, to obtain impurity regions 4ad and 4ae identified as the source and drain regions, respectively.

Thus, the remaining impurity regions 4ab and 4ac left from the formation of impurity regions 4ad and 4ae are identified as respective GOLD regions overlapping in plane with gate electrode 6a, having an impurity concentration lower than that of the source region and drain region.

Figure 19:
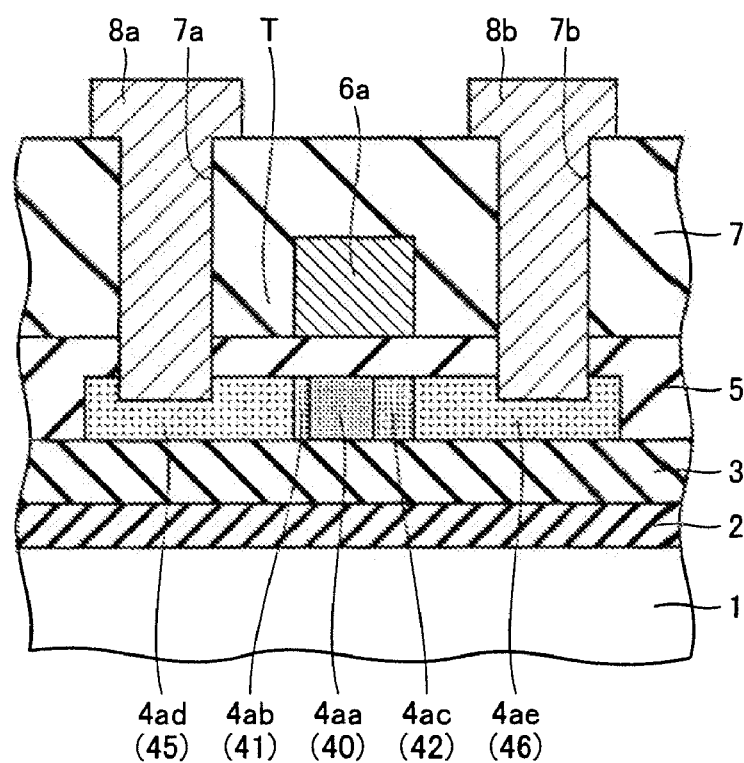
FIG. 19 is a sectional view of a semiconductor device according to the second embodiment, representing a step carried out after the step of FIG. 18.

Then, a process similar to that corresponding to the steps shown in FIGS. 11-13 is carried out to produce a thin film transistor of a GOLD structure having a p channel, as shown in FIG. 19.

Results of measurement of source-drain breakdown voltage for the thin film transistor set forth above will be described hereinafter. For the measurement, a thin film transistor was employed having the following parameters: gate width 20 µm; effective gate length 5 µm; overlapping length G2 of GOLD region 42 at drain side 1.5 µm, overlapping length G1 of GOLD region 41 at source side 0.5 µm; and width of gate electrode 6a in the direction of the channel length 7 µm.

For comparison, measurement was conducted using a thin film transistor of a conventional GOLD structure in which the overlapping length of the GOLD region located at the drain side is equal to the overlapping length of the GOLD region located at the source side. This conventional thin film transistor had an overlapping length of 1.5 µm and a gate width of 20 µm.

Figures 20, 21:
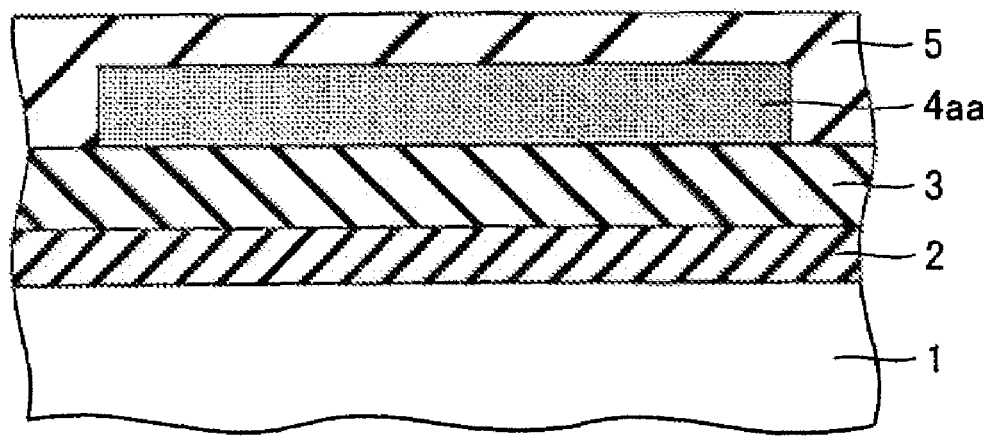
FIG. 20 represents the results of source-drain breakdown voltage of thin film transistors in the second embodiment.
FIG. 21 is a sectional view of a semiconductor device according to a third embodiment of the present invention, representing a step of a fabrication method thereof.

The measured results of the source-drain breakdown voltage are shown in FIG. 20. The measurement conditions are as set forth in the foregoing. As shown in FIG. 20, it is appreciated that the thin film transistor of a GOLD structure of the present embodiment (thin film transistor of the present invention) exhibits a source-drain breakdown voltage of a level identical to that of a thin film transistor of a conventional GOLD structure.

Respective configurations of the thin film transistor of the GOLD structure of the present embodiment and the thin film transistor of a conventional GOLD structure were actually observed to estimate the parasitic capacitance. As a result, it was estimated that the parasitic capacitance caused by GOLD regions 41 and 42 having different overlapping lengths with respect to gate electrode 6a in the thin film transistor of a GOLD structure of the present embodiment is approximately 68% of the parasitic capacitance caused by GOLD regions having the same overlapping lengths with respect to the gate electrode in the thin film transistor of a conventional GOLD structure.

It is identified that the thin film transistor of a GOLD structure of the present embodiment can have the parasitic capacitance caused by the GOLD region reduced significantly while ensuring the same level of source-drain breakdown voltage, as compared to a thin film transistor of a conventional GOLD structure.

Third Embodiment

The third embodiment is directed to a semiconductor device having a GOLD region only at the drain side, and absent of a GOLD region at the source side. A fabrication method of such a semiconductor device will be first described. The process up to the step of forming gate insulation film 5 as shown in FIG. 21 and implanting predetermined impurities to control the threshold value of the thin film transistor is similar to the process up to the step of FIG. 4 set forth before.

Figure 22:
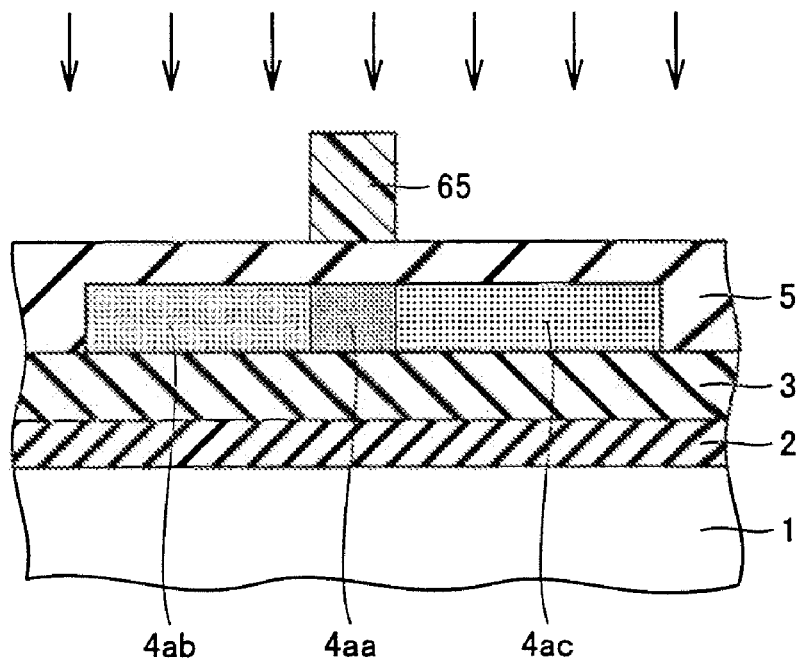
FIG. 22 is a sectional view of a semiconductor device of the third embodiment, representing a step carried out after the step of FIG. 21.

Referring to FIG. 22, predetermined photolithography is applied to form a resist pattern 65. Using resist pattern 65 as a mask, phosphorus is implanted into polycrystalline silicon film 4a with a dosage of $1 \times 10^{13}$ atom/cm$^2$ and acceleration energy of 80 KeV, for example, to obtain impurity regions 4ab and 4ac. The implanted amount thereof corresponds to the amount of implantation of the GOLD region. Impurity region 4aa functioning as a channel is formed between impurity regions 4ab and 4ac. Ashing and chemical treatment are applied to remove resist pattern 65.

Figure 23:
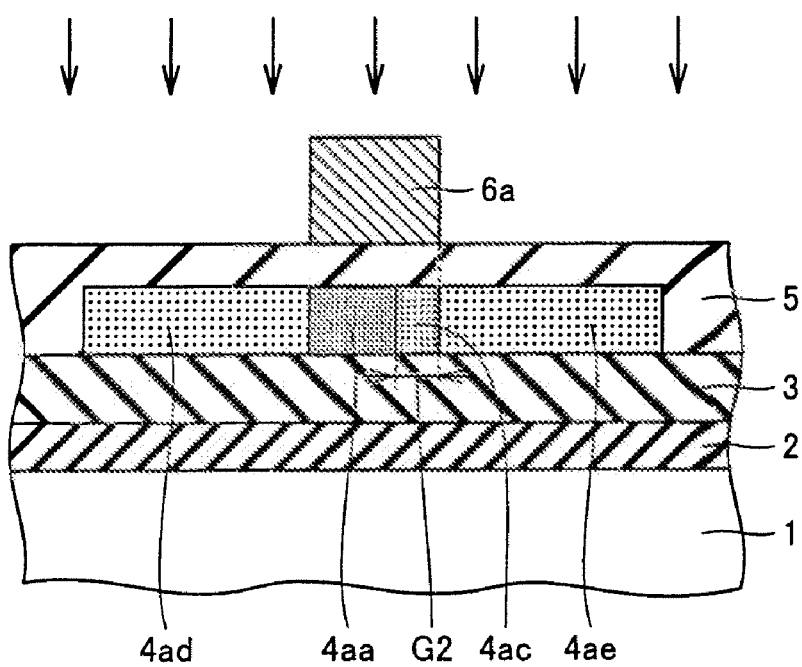
FIG. 23 is a sectional view of a semiconductor device of the second embodiment, representing a step carried out after the step of FIG. 22.

Then, a process similar to the process corresponding to the steps shown in FIGS. 7-9 set forth before is carried out to obtain gate electrode 6a on gate insulation film 5, as shown in FIG. 23. In this case, gate electrode 6a is formed so as to overlap in plane with only impurity region 4ac among impurity regions 4ab and 4ac that sandwich impurity region 4aa, and not overlap with impurity region 4ab. The overlapping length G2 between gate electrode 6a and impurity region 4ac located at the drain side is set to 1.5 µm.

Using gate electrode 6a as a mask, phosphorus is implanted into impurity regions 4ab and 4ac with a dosage of $1 \times 10^{14}$ atom/cm$^2$ and acceleration energy of 80 KeV, for example, to obtain impurity regions 4ad and 4ae identified as a source region and a drain region. Impurity region 4ac remaining from the formation of impurity regions 4ad and 4ae is identified as the GOLD region overlapping in plane with gate electrode 6a, having an impurity concentration lower than that of the source region and drain region.

Figures 24, 25:
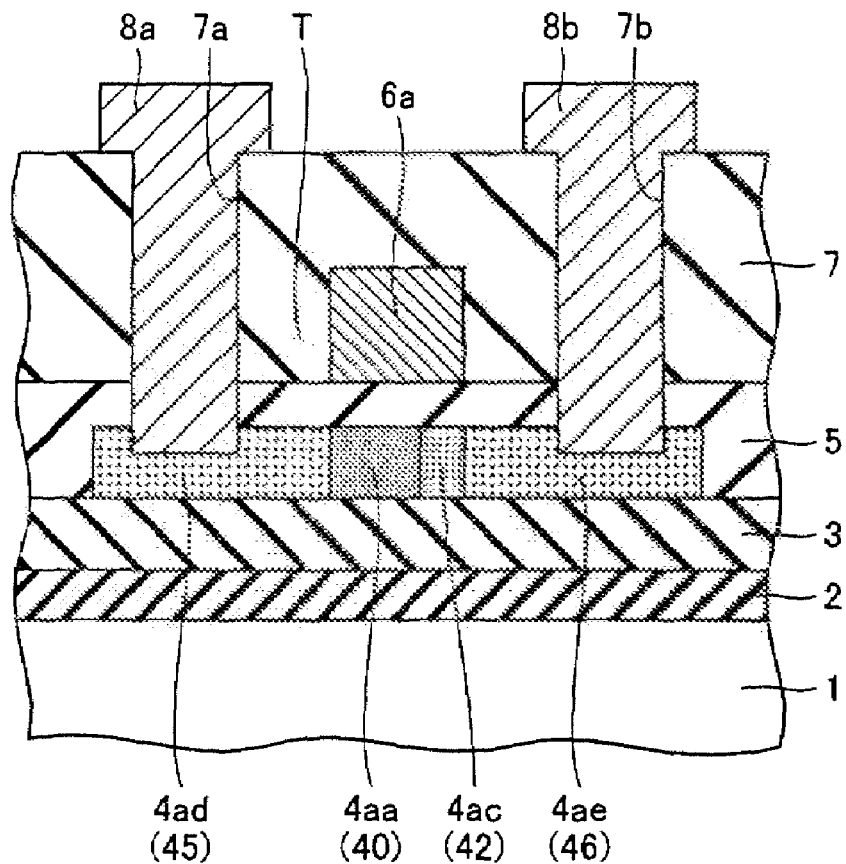
FIG. 24 is a sectional view of a semiconductor device of the second embodiment, representing a step carried out after the step of FIG. 23.
FIG. 25 represents the results of source-drain breakdown voltage of thin film transistors in the third embodiment.

A process similar to the process corresponding to the steps shown in FIGS. 11-13 set forth above is then carried out to form a thin film transistor of a GOLD structure, as shown in FIG. 24. This thin film transistor of a GOLD structure formed as described above includes a GOLD region 42 overlapping in plane with gate electrode 6a only at the drain side, and is absent of a GOLD region overlapping in plane with gate electrode 6a at the source side.

Results of measurement of source-drain breakdown voltage for the thin film transistor set forth above will be described hereinafter. For the measurement, a thin film transistor was employed having the following parameters: gate width 10 µm; effective gate length 5 µm, overlapping length G2 of GOLD region 42 at drain side 1.5 µm, and width of gate electrode 6a in the direction of the channel length 6.5 µm.

For comparison, measurement was conducted using a thin film transistor of a conventional GOLD structure in which the overlapping length of the GOLD region located at the drain side is equal to the overlapping length of the GOLD region located at the source side.

The measured results of the source-drain breakdown voltage are shown in FIG. 25. The measurement conditions are as set forth in the foregoing. As shown in FIG. 25, it is appreciated that the thin film transistor of a GOLD structure of the present embodiment exhibits a source-drain breakdown voltage of a level identical to that of a thin film transistor of a conventional GOLD structure.

Respective configurations of the thin film transistor of the GOLD structure of the present embodiment and the thin film transistor of a conventional GOLD structure were actually observed to estimate the parasitic capacitance. As a result, it was estimated that the parasitic capacitance caused only by GOLD region 42 located at the drain side, overlapping with gate electrode 6a, in the thin film transistor of a GOLD structure of the present embodiment is approximately 50% of the parasitic capacitance in the thin film transistor of a conventional GOLD structure. Thus, the parasitic capacitance is further reduced.

It is confirmed that the thin film transistor of a GOLD structure of the present embodiment can have the parasitic capacitance further reduced while ensuring the same level of source-drain breakdown voltage, as compared to a thin film transistor of a conventional GOLD structure.

Fourth Embodiment

The previous third embodiment was described in which an n channel thin film transistor is taken as an example of a thin film transistor. It is to be noted that a p type thin film transistor is also formed at the same time on a glass substrate. The main steps in the method of fabricating a p type thin film transistor will be described hereinafter.

Figure 26:
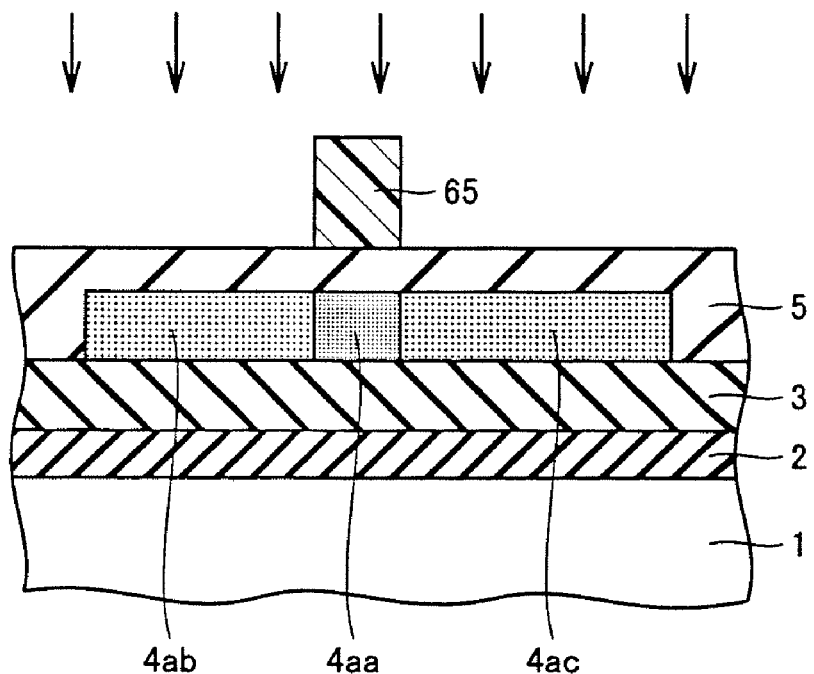
FIG. 26 is a sectional view of a semiconductor device according to a fourth embodiment of the present invention, representing a step of a fabrication method thereof.

Following the above-described step shown in FIG. 4, predetermined photolithography is applied to form a resist pattern 65, as shown in FIG. 26. Using resist pattern 65 as a mask, boron is implanted into the polycrystalline silicon with a dosage of $5 \times 10^{13}$ atom/cm$^2$ and acceleration energy of 60 KeV, for example, to obtain impurity regions 4ab and 4ac. The implanted amount thereof corresponds to the amount of implantation of the GOLD region. Impurity region 4aa functioning as a channel is formed between impurity regions 4ab and 4ac. Then, ashing and chemical treatment are applied to remove resist pattern 65.

Figure 27:
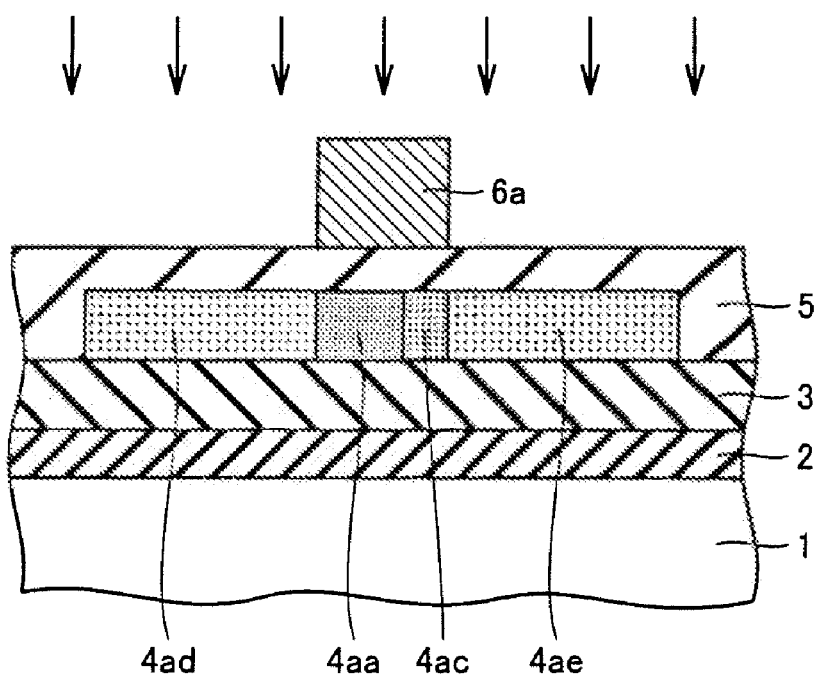
FIG. 27 is a sectional view of the semiconductor device of the fourth embodiment, representing a step carried out after the step of FIG. 26.

Then, a process similar to that corresponding to the steps shown in FIGS. 7-9 is carried out to obtain gate electrode 6a, as shown in FIG. 27. Using gate electrode 6a as a mask, boron is implanted into impurity regions 4ab and 4ac with a dosage of $1 \times 10^{15}$ atom/cm$^2$ and acceleration energy of 60 KeV, for example, to obtain impurity regions 4ad and 4ae identified as the source and drain regions, respectively.

Thus, the impurity region 4ac at the drain side remaining from the formation of impurity regions 4ad and 4ae is identified as the GOLD region overlapping in plane with gate electrode 6a, having an impurity concentration lower than that of the source region and drain region.

Figures 28, 29:
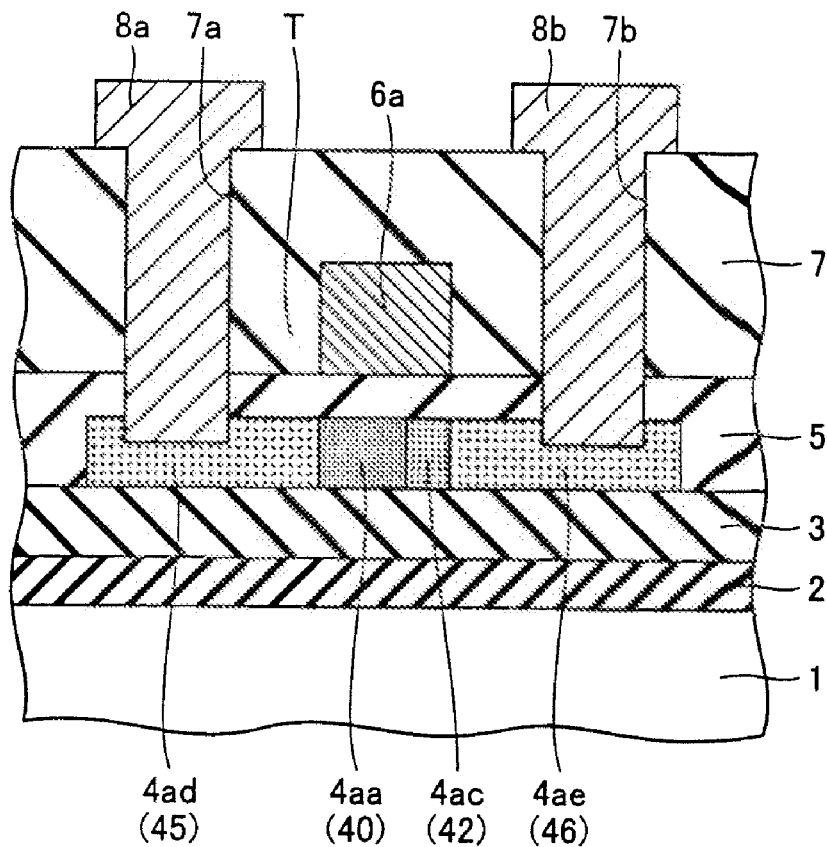
FIG. 28 is a sectional view of the semiconductor device of the fourth embodiment, representing a step carried out after the step of FIG. 27.
FIG. 29 represents the results of source-drain breakdown voltage of thin film transistors in the fourth embodiment.

Then, a process similar to that corresponding to the steps shown in FIGS. 11-13 is carried out to produce a thin film transistor of a GOLD structure having a p channel, as shown in FIG. 28.

Results of measurement of source-drain breakdown voltage for the thin film transistor set forth above will be described hereinafter. For the measurement, a thin film transistor was employed having the following parameters: gate width 20 μm; effective gate length 5 μm; overlapping length G2 of GOLD region 42 at drain side 1.5 μm; and width of gate electrode 6a in the direction of the channel length 6.5 μm.

For comparison, measurement was conducted using a thin film transistor of a conventional GOLD structure in which the overlapping length of the GOLD region located at the drain side is equal to the overlapping length of the GOLD region located at the source side.

The measured results of the source-drain breakdown voltage are shown in FIG. 29. The measurement conditions are as set forth in the foregoing. As shown in FIG. 29, it is appreciated that the source-drain breakdown voltage of the thin film transistor of a GOLD structure of the present embodiment is substantially equal to that of the thin film transistor of a GOLD structure of the second embodiment, and achieves a level identical to that of a thin film transistor of a conventional GOLD structure.

Respective configurations of the thin film transistor of the GOLD structure of the present fourth embodiment and the thin film transistor of a conventional GOLD structure were actually observed to estimate the parasitic capacitance. As a result, it was estimated that the parasitic capacitance caused only by GOLD region 42 located at the drain side, overlapping with gate electrode 6a, in the thin film transistor of a GOLD structure of the present embodiment is approximately 50% of the parasitic capacitance in the thin film transistor of a conventional GOLD structure. The parasitic capacitance is further reduced.

It is confirmed that the thin film transistor of a GOLD structure of the present embodiment can have the parasitic capacitance further reduced while ensuring the same level of source-drain breakdown voltage, as compared to a thin film transistor of a conventional GOLD structure.

Fifth Embodiment

Figure 30:
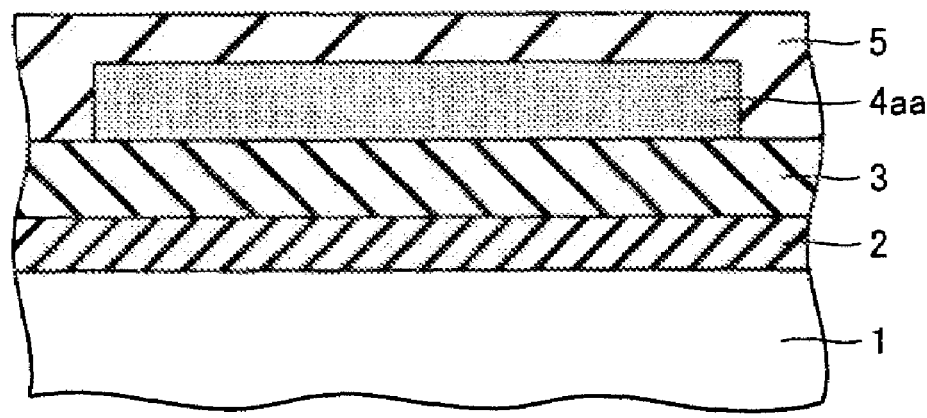
FIG. 30 is a sectional view of a semiconductor device according to a fifth embodiment of the present invention, representing a step of a fabrication method thereof.

The fifth embodiment is directed to a thin film transistor having both a GOLD region and an LDD region. A method of fabricating such a thin film transistor will be described hereinafter. The process of forming gate insulation film 5 shown in FIG. 30 up to the step of implanting predetermined impurities to control the threshold value of the thin film transistor is similar to the process up to the steps shown in FIG. 4.

Figure 31:
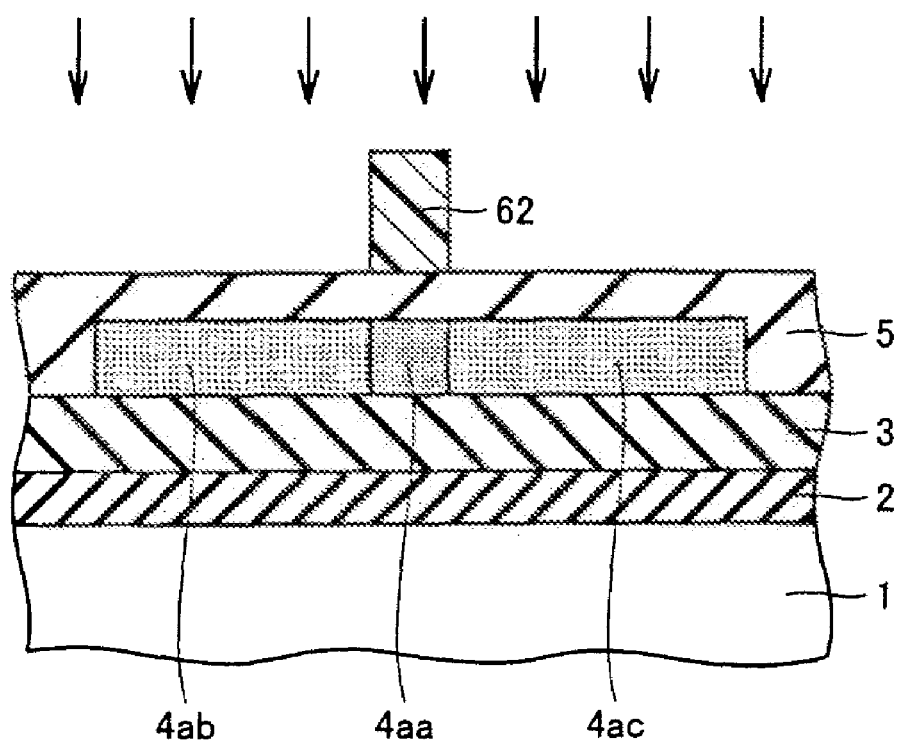
FIG. 31 is a sectional view of the semiconductor device of the fifth embodiment, representing a step carried out after the step of FIG. 30.

Then, referring to FIG. 31, predetermined photolithography is applied to form a resist pattern 62. Using this resist pattern 62 as a mask, phosphorus is implanted into the polycrystalline silicon film with a dosage of $1 \times 10^{13}$ atom/cm$^2$ and acceleration energy of 80 KeV, for example, to obtain impurity regions 4ab and 4ac. The implanted amount thereof corresponds to the amount of implantation of the GOLD region. Impurity region 4aa functioning as the channel is provided between impurity regions 4ab and 4ac. Then, ashing and chemical treatment are applied to remove resist pattern 62.

Figure 32:
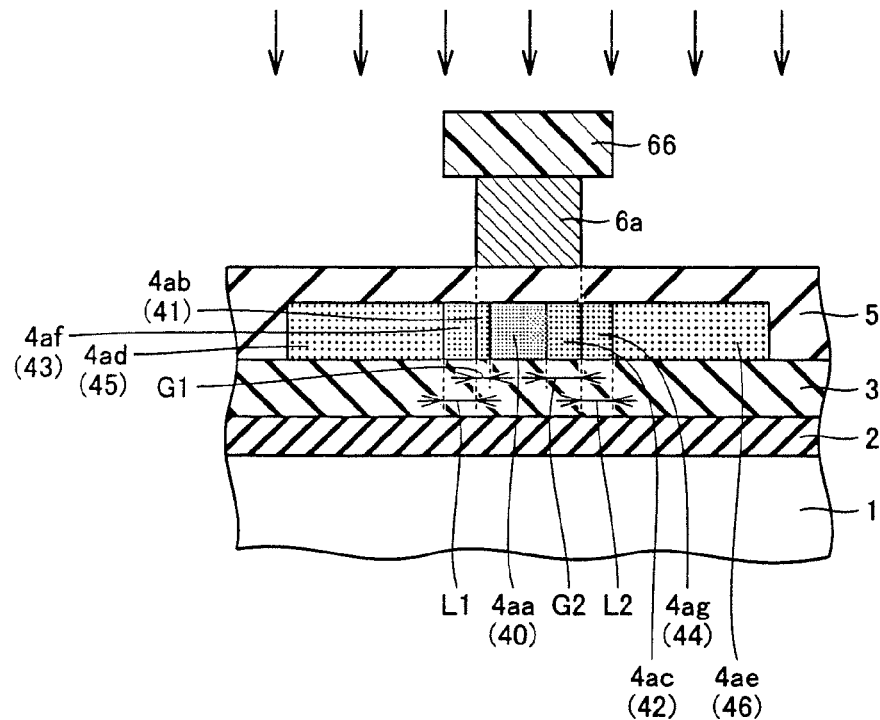
FIG. 32 is a sectional view of the semiconductor device of the fifth embodiment, representing a step carried out after the step of FIG. 31.

Then, a process similar to the process corresponding to the steps shown in FIGS. 7-9 set forth above is carried out to form gate electrode 6a on gate insulation film 5, as shown in FIG. 32. In this case, resist pattern 66 required to form gate electrode 6a is provided so as to overlap in plane with impurity regions 4ab and 4ac located sandwiching impurity region 4aa functioning as the channel, and such that the overlapping length in plane with impurity region 4ac is longer than the overlapping length with impurity region 4ab in plane.

Application of wet etching allows the side face of the chromium film that becomes the gate electrode to be etched. The etched amount can be controlled by the period of time of overetching.

Using remaining resist pattern 66 as a mask, phosphorus is implanted into impurity regions 4ab and 4ac with a dosage of $1\times10^{14}$ atom/cm$^2$ and an acceleration energy of 80 KeV, for example, to obtain impurity regions 4*ad* and 4*ae* identified as a source region and a drain region. Then, ashing and chemical treatment are applied to remove resist pattern 66.

Thus, impurity region 4*ab* remaining from the formation of impurity regions 4*ad* and 4*ae* includes a portion of an impurity region overlapping in plane with gate electrode 6*a* (portion A) and a portion of an impurity region not overlapping with gate electrode 6*a* (portion B).

Taking portion A as impurity region 4*ab* and portion B as impurity region 4*af*, impurity region 4*ab* is identified as GOLD region 41 whereas impurity region 4*af* is identified as LDD region 43. In a likewise manner for remaining impurity region 4*ac*, impurity region 4*ac* is identified as GOLD region 42 and impurity region 4*ag* is identified as an LDD region 44. Length G2 in the direction of the channel length of GOLD region 42 located at the drain side is set longer than length G1 in the direction of the channel length of GOLD region 41 located at the source side.

Figure 33:
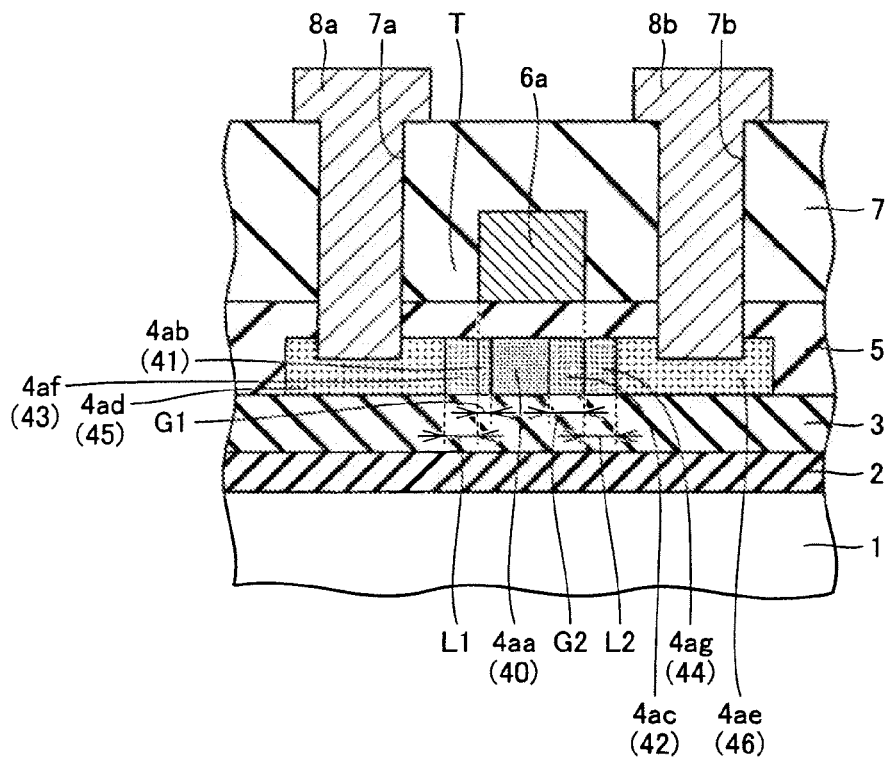
FIG. 33 is a sectional view of the semiconductor device of the fifth embodiment, representing a step carried out after the step of FIG. 32.

Then, a process similar to the process corresponding to the steps shown in FIGS. 11-13 set forth before is carried out to produce a thin film transistor of a GOLD structure having an LDD structure, as shown in FIG. 33.

In such a thin film transistor of a GOLD structure formed as set forth above, length G2 in the direction of the channel length of GOLD region 42 located at the drain side is set longer than length G1 of the direction of the channel length of GOLD region 41 located at the source side. Furthermore, LDD region 43 is formed between GOLD region 41 and source region 45. LDD region 44 is formed between GOLD region 42 and drain region 46.

Results of measurement of source-drain breakdown voltage for the thin film transistor set forth above will be described hereinafter. For the measurement, a thin film transistor was employed having the following parameters: gate width 10 μm; effective gate length 5 μm; overlapping length G2 of GOLD region 42 at drain side 1.5 μm, length L2 in the direction of channel length of LDD region 44 at drain side 0.3 μm; overlapping length G1 of GOLD region 41 at source side 0.5 μm; length L1 in the direction of channel length of LDD region 43 at source side 0.3 μm; and width of gate electrode 6*a* in the direction of channel length 7 μm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the first embodiment.

Figures 34, 35:
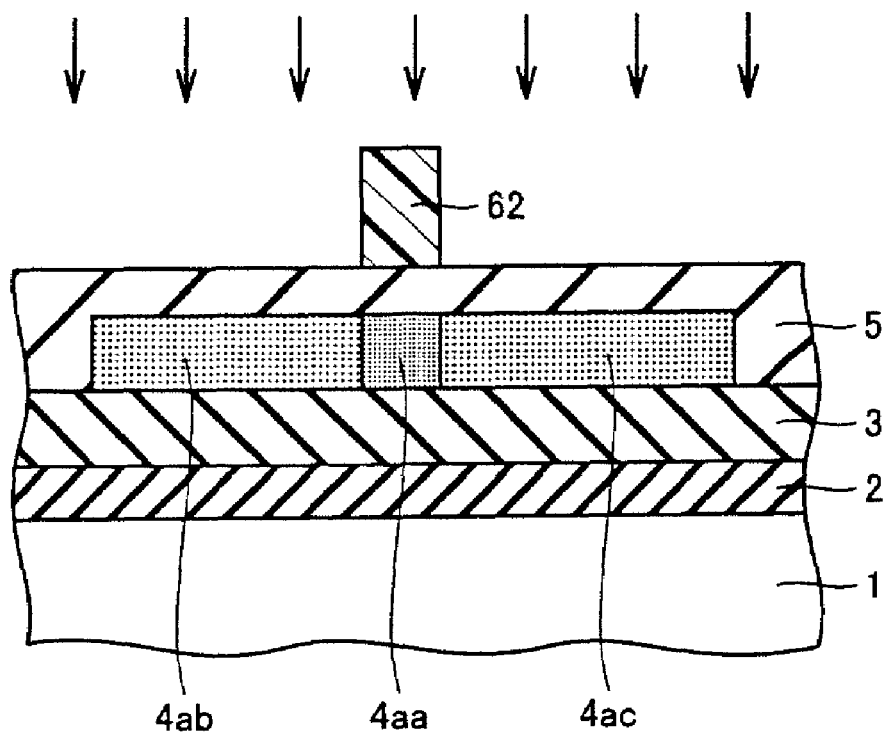
FIG. 34 represents the results of source-drain breakdown voltage of thin film transistors in the fifth embodiment.
FIG. 35 is a sectional view of a semiconductor device according to a sixth embodiment of the present invention, representing a step of a fabrication method thereof.

The measured results of the source-drain breakdown voltage are shown in FIG. 34. The measurement conditions are as set forth in the foregoing. As shown in FIG. 34, it is appreciated that the thin film transistor of a GOLD structure of the present embodiment exhibits a source-drain breakdown voltage of a level higher than that of a thin film transistor of a conventional GOLD structure and the thin film transistor described in the first embodiment. It was confirmed that the breakdown voltage can be improved.

Then, respective configurations of the thin film transistor of GOLD structure of the present embodiment, the thin film transistor of a conventional GOLD structure, and the thin film transistor of the first embodiment were actually observed to estimate the parasitic capacitance. As a result, it was estimated that the parasitic capacitance caused by GOLD regions 41 and 42 having different overlapping length with respect to gate electrode 6*a* in the thin film transistor of a GOLD structure of the present embodiment is lower than the parasitic capacitance of a thin film transistor of a conventional GOLD structure in which the overlapping length with the gate electrode is identical, and is of the same level as the parasitic capacitance of the thin film transistor of the first embodiment.

It was confirmed that the thin film transistor of a GOLD structure of the present embodiment has the parasitic capacitance reduced significantly while a higher breakdown voltage than the breakdown voltage of the thin film transistor of a conventional GOLD structure can be ensured.

Sixth Embodiment

The previous fifth embodiment was described in which an n channel thin film transistor is taken as an example of a thin film transistor. It is to be noted that a p type thin film transistor is also formed at the same time on a glass substrate. The main steps in the method of fabricating a p type thin film transistor will be described hereinafter.

Following the above-described step shown in FIG. 4, predetermined photolithography is applied to form a resist pattern 62, as shown in FIG. 35. Using this pattern 62 as a mask, boron is implanted into the polycrystalline silicon film with a dosage of $5\times10^{13}$ atom/cm$^2$ and acceleration energy of 60 KeV, for example, to obtain impurity regions 4*ab* and 4*ac*. The implanted amount thereof corresponds to the amount of implantation of the GOLD region. Impurity region 4*aa* functioning as the channel is provided between impurity regions 4*ab* and 4*ac*. Then, ashing and chemical treatment are applied to remove resist pattern 62.

Figure 36:
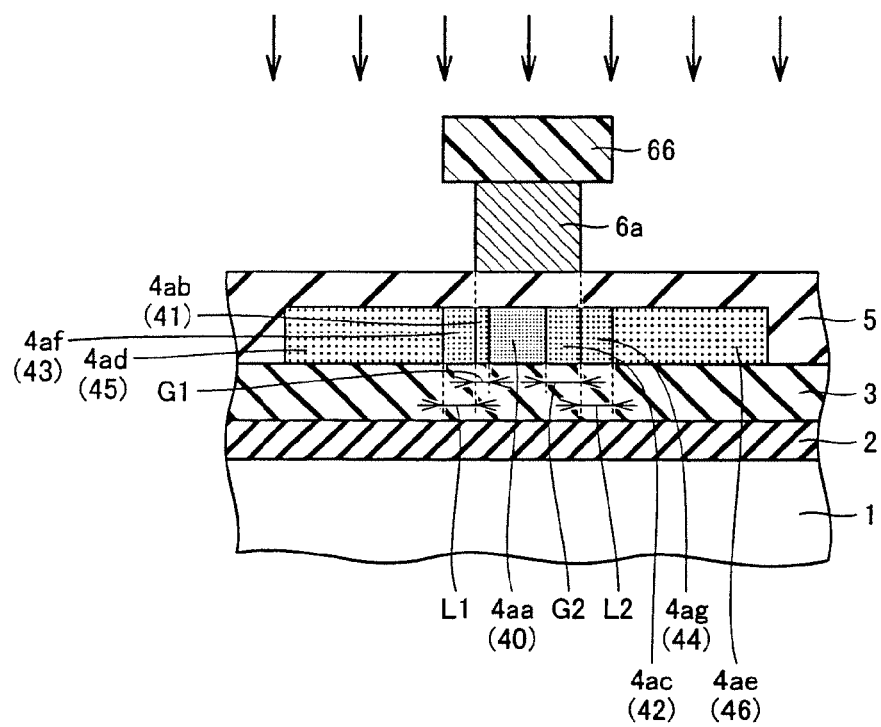
FIG. 36 is a sectional view of the semiconductor device of the sixth embodiment, representing a step carried out after the step of FIG. 35.

Then, a process similar to the process corresponding to the steps shown in FIGS. 7-9 set forth above is carried out to form gate electrode 6*a* on gate insulation film 5, as shown in FIG. 36. In this case, resist pattern 66 required to form gate electrode 6*a* is provided so as to overlap in plane with impurity regions 4*ab* and 4*ac* located sandwiching impurity region 4*aa* functioning as the channel, and such that the overlapping length in plane with impurity region 4*ac* is longer than the overlapping length with impurity region 4*ab* in plane.

Application of wet etching allows the side face of the chromium film that becomes the gate electrode to be etched. The etched amount can be controlled by the period of time of overetching.

Using remaining resist pattern 66 as a mask, boron is implanted into impurity regions 4*ab* and 4*ac* with a dosage of $1\times10^{15}$ atom/cm$^2$ and an acceleration energy of 60 KeV, for example, to obtain impurity regions 4*ad* and 4*ae* identified as a source region and a drain region. Then, ashing and chemical treatment are applied to remove resist pattern 66.

Thus, impurity region 4*ab* remaining from the formation of impurity regions 4*ad* and 4*ae* includes a portion of an impurity region overlapping in plane with gate electrode 6*a* (portion A) and a portion of an impurity region not overlapping with gate electrode 6*a* (portion B).

Taking portion A as impurity region 4*ab* and portion B as impurity region 4*af*, impurity region 4*ab* is identified as GOLD region 41 whereas impurity region 4*af* is identified as LDD region 43. In a likewise manner for remaining impurity region 4*ac*, impurity region 4*ac* is identified as GOLD region 42 and impurity region 4*ag* is identified as an LDD region 44. Length G2 in the direction of the channel length of GOLD region 42 located at the drain side is set longer than length G1 in the direction of the channel length of GOLD region 41 located at the source side.

Figure 37:
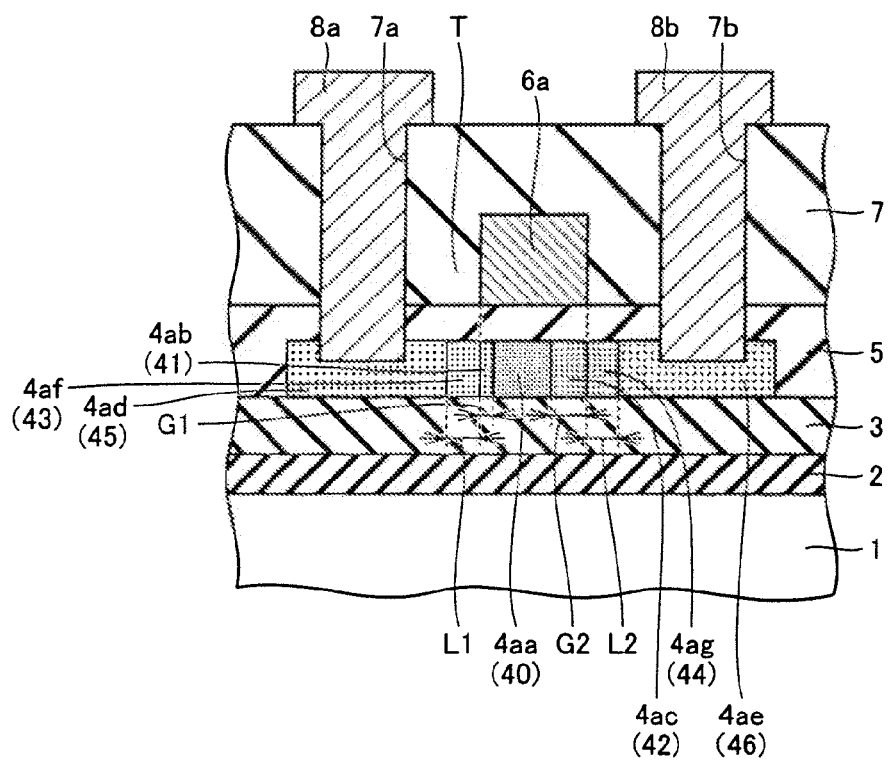
FIG. 37 is a sectional view of the semiconductor device of the sixth embodiment, representing a step carried out after the step of FIG. 36.

Then, a process similar to the process corresponding to the steps shown in FIGS. 11-13 set forth before is carried out to produce a thin film transistor of a GOLD structure with an LDD structure, as shown in FIG. 37.

In such a thin film transistor of a GOLD structure formed as set forth above, length G2 in the direction of the channel length of GOLD region 42 located at the drain side is set longer than length G1 in the direction of the channel length of GOLD region 41 located at the source side. Furthermore, LDD region 43 is formed between GOLD region 41 and source region 45. LDD region 44 is formed between GOLD region 42 and drain region 46.

Results of measurement of source-drain breakdown voltage for the thin film transistor set forth above will be described hereinafter. For the measurement, a thin film transistor was employed having the following parameters: gate width 20 μm; effective gate length 5 μm; overlapping length G2 of GOLD region 42 at drain side 1.5 μm, length L2 in the direction of channel length of LDD region 44 at drain side 0.3 μm; overlapping length G1 of GOLD region 41 at source side 0.5 μm; length L1 in the direction of channel length of LDD region 43 at source side 0.3 μm; and width of gate electrode 6a in the direction of the channel length 7 μm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the second embodiment.

Figures 38, 39:
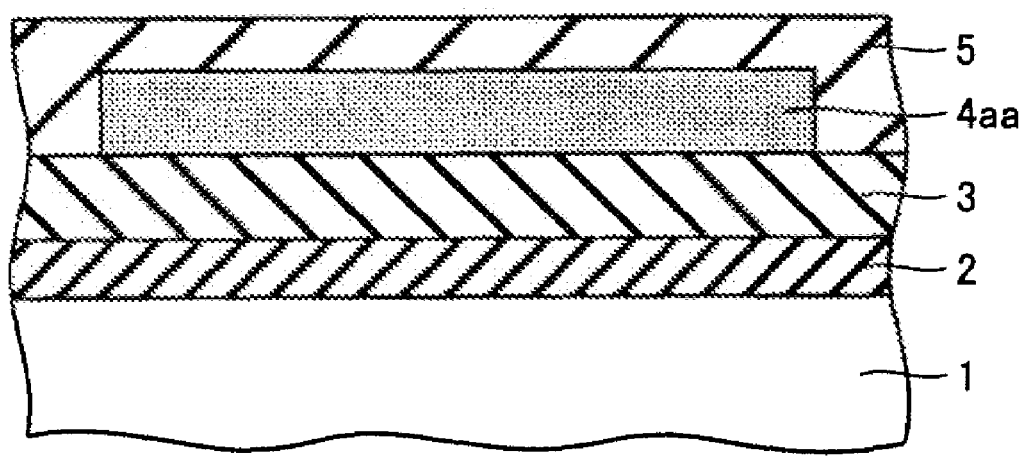
FIG. 38 represents the results of source-drain breakdown voltage of thin film transistors in the sixth embodiment.
FIG. 39 is a sectional view of the semiconductor device according to a seventh embodiment of the present invention, representing a step of a fabrication method thereof.

The measured results of the source-drain breakdown voltage are shown in FIG. 38. The measurement conditions are as set forth in the foregoing. As shown in FIG. 38, it is appreciated that the thin film transistor of a GOLD structure of the present embodiment exhibits a source-drain breakdown voltage of a level higher than that of a thin film transistor of a conventional GOLD structure and the thin film transistor described in the second embodiment. It was confirmed that the breakdown voltage can be improved.

Then, respective configurations of the thin film transistor of GOLD structure of the present embodiment, the thin film transistor of a conventional GOLD structure, and the thin film transistor of the second embodiment were actually observed to estimate the parasitic capacitance. As a result, it was estimated that the parasitic capacitance caused by GOLD regions 41 and 42 having different overlapping length with respect to gate electrode 6a in the thin film transistor of a GOLD structure of the present embodiment is lower than the parasitic capacitance of a thin film transistor of a conventional GOLD structure in which the overlapping length with the gate electrode is identical, and is of the same level as the parasitic capacitance of the thin film transistor of the second embodiment.

It was confirmed that the thin film transistor of a GOLD structure of the present embodiment has the parasitic capacitance reduced significantly while a higher breakdown voltage than the breakdown voltage of the thin film transistor of a conventional GOLD structure can be ensured.

Seventh Embodiment

The present seventh embodiment is directed to another example of a thin film transistor having both a GOLD region and an LDD region. A method of fabricating such a thin film transistor will be described hereinafter. The process of forming gate insulation film 5 shown in FIG. 39 up to the step of implanting predetermined impurities to control the threshold value of the thin film transistor is similar to the process set forth before up to the steps shown in FIG. 4.

Figure 40:
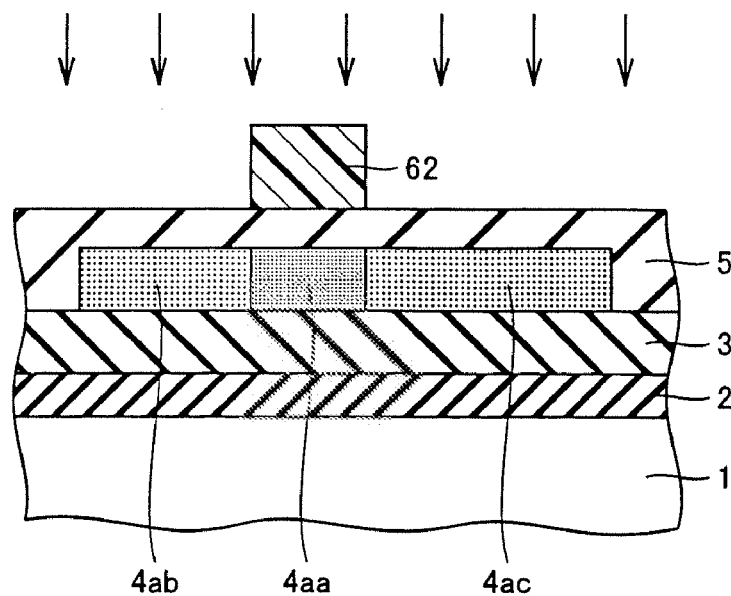
FIG. 40 is a sectional view of the semiconductor device of the seventh embodiment, representing a step carried out after the step of FIG. 39.

Then, referring to FIG. 40, predetermined photolithography is applied to form a resist pattern 62. Using this pattern 62 as a mask, phosphorus is implanted into polycrystalline silicon film 4a with a dosage of $1\times10^{13}$ atom/cm$^2$ and acceleration energy of 80 KeV, for example, to obtain impurity regions 4ab and 4ac. The implanted amount thereof corresponds to the amount of implantation of the GOLD region. Impurity region 4aa functioning as the channel is provided between impurity regions 4ab and 4ac. Then, ashing and chemical treatment are applied to remove resist pattern 62.

Figure 41:
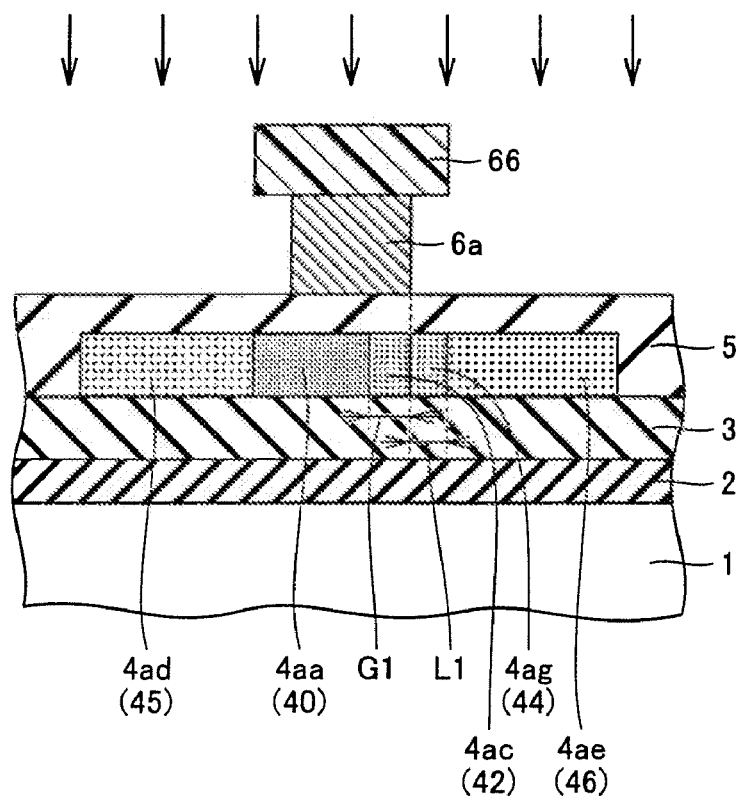
FIG. 41 is a sectional view of the semiconductor device of the seventh embodiment, representing a step carried out after the step of FIG. 40.

Then, a process similar to the process corresponding to the steps shown in FIGS. 7-9 set forth above is carried out to form gate electrode 6a on gate insulation film 5, as shown in FIG. 41. In this case, resist pattern 66 required to form gate electrode 6a is provided so as to overlap in plane with impurity region 4ac out of impurity regions 4ab and 4ac located sandwiching impurity region 4aa functioning as the channel.

Application of wet etching allows the side face of the chromium film that becomes the gate electrode to be etched. The etched amount can be controlled by the period of time of overetching.

Using remaining resist pattern 66 as a mask, phosphorus is implanted into impurity regions 4ab and 4ac with a dosage of $1\times10^{14}$ atom/cm$^2$ and an acceleration energy of 80 KeV, for example, to obtain impurity regions 4ad and 4ae identified as a source region and a drain region. Then, ashing and chemical treatment are applied to remove resist pattern 66.

Thus, impurity region 4ab remaining from the formation of impurity regions 4ad and 4ae includes a portion of an impurity region overlapping in plane with gate electrode 6a (portion A) and a portion of an impurity region not overlapping with gate electrode 6a (portion B).

Taking portion A as impurity region 4ac and portion B as impurity region 4ag, impurity region 4ac is identified as GOLD region 42 whereas impurity region 4ag is identified as LDD region 44. No GOLD region is formed at the source side.

Figures 42, 43:
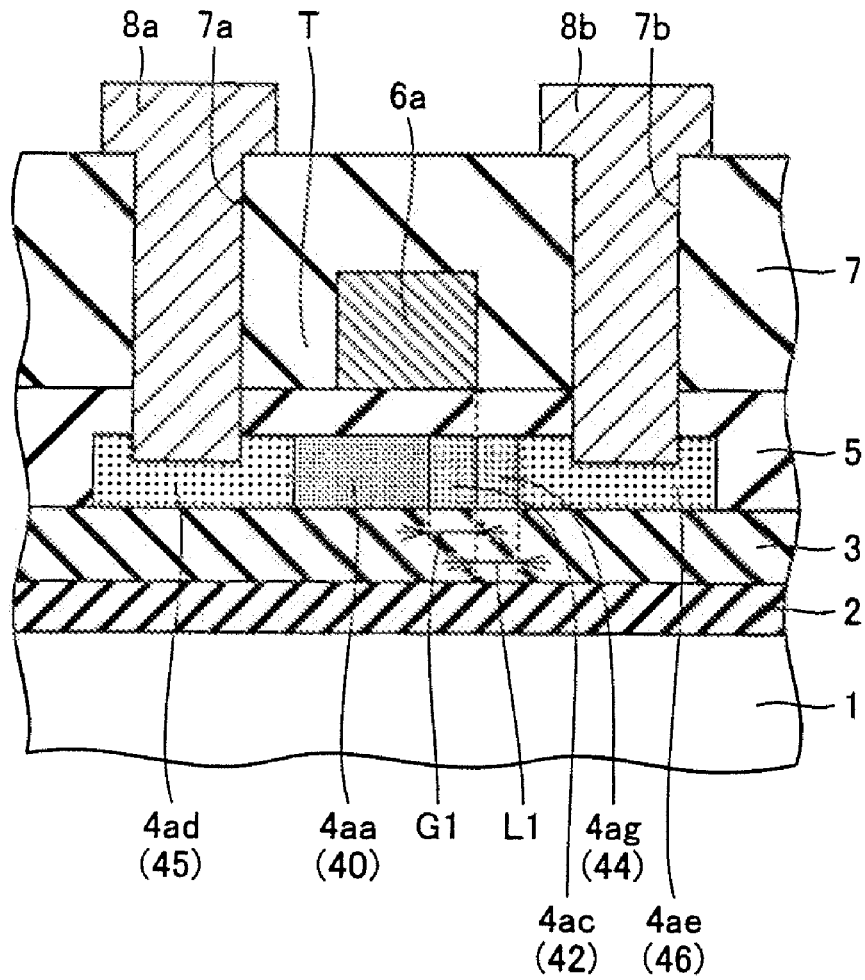
FIG. 42 is a sectional view of the semiconductor device of the seventh embodiment, representing a step carried out after the step of FIG. 41.
FIG. 43 represents the results of source-drain breakdown voltage of thin film transistors in the seventh embodiment.

Then, a process similar to the process corresponding to the steps shown in FIGS. 11-13 set forth before is carried out to produce a thin film transistor of a GOLD structure, as shown in FIG. 42.

In such a thin film transistor of a GOLD structure formed as set forth above, GOLD region 42 and LDD region 44 are formed at the drain side, and not at the source side.

Results of measurement of source-drain breakdown voltage for the thin film transistor set forth above will be described hereinafter. For the measurement, a thin film transistor was employed having the following parameters: gate width 10 μm; effective gate length 5 μm; overlapping length G2 of GOLD region 42 at drain side 1.5 μm, length L2 in the direction of channel length of LDD region 44 at drain side 0.3 μm; and width of gate electrode 6a in the direction of channel length 6.5 μm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the first embodiment.

The measured results of the source-drain breakdown voltage are shown in FIG. 43. The measurement conditions are as set forth in the foregoing. As shown in FIG. 43, it is appreciated that the thin film transistor of a GOLD structure of the present embodiment exhibits a source-drain breakdown voltage of a level higher than that of a thin film transistor of a conventional GOLD structure and the thin film transistor described in the first embodiment. It was confirmed that the breakdown voltage can be improved.

Then, respective configurations of the thin film transistor of GOLD structure of the present embodiment, the thin film transistor of a conventional GOLD structure, and the thin film transistor of the first embodiment were actually observed to estimate the parasitic capacitance. As a result, it was estimated the parasitic capacitance caused by GOLD region 42 is reduced to approximately 50% of the parasitic capacitance of the thin film transistor of a conventional GOLD structure since the thin film transistor of a GOLD structure of the present embodiment includes a GOLD region overlapping with gate electrode 6a only at the drain side, and is absent of a GOLD region at the source side. Furthermore, it was estimated that the parasitic capacitance is further reduced as compared to the thin film transistor of the first embodiment since a GOLD region is not formed at the source side.

Thus, it was confirmed that the thin film transistor of a GOLD structure of the present embodiment can have the parasitic capacitance further reduced while a breakdown voltage higher than the breakdown voltage of the thin film transistor of a conventional GOLD structure can be ensured.

Eighth Embodiment

The previous seventh embodiment was described in which an n channel thin film transistor is taken as an example of a thin film transistor. It is to be noted that a p type thin film transistor is also formed at the same time on a glass substrate. The main steps in the method of fabricating a p type thin film transistor will be described hereinafter.

Figure 44:
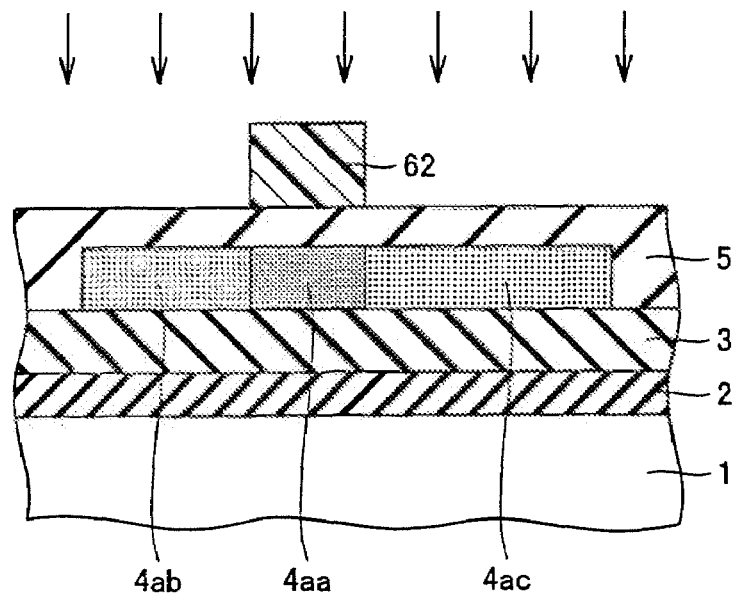
FIG. 44 is a sectional view of a semiconductor device according to an eighth embodiment of the present invention, representing a step of a fabrication method thereof.

Following the above-described step shown in FIG. 4, predetermined photolithography is applied to form a resist pattern 62, as shown in FIG. 44. Using this pattern 62 as a mask, boron is implanted into polycrystalline silicon film 4a with a dosage of $5\times10^{13}$ atom/cm$^2$ and acceleration energy of 60 KeV, for example, to obtain impurity regions 4ab and 4ac. The implanted amount thereof corresponds to the amount of implantation of the GOLD region. Impurity region 4aa functioning as the channel is provided between impurity regions 4ab and 4ac. Then, ashing and chemical treatment are applied to remove resist pattern 62.

Figure 45:
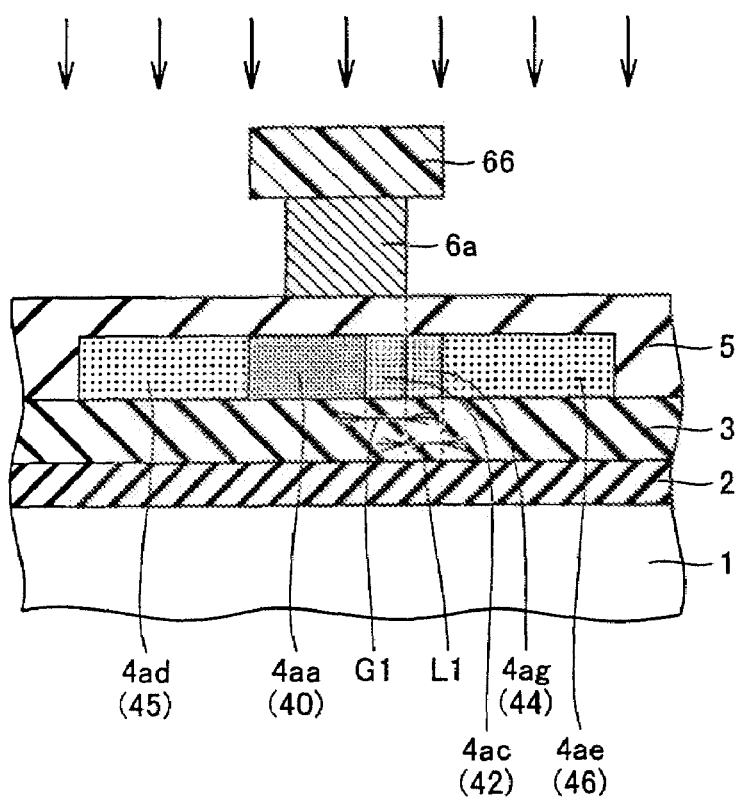
FIG. 45 is a sectional view of the semiconductor device of the eighth embodiment, representing a step carried out after the step of FIG. 44.

Then, a process similar to the process corresponding to the steps shown in FIGS. 7-9 set forth above is carried out to form gate electrode 6a on gate insulation film 5, as shown in FIG. 45. In this case, resist pattern 66 required to form gate electrode 6a is provided so as to overlap in plane with impurity regions 4ac out of impurity regions 4ab and 4ac located sandwiching impurity region 4aa functioning as the channel.

Application of wet etching allows the side face of the chromium film that becomes the gate electrode to be etched. The etched amount can be controlled by the period of time of overetching.

Using remaining resist pattern 66 as a mask, boron is implanted into impurity regions 4ab and 4ac with a dosage of $1\times10^{15}$ atom/cm$^2$ and an acceleration energy of 60 KeV, for example, to obtain impurity regions 4ad and 4ae identified as a source region and a drain region. Then, ashing and chemical treatment are applied to remove resist pattern 66.

Thus, impurity region 4ac remaining from the formation of impurity regions 4ad and 4ae includes a portion of an impurity region overlapping in plane with gate electrode 6a (portion A) and a portion of an impurity region not overlapping with gate electrode 6a (portion B).

Taking portion A as impurity region 4ac and portion B as impurity region 4ag, impurity region 4ac is identified as GOLD region 42 whereas impurity region 4ag is identified as LDD region 44. No GOLD region is formed at the source side.

Figures 46, 47:
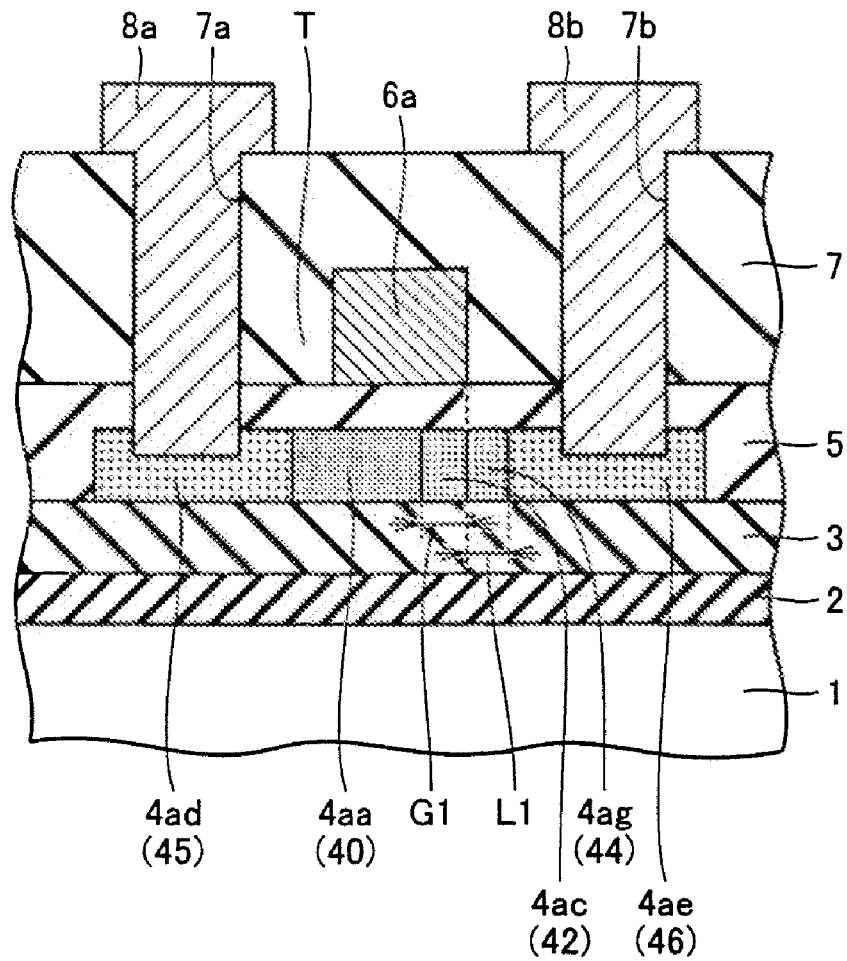
FIG. 46 is a sectional view of the semiconductor device of the eighth embodiment, representing a step carried out after the step of FIG. 45.
FIG. 47 represents the results of source-drain breakdown voltage of thin film transistors in the eighth embodiment.

Then, a process similar to the process corresponding to the steps shown in FIGS. 11-13 set forth before is carried out to produce a thin film transistor of a GOLD structure, as shown in FIG. 46.

Results of measurement of source-drain breakdown voltage for the thin film transistor set forth above will be described hereinafter. For the measurement, a thin film transistor was employed having the following parameters: gate width 20 µm; effective gate length 5 µm; overlapping length G2 of GOLD region 42 at drain side 1.5 µm, length L2 in the direction of channel length of LDD region 44 at drain side 0.3 µm; and width of gate electrode 6a in the direction of channel length 7 µm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the second embodiment.

The measured results of the source-drain breakdown voltage are shown in FIG. 47. The measurement conditions are as set forth in the foregoing. As shown in FIG. 47, it is appreciated that the thin film transistor of a GOLD structure of the present embodiment exhibits a source-drain breakdown voltage of a level higher than that of a thin film transistor of a conventional GOLD structure and the thin film transistor described in the second embodiment. It was confirmed that the breakdown voltage can be improved.

Then, respective configurations of the thin film transistor of GOLD structure of the present embodiment, the thin film transistor of a conventional GOLD structure, and the thin film transistor of the seventh embodiment were actually observed to estimate the parasitic capacitance. As a result, it was estimated that, since the thin film transistor of a GOLD structure of the present embodiment includes a GOLD region overlapping with gate electrode 6a only at the drain side, and is absent of a GOLD region at the source side, the parasitic capacitance caused by GOLD region 42 in the thin film transistor of a GOLD structure of the present embodiment is lower by approximately 50% than the parasitic capacitance of a thin film transistor of a conventional GOLD structure, and also lower than the parasitic capacitance of the thin film transistor of the second embodiment.

It was confirmed that the thin film transistor of a GOLD structure of the present embodiment has the parasitic capacitance reduced significantly while a higher breakdown voltage than the thin film transistor of a conventional GOLD structure can be ensured.

Ninth Embodiment

Figure 48:
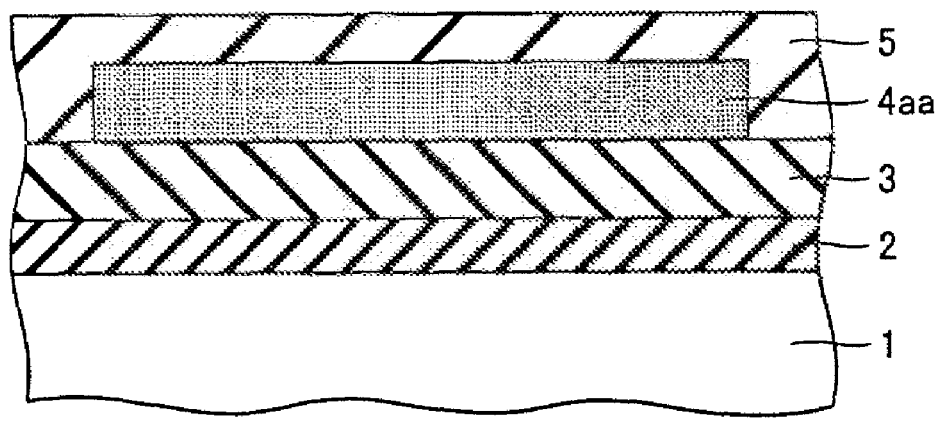
FIG. 48 is a sectional view of a semiconductor device according to a ninth embodiment of the present invention, representing a step of a fabrication method thereof.

The ninth embodiment is directed to another example of a thin film transistor having both a GOLD region and an LDD region. A method of fabricating such a thin film transistor will be described hereinafter. The process of forming gate insulation film 5 shown in FIG. 48 up to the step of implanting predetermined impurities to control the threshold value of the thin film transistor is similar to the process up to the steps shown in FIG. 4.

Figure 49:
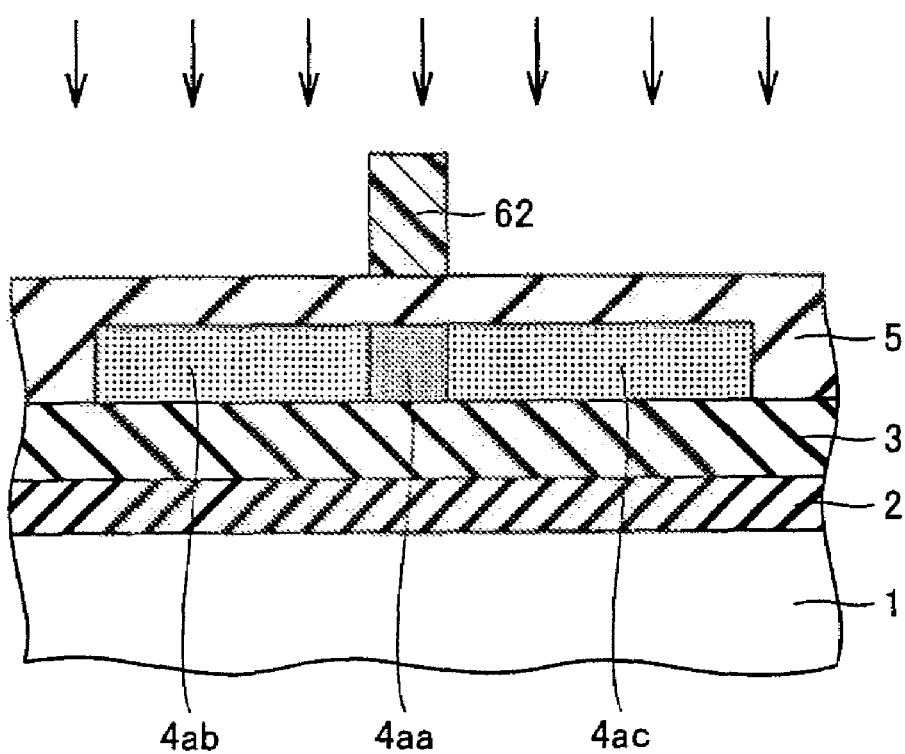
FIG. 49 is a sectional view of the semiconductor device of the ninth embodiment, representing a step carried out after the step of FIG. 48.

Then, referring to FIG. 49, predetermined photolithography is applied to form a resist pattern 62. Using this pattern 62 as a mask, phosphorus is implanted into the polycrystalline silicon film with a dosage of $1\times10^{13}$ atom/cm$^2$ and acceleration energy of 80 KeV, for example, to obtain impurity regions 4ab and 4ac. The implanted amount thereof corresponds to the amount of implantation of the GOLD region. Impurity region 4aa functioning as the channel is provided between impurity regions 4ab and 4ac. Then, ashing and chemical treatment are applied to remove resist pattern 62.

Figure 50:
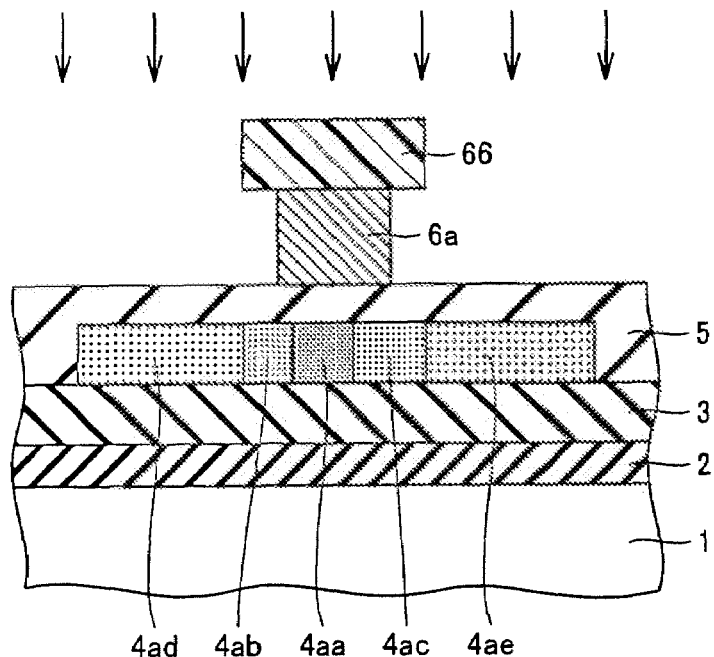
FIG. 50 is a sectional view of the semiconductor device of the ninth embodiment, representing a step carried out after the step of FIG. 49.

Then, a process similar to the process corresponding to the steps shown in FIGS. 7-9 set forth above is carried out to form gate electrode 6a on gate insulation film 5, as shown in FIG. 50. In this case, resist pattern 66 required to form gate electrode 6a is provided so as to overlap in plane with impurity regions 4ab and 4ac, and such that the overlapping length between resist pattern 66 and impurity region 4ac located at the drain side is longer than the overlapping length between resist pattern 66 and impurity region 4ab located at the source side.

Application of wet etching allows the side face of the chromium film that becomes the gate electrode to be etched. The etched amount can be controlled by the period of time of overetching.

Using remaining resist pattern 66 as a mask, phosphorus is implanted into impurity regions 4ab and 4ac with a dosage of $1 \times 10^{14}$ atom/cm$^2$ and an acceleration energy of 80 KeV, for example, to obtain impurity regions 4ad and 4ae identified as a source region and a drain region. Then, ashing and chemical treatment are applied to remove resist pattern 66.

Figure 51:
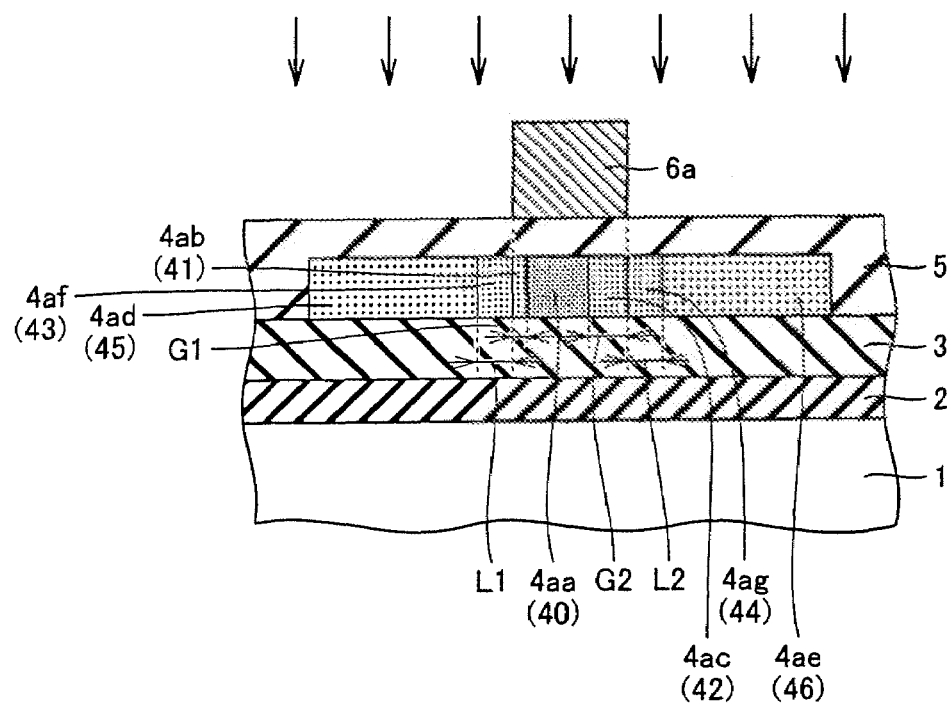
FIG. 51 is a sectional view of the semiconductor device of the ninth embodiment, representing a step carried out after the step of FIG. 50.

Referring to FIG. 51, using gate electrode 6a as a mask, phosphorus is implanted into impurity regions 4ab and 4ac with a dosage of $1 \times 10^{13}$ atom/cm$^2$ and acceleration energy of 80 KeV, for example, to obtain impurity regions 4af and 4ag identified as the LDD regions.

Accordingly, impurity region 4ab is identified as GOLD region 41, and impurity region 4af is identified as LDD region 43 at the source side. Furthermore, impurity region 4ac is identified as GOLD region 42, and impurity region 4ag is identified as LDD region 44 at the drain side. Length G2 in the direction of the channel length of GOLD region 42 located at the drain side is set longer than length G1 of GOLD region 41 located at the source side in the direction of the channel length.

Figures 52, 53:
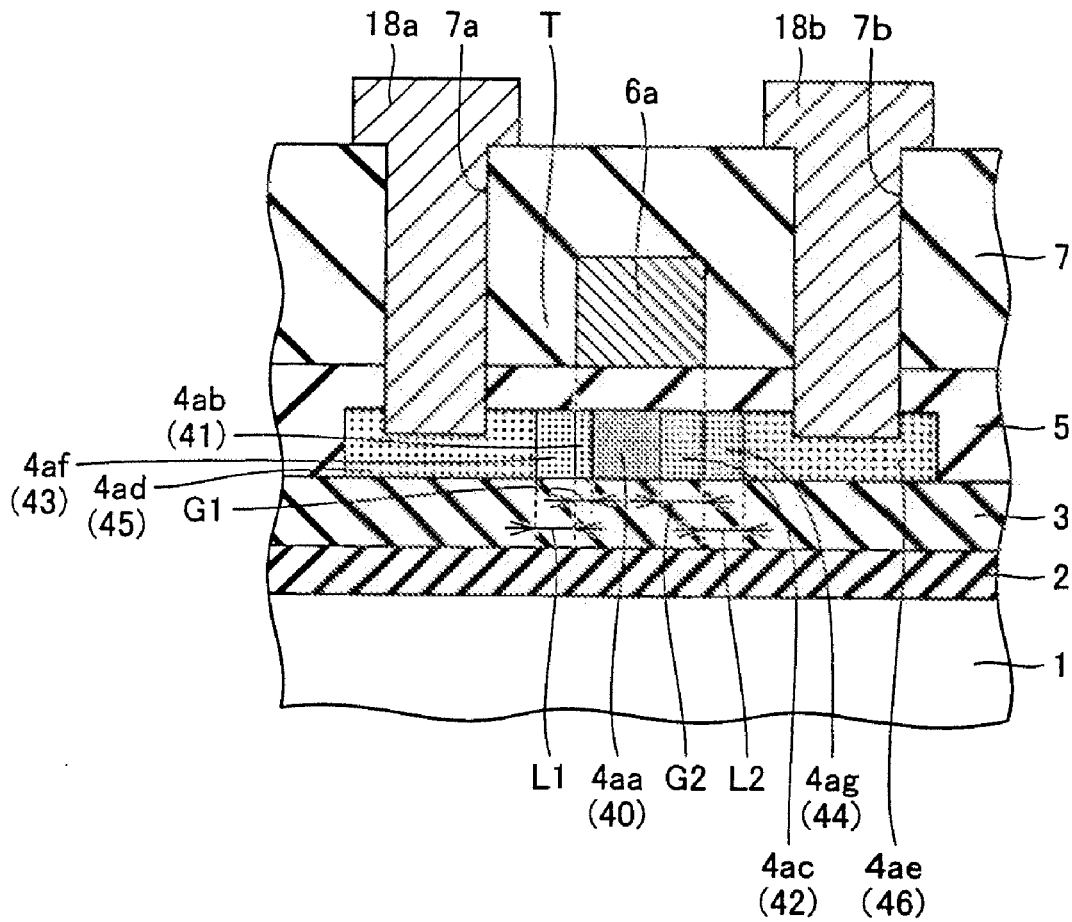
FIG. 52 is a sectional view of the semiconductor device of the ninth embodiment, representing a step carried out after the step of FIG. 51.
FIG. 53 represents the results of the source-drain breakdown voltage of a thin film transistor in the ninth embodiment.

Then, a process similar to the process corresponding to the steps shown in FIGS. 11-13 set forth before is carried out to produce a thin film transistor of a GOLD structure having an LDD structure, as shown in FIG. 52.

In such a thin film transistor of a GOLD structure formed as set forth above, length G2 in the direction of the channel length of GOLD region 42 located at the drain side is set longer than length G1 of the direction of the channel length of GOLD region 41 located at the source side. Furthermore, LDD region 43 is formed between GOLD region 41 and source region 45. LDD region 44 is formed between GOLD region 42 and drain region 46.

Results of measurement of source-drain breakdown voltage for the thin film transistor set forth above will be described hereinafter. For the measurement, a thin film transistor was employed having the following parameters: gate width 10 µm; effective gate length 5 µm; overlapping length G2 of GOLD region 42 at drain side 1.5 µm, length L2 in the direction of channel length of LDD region 44 at drain side 0.3 µm; overlapping length G1 of GOLD region 41 at source side 0.5 µm; length L1 in the direction of channel length of LDD region 43 at source side 0.3 µm; and width of gate electrode 6a in the direction of the channel length 7 µm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the first embodiment.

The measured results of the source-drain breakdown voltage are shown in FIG. 53. The measurement conditions are as set forth in the foregoing. As shown in FIG. 53, it is appreciated that the thin film transistor of a GOLD structure of the present embodiment exhibits a source-drain breakdown voltage of a level higher than that of a thin film transistor of a conventional GOLD structure.

It was also confirmed that the thin film transistor of a GOLD structure of the present embodiment can have the source-drain breakdown voltage further improved by virtue of the formation of LDD regions 42 and 43, as compared with the thin film transistor of the first embodiment.

Respective configurations of the thin film transistor of a GOLD structure of the present embodiment and the thin film transistor of a conventional GOLD structure were actually observed to estimate the parasitic capacitance. It was estimated that the parasitic capacitance caused by GOLD regions 41 and 42 having different overlapping lengths with gate electrode 6a in the thin film transistor of a GOLD structure of the present embodiment is lower than the parasitic capacitance of the thin film transistor of a conventional GOLD structure having the same overlapping length with the gate electrode.

Thus, it was confirmed that thin film transistor of a GOLD structure of the present embodiment can have the parasitic capacitance further reduced while ensuring a breakdown voltage higher than that of the thin film transistor of a conventional GOLD structure.

Tenth Embodiment

The previous ninth embodiment was described in which an n channel thin film transistor is taken as an example of a thin film transistor. In the tenth embodiment, the main steps in the method of fabricating a p type thin film transistor will be described hereinafter.

Figure 54:
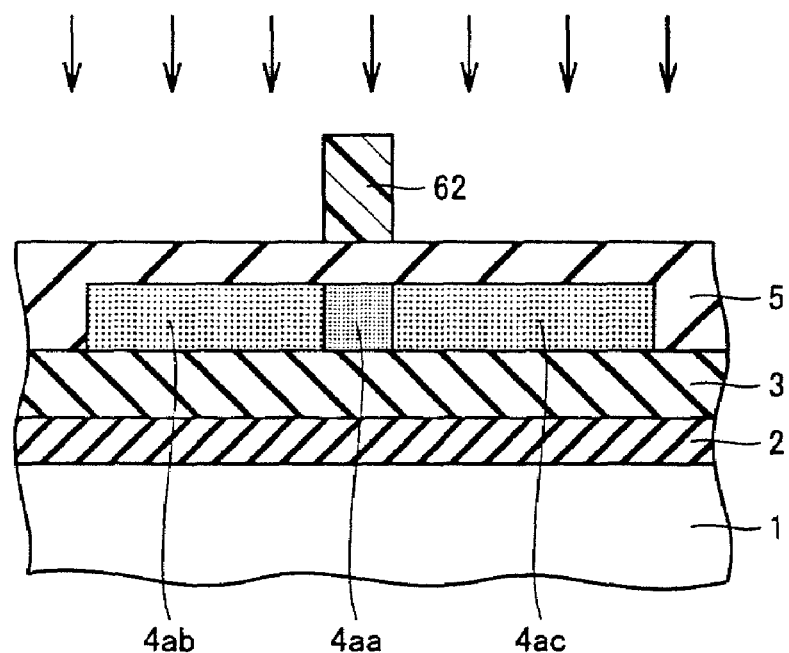
FIG. 54 is a sectional view of a semiconductor device according to a tenth embodiment of the present invention, representing a step of a fabrication method thereof.

Following the above-described step shown in FIG. 4, predetermined photolithography is applied to form a resist pattern 62, as shown in FIG. 54.

Using resist pattern 62 as a mask, boron is implanted into the polycrystalline silicon film with a dosage of $5 \times 10^{13}$ atom/cm$^2$ and acceleration energy of 60 KeV, for example, to obtain impurity regions 4ab and 4ac. The implanted amount thereof corresponds to the amount of implantation of the GOLD region. Impurity region 4aa functioning as a channel is formed between impurity regions 4ab and 4ac. Then, ashing and chemical treatment are applied to remove resist pattern 62.

Figure 55:
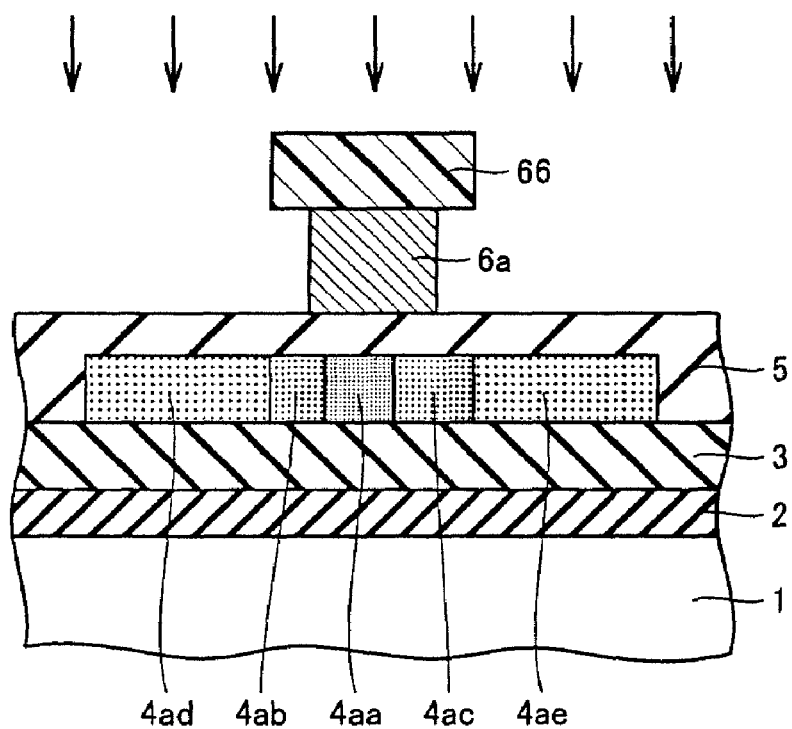
FIG. 55 is a sectional view of the semiconductor device of the tenth embodiment, representing a step carried out after the step of FIG. 54.

Then, a process similar to the process corresponding to the steps shown in FIGS. 7-9 set forth above is carried out to form gate electrode 6a on gate insulation film 5, as shown in FIG. 55. In this case, resist pattern 66 is formed so as to overlap in plane with impurity regions 4ab and 4ac, and such that the overlapping length in the direction of the channel length between resist pattern 66 and impurity region 4ac located at the drain side is longer than the overlapping length between resist pattern 66 and impurity region 4ab located at the source side.

Application of wet etching allows the side face of the chromium film that becomes the gate electrode to be etched. The etched amount can be controlled by the period of time of overetching.

Using remaining resist pattern 66 as a mask, boron is implanted into impurity regions 4ab and 4ac with a dosage of $1 \times 10^{15}$ atom/cm$^2$ and an acceleration energy of 60 KeV, to obtain impurity regions 4ad and 4ae identified as a source region and a drain region. Then, ashing and chemical treatment are applied to remove resist pattern 66.

Figure 56:
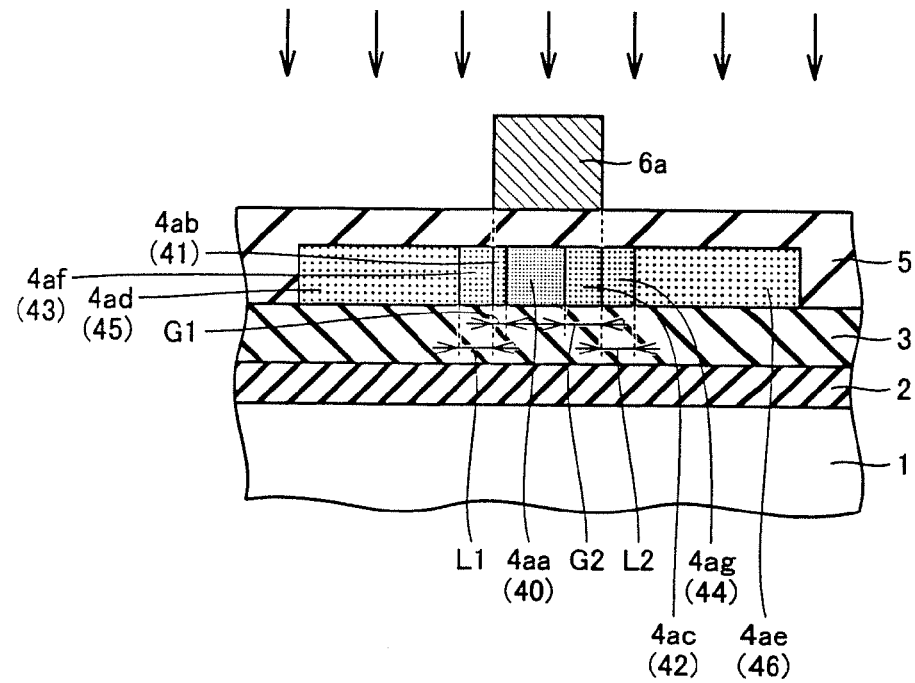
FIG. 56 is a sectional view of the semiconductor device of the tenth embodiment, representing a step carried out after the step of FIG. 55.

Referring to FIG. 56, using gate electrode 6a as a mask, boron is implanted into impurity regions 4ab and 4ac with a dosage of $5\times10^{13}$ atom/cm$^2$ and acceleration energy of 60 KeV, for example, to obtain impurity regions 4af and 4ag identified as the LDD region.

Accordingly, impurity region 4ab is identified as GOLD region 41, and impurity region 4af is identified as LDD region 43 at the source side. Furthermore, impurity region 4ac is identified as GOLD region 42, and impurity region 4ag is identified as LDD region 44 at the drain side. Length G2 in the direction of the channel length of GOLD region 42 located at the drain side is set longer than length G1 of GOLD region 41 located at the source side in the direction of the channel length.

Figure 57:
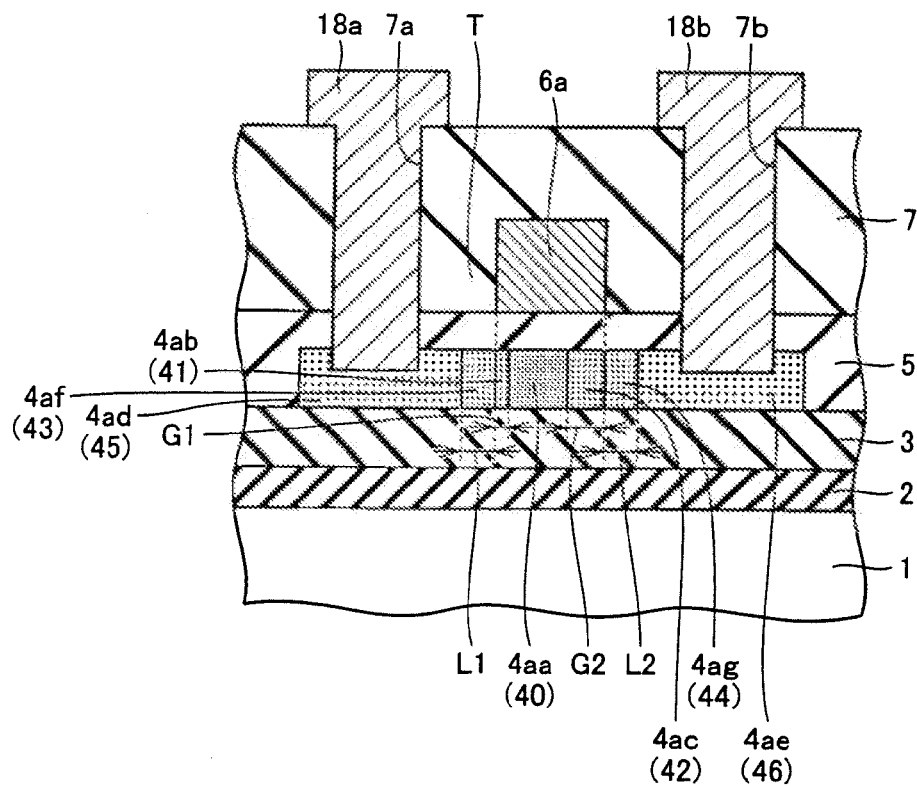
FIG. 57 is a sectional view of the semiconductor device of the tenth embodiment, representing a step carried out after the step of FIG. 56.

Then, a process similar to that corresponding to the steps shown in FIGS. 11-13 is carried out to produce a thin film transistor of a GOLD structure, as shown in FIG. 57.

In such a thin film transistor of a GOLD structure formed as set forth above, length G2 in the direction of the channel length of GOLD region 42 located at the drain side is set longer than length G1 in the direction of the channel length of GOLD region 41 located at the source side. Furthermore, LDD region 43 is formed between GOLD region 41 and source region 45. LDD region 44 is formed between GOLD region 42 and drain region 46.

Results of measurement of source-drain breakdown voltage for the thin film transistor set forth above will be described hereinafter. For the measurement, a thin film transistor was employed having the following parameters: gate width 20 μm; effective gate length 5 μm; overlapping length G2 of GOLD region 42 at drain side 1.5 μm; length L2 in the direction of channel length of LDD region 44 at drain side 0.3 μm; overlapping length G1 of GOLD region 41 at source side 0.5 μm; length L1 in the direction of channel length of LDD region 43 at source side 0.3 μm; and width of gate electrode 6a in the direction of channel length 7 μm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the second embodiment.

Figures 58, 59:
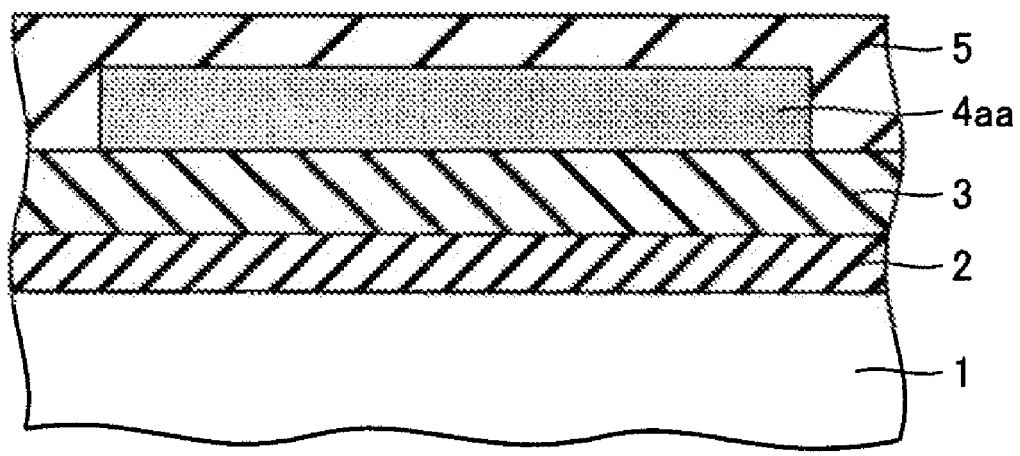
FIG. 58 represents the results of source-drain breakdown voltage of thin film transistors in the tenth embodiment.
FIG. 59 is a sectional of a semiconductor device according to an eleventh embodiment of the present invention, representing a step of a fabrication method thereof.

The measured results of the source-drain breakdown voltage are shown in FIG. 58. The measurement conditions are as set forth in the foregoing. As shown in FIG. 58, it is appreciated that the thin film transistor of a GOLD structure of the present embodiment exhibits a source-drain breakdown voltage of a level higher than that of a thin film transistor of a conventional GOLD structure.

It was also confirmed that the thin film transistor of a GOLD structure of the present embodiment can have the source-drain breakdown voltage further improved by virtue of the formation of LDD regions 42 and 43, as compared with the thin film transistor of the second embodiment.

Respective configurations of the thin film transistor of a GOLD structure of the present embodiment and the thin film transistor of a conventional GOLD structure were actually observed to estimate the parasitic capacitance. It was estimated that the parasitic capacitance caused by GOLD regions 41 and 42 having different overlapping lengths with respect to gate electrode 6a in the thin film transistor of a GOLD structure of the present embodiment is lower than the parasitic capacitance of the thin film transistor of a conventional GOLD structure having the same overlapping length with respect to the gate electrode.

Thus, it was confirmed that thin film transistor of a GOLD structure of the present embodiment can have the parasitic capacitance further reduced while ensuring a breakdown voltage higher than that of the thin film transistor of a conventional GOLD structure.

Eleventh Embodiment

The eleventh embodiment is directed to a further example of a thin film transistor having both a GOLD region and an LDD region. A method of fabricating such a thin film transistor will be described hereinafter. The process of forming gate insulation film 5 shown in FIG. 59 up to the step of implanting predetermined impurities to control the threshold value of the thin film transistor is similar to the process up to the steps shown in FIG. 4.

Figure 60:
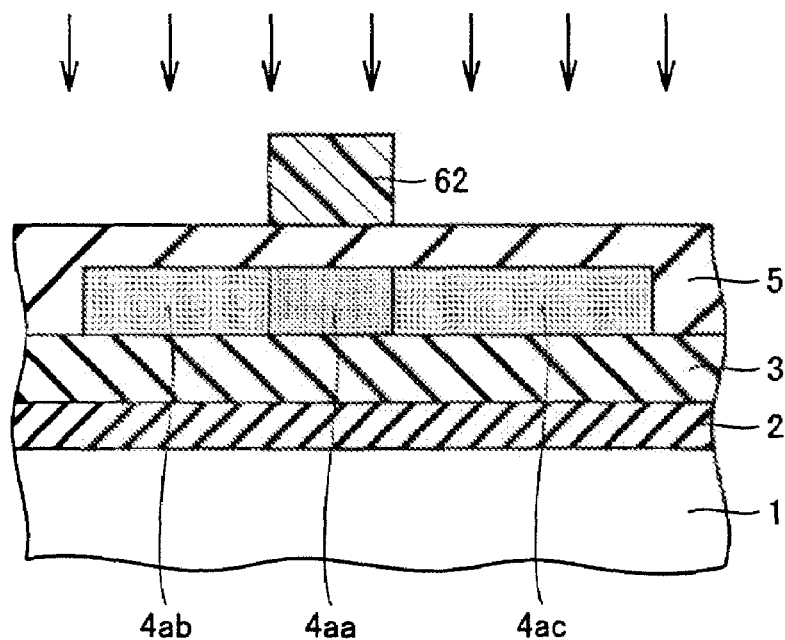
FIG. 60 is a sectional view of the semiconductor device of the eleventh embodiment, representing a step carried out after the step of FIG. 59.

Then, referring to FIG. 60, predetermined photolithography is applied to form a resist pattern 62. Using this pattern 62 as a mask, phosphorus is implanted into polycrystalline silicon film 4a with a dosage of $1\times10^{13}$ atom/cm$^2$ and acceleration energy of 60 KeV, for example, to obtain impurity regions 4ab and 4ac. The implanted amount thereof corresponds to the amount of implantation of the GOLD region. Impurity region 4aa functioning as the channel is provided between impurity regions 4ab and 4ac. Then, ashing and chemical treatment are applied to remove resist pattern 62.

Figure 61:
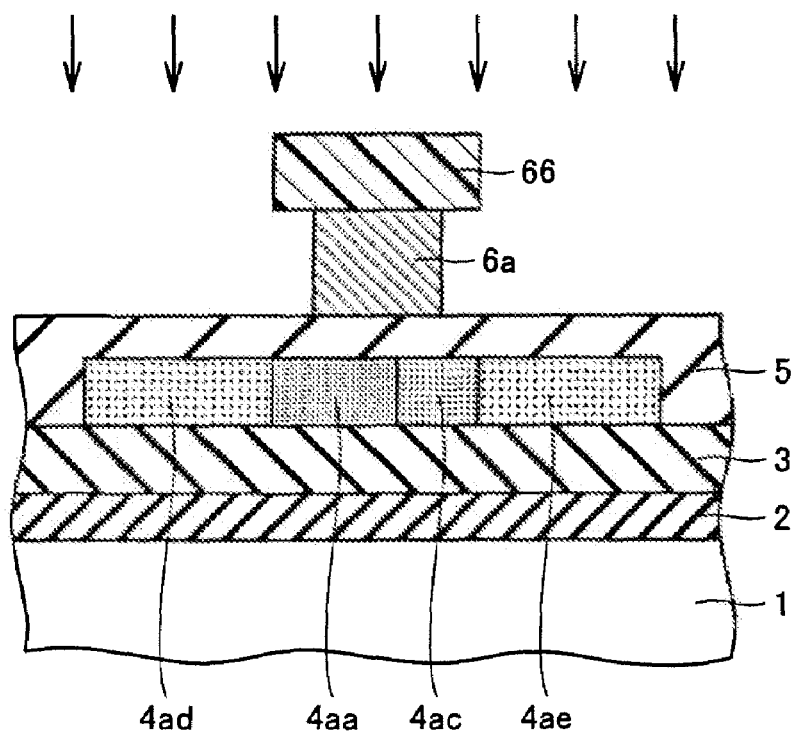
FIG. 61 is a sectional view of the semiconductor device of the eleventh embodiment, representing a step carried out after the step of FIG. 60.

Then, a process similar to the process corresponding to the steps shown in FIGS. 7-9 set forth above is carried out to form gate electrode 6a on gate insulation film 5, as shown in FIG. 61. In this case, resist pattern 66 is formed so as to overlap in plane with impurity region 4ac located at the drain side, and not to overlap in plane with impurity region 4ab.

Application of wet etching allows the side face of the chromium film that becomes the gate electrode to be etched. The etched amount can be controlled by the period of time of overetching.

Using remaining resist pattern 66 as a mask, phosphorus is implanted into impurity regions 4ab and 4ac with a dosage of $1\times10^{14}$ atom/cm$^2$ and acceleration energy of 60 KeV, for example, to obtain impurity regions 4ad and 4ae identified as a source region and a drain region. Then, ashing and chemical treatment are applied to remove resist pattern 66.

Figure 62:
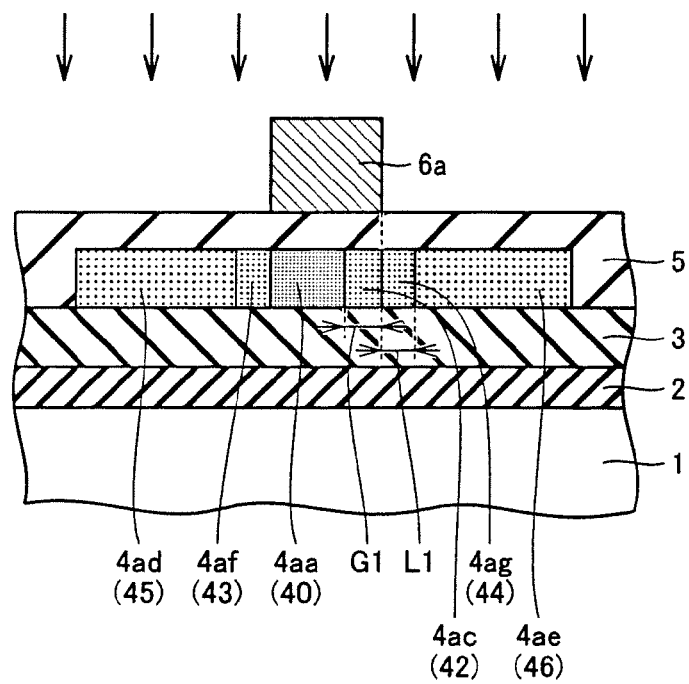
FIG. 62 is a sectional view of the semiconductor device of the eleventh embodiment, representing a step carried out after the step of FIG. 61.

Referring to FIG. 62, using gate electrode 6a as a mask, phosphorus is implanted into impurity regions 4ab and 4ac with a dosage of $1\times10^{13}$ atom/cm$^2$ and acceleration energy of 60 KeV, for example, to obtain impurity regions 4af and 4ag identified as the LDD regions.

Accordingly, impurity region 4af is identified as LDD region 43 and no GOLD region is formed at the source side. Furthermore, impurity region 4ac is identified as GOLD region 42, and impurity region 4ag is identified as LDD region 44 at the drain side.

Figure 63:
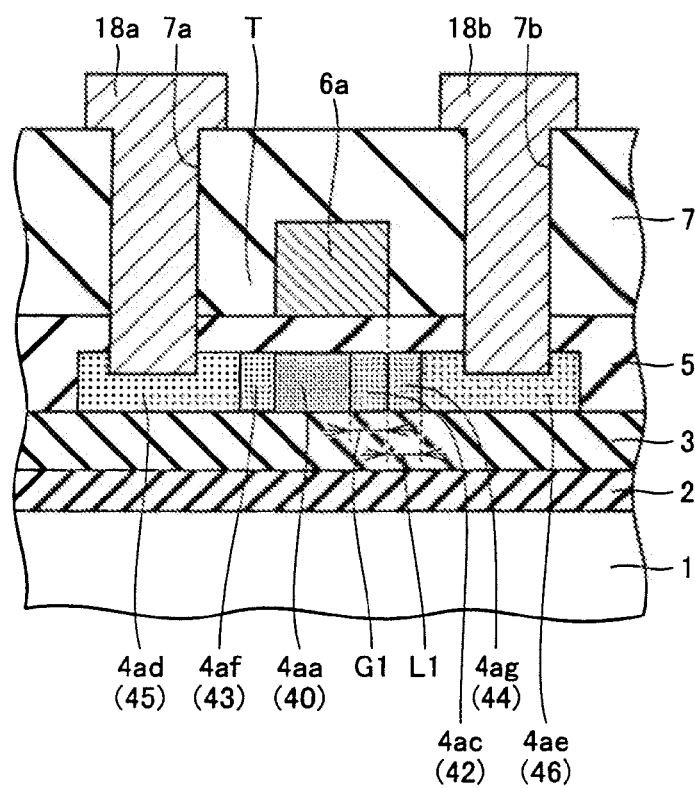
FIG. 63 is a sectional view of the semiconductor device of the eleventh embodiment, representing a step carried out after the step of FIG. 62.

Then, a process similar to the process corresponding to the steps shown in FIGS. 11-13 set forth before is carried out to produce a thin film transistor of a GOLD structure, as shown in FIG. 63.

In such a thin film transistor of a GOLD structure formed as set forth above, GOLD region 42 is formed at the drain side, and no GOLD region is formed at the source side. LDD region 43 is formed between source region 45 and channel region 40. LDD region 44 is formed between GOLD region 42 and drain region 46.

Results of measurement of source-drain breakdown voltage for the thin film transistor set forth above will be described hereinafter. For the measurement, a thin film transistor was employed having the following parameters: gate width 10 μm; effective gate length 5 μm; overlapping length G2 of GOLD region 42 at drain side 1.5 μm, length L2 in the direction of channel length of LDD region 44 at drain side 0.3 µm; and width of gate electrode 6a in the direction of the channel length 7 µm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the first embodiment.

Figures 64, 65:
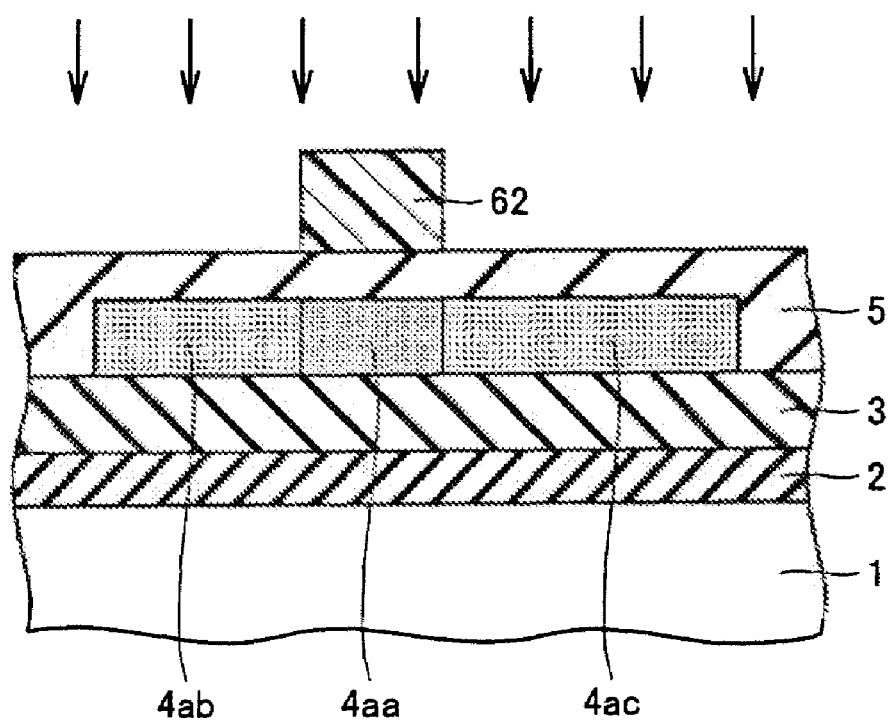
FIG. 64 represents the results of source-drain breakdown voltage of thin film transistors in the eleventh embodiment.
FIG. 65 is a sectional view of a semiconductor device according to a twelfth embodiment of the present invention, representing a step of fabrication method thereof.

The measured results of the source-drain breakdown voltage are shown in FIG. 64. The measurement conditions are as set forth in the foregoing. As shown in FIG. 64, it is appreciated that the thin film transistor of a GOLD structure of the present embodiment exhibits a source-drain breakdown voltage of a level higher than that of a thin film transistor of a conventional GOLD structure and the thin film transistor described in the first embodiment.

Respective configurations of the thin film transistor of a GOLD structure of the present embodiment, the thin film transistor described in the first embodiment and the thin film transistor of a conventional GOLD structure were actually observed to estimate the parasitic capacitance.

As a result, it was estimated that the parasitic capacitance caused by GOLD region 42 in the thin film transistor of a GOLD structure of the present embodiment is reduced to approximately 50% of the parasitic capacitance of the thin film transistor of a conventional GOLD structure. Furthermore, it was estimated that the parasitic capacitance is further reduced as compared to the thin film transistor of the first embodiment.

Thus, it was confirmed that the thin film transistor of a GOLD structure of the present embodiment can have the parasitic capacitance further reduced while a breakdown voltage higher than the breakdown voltage of the thin film transistor of a conventional GOLD structure can be ensured.

Twelfth Embodiment

The previous eleventh embodiment was described in which an n channel thin film transistor is taken as an example of a thin film transistor. In the twelfth embodiment, the main steps in the method of fabricating a p type thin film transistor will be described hereinafter.

Following the above-described step shown in FIG. 4, predetermined photolithography is applied to form a resist pattern 62, as shown in FIG. 65.

Using this pattern 62 as a mask, boron is implanted into polycrystalline silicon film 4a with a dosage of $5 \times 10^{13}$ atom/$cm^2$ and acceleration energy of 60 KeV, for example, to obtain impurity regions 4ab and 4ac. The implanted amount thereof corresponds to the amount of implantation of the GOLD region. Impurity region 4aa functioning as the channel is provided between impurity regions 4ab and 4ac. Then, ashing and chemical treatment are applied to remove resist pattern 62.

Figure 66:
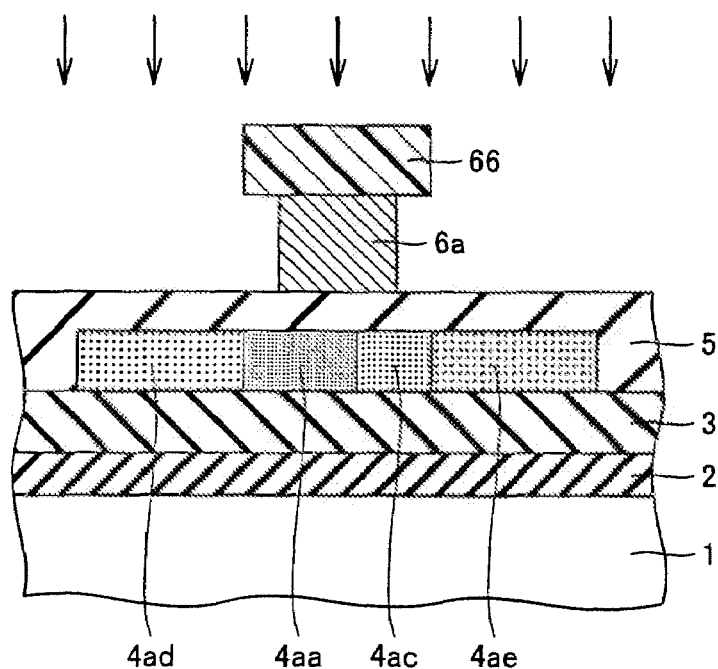
FIG. 66 is a sectional view of the semiconductor device of the twelfth embodiment, representing a step carried out after the step of FIG. 65.

Then, a process similar to the process corresponding to the steps shown in FIGS. 7-9 set forth above is carried out to form gate electrode 6a on gate insulation film 5, as shown in FIG. 66. In this case, resist pattern 66 is formed so as to overlap in plane with impurity region 4ac located at the drain side out of impurity regions 4ab and 4ac, and not overlap with impurity region 4ab.

Application of wet etching allows the side face of the chromium film that becomes the gate electrode to be etched. The etched amount can be controlled by the period of time of overetching.

Using remaining resist pattern 66 as a mask, boron is implanted into impurity regions 4ab and 4ac with a dosage of $1 \times 10^{15}$ atom/$cm^2$ and acceleration energy of 60 KeV, for example, to obtain impurity regions 4ad and 4ae identified as a source region and a drain region. Then, ashing and chemical treatment are applied to remove resist pattern 66.

Figure 67:
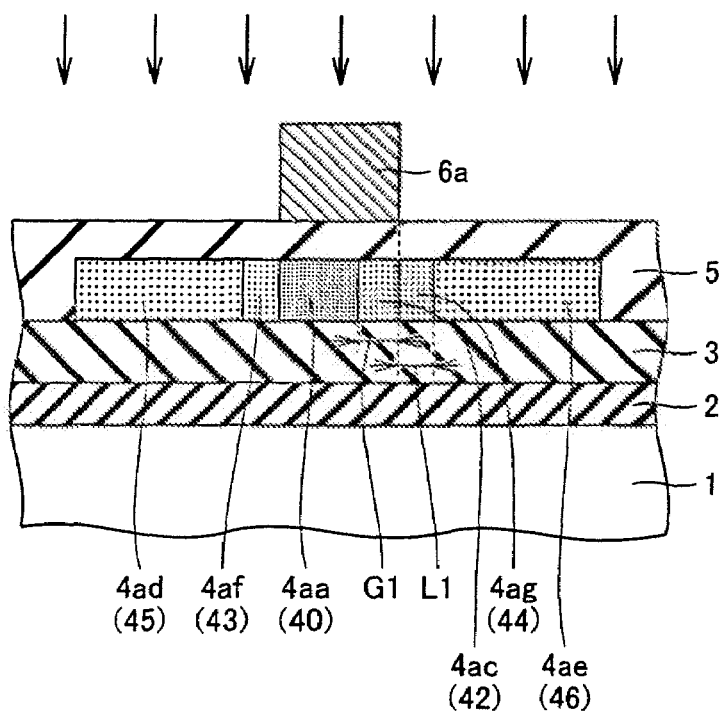
FIG. 67 is a sectional view of the semiconductor device of the twelfth embodiment, representing a step carried out after the step of FIG. 66.

Referring to FIG. 67, using gate electrode 6a as a mask, boron is implanted into impurity regions 4ab and 4ac with a dosage of $5 \times 10^{13}$ atom/$cm^2$ and acceleration energy of 60 KeV, for example, to obtain impurity regions 4af and 4ag identified as the LDD regions.

Thus, impurity region 4af is identified as LDD region 43, and no GOLD region is formed at the source side. At the drain side, impurity region 4ac is identified as GOLD region 42, and impurity region 4ag is identified as LDD region 44.

Figures 68, 69:
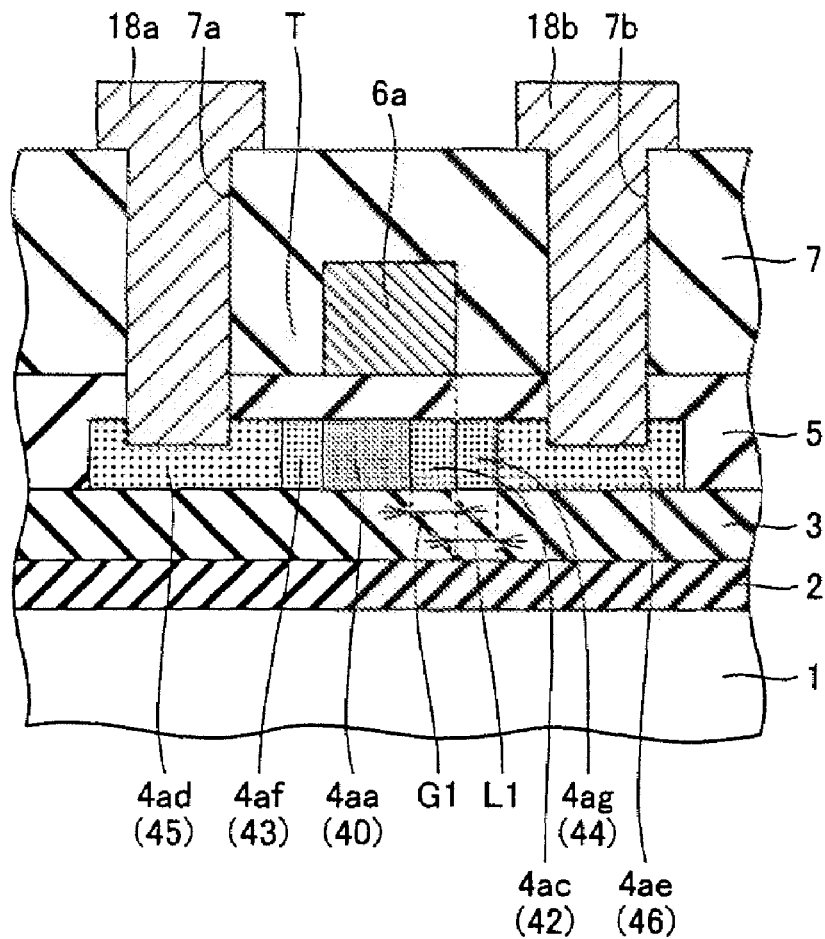
FIG. 68 is a sectional view of the semiconductor device of the twelfth embodiment, representing a step carried out after the step of FIG. 67.
FIG. 69 represents the results of source-drain breakdown voltage of thin film transistors in the twelfth embodiment.

Then, a process similar to the process corresponding to the steps shown in FIGS. 11-13 set forth before is carried out to produce a thin film transistor of a GOLD structure, as shown in FIG. 68.

In such a thin film transistor of a GOLD structure formed as set forth above, GOLD region 42 is formed at the drain side, and no GOLD region is formed at the source side. LDD region 43 is formed between source region 45 and channel region 40. LDD region 44 is formed between GOLD region 42 and drain region 46.

Results of measurement of source-drain breakdown voltage for the thin film transistor set forth above will be described hereinafter. For the measurement, a thin film transistor was employed having the following parameters: gate width 20 µm; effective gate length 5 µm; overlapping length G2 of GOLD region 42 at drain side 1.5 µm, length L2 in the direction of channel length of LDD region 44 at drain side 0.3 µm; and width of gate electrode 6a in the direction of the channel length 7 µm.

For comparison, measurement was conducted using a thin film transistor of a conventional GOLD structure in which the overlapping length of the GOLD region located at the drain side is equal to the overlapping length of the GOLD region located at the source side, and also the thin film transistor described in the third embodiment.

The measured results of the source-drain breakdown voltage are shown in FIG. 69. The measurement conditions are as set forth in the foregoing. As shown in FIG. 69, it is appreciated that the thin film transistor of a GOLD structure of the present embodiment exhibits a source-drain breakdown voltage of a level higher than that of a thin film transistor of a conventional GOLD structure and the thin film transistor described in the third embodiment.

Then, respective configurations of the thin film transistor of GOLD structure of the present embodiment, the thin film transistor of a conventional GOLD structure, and the thin film transistor of the second embodiment were actually observed to estimate the parasitic capacitance.

As a result, it was estimated that the parasitic capacitance caused by GOLD region 42 in the thin film transistor of a GOLD structure of the present embodiment is reduced to approximately 50% of the parasitic capacitance of the thin film transistor of a conventional GOLD structure. Furthermore, it was estimated that the parasitic capacitance is further reduced as compared to the thin film transistor of the second embodiment.

Thus, it was confirmed that the thin film transistor of a GOLD structure of the present embodiment can have the parasitic capacitance further reduced while a breakdown voltage higher than the breakdown voltage of the thin film transistor of a conventional GOLD structure can be ensured.

Thirteenth Embodiment

A liquid crystal display device will be described hereinafter employing a semiconductor device including a thin film transistor. First, the structure of a liquid crystal display device will be described.

Figure 70:
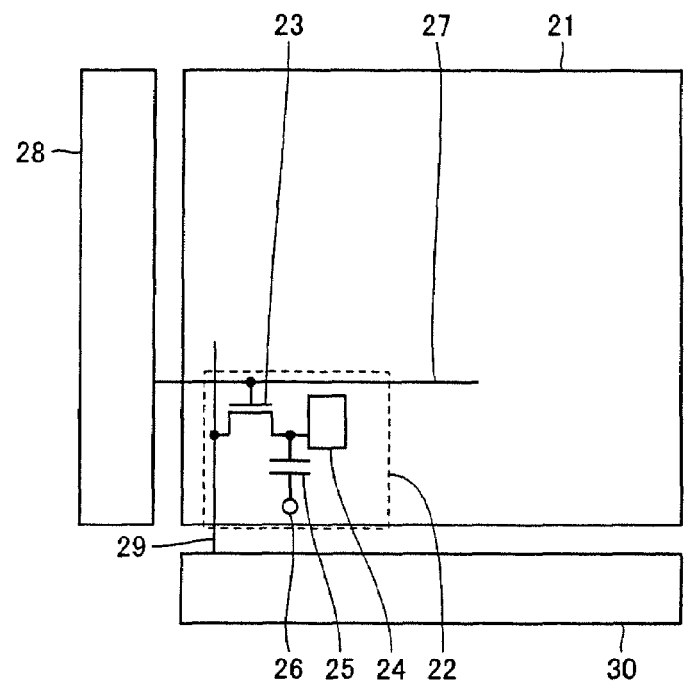
FIG. 70 is a block diagram of a configuration of a liquid crystal display device according to a thirteenth embodiment of the present invention.

Referring to FIG. 70, the liquid crystal display device includes a display unit 21 for displaying an image, and a scanning line driving circuit unit 28 and a data line driving circuit unit 30 to control the operation of a pixel region thin film transistor 23 provided at each of a plurality of pixels 22 constituting display unit 21.

Pixels 22 are arranged in an array in display unit 21. In a pixel 22, pixel capacitance (not shown) is formed having liquid crystal (not shown) filled between a pixel electrode 24 and a counter electrode (not shown). The voltage applied to the liquid crystal is determined by the voltage applied across pixel electrode 24 and the counter electrode. The liquid crystal alignment status is altered by the voltage applied to the liquid crystal, whereby the intensity of light transmitted through the liquid crystal is controlled. Storage capacitance 25 is formed between pixel region thin film transistor 23 and common electrode 26.

Pixels 22 arranged in an array are connected to respective data lines 29 connected to data line driving circuit unit 30 and respective scanning lines 27 connected to scanning line driving circuit unit 28. A pixel signal is output from data line driving circuit unit 30. The output pixel signal is applied to pixel 22 via data line 29. Scanning line driving circuit unit 28 outputs a pixel select signal which is provided to pixel 22 via scanning line 27.

Scanning line driving circuit unit 28 mainly includes a shift register and an output circuit. The register is shifted by an input clock signal. When the register attains a high (H) level, the output circuit is switched to an ON voltage of pixel 22. When the register attains a low (L) level, the output circuit is switched to an OFF voltage of pixel 22. Accordingly, scanning line driving circuit unit 28 sequentially applies an ON voltage and an OFF voltage to the scanning line of pixel 22.

Data line scanning circuit unit 30 sequentially latches an input pixel data signal (for example, 6t-bit pixel data) in accordance with the timing of the clock signal. The input pixel data is converted into an analog signal by a DA converter in data line driving circuit unit 30. The pixel data converted into an analog signal is sent onto data line 29.

In the case where an analog signal is sent onto data line 29, the frequency of the analog signal will become higher as it is sequentially transferred to respective data lines (dot-sequential system). Therefore, the system of transmitting pixel data in parallel with a plurality of data lines 29 (line-sequential system) is generally employed to prevent increase of the frequency.

The gate of pixel region thin film transistor 23 of pixel 22 is controlled by the signal sent from scanning line 27. When an ON signal is applied to the gate and the gate of the pixel thin film transistor is turned ON, the signal delivered from data line 29 is accumulated in the pixel capacitance and storage capacitance 25. The accumulated signal is retained in the pixel capacitance and storage capacitance for the duration of one frame until the gate is turned OFF and the screen is rewritten.

If leakage current occurs at the pixel thin film transistor at this stage, the voltage applied to the liquid crystal will be decreased over the retaining time to degrade the display quality of display unit 21. It is therefore necessary to minimize the leakage current in the pixel thin film transistor of display unit 21.

The select signal applied to the gate is output from scanning line driving circuit unit 28. In order to input a select signal to the gate, all the gate capacitance of the pixel thin film transistor connected to the gate must be charged. Since many pixels 22 are connected to the gate, the capacitance to be charged is considerably large. Therefore, a high driving capability is required for scanning line driving circuit unit 28 to charge such capacitance. Also, a high ON current is required.

Since the pixel signal from the data line driving circuit is sequentially output to respective data lines during the period of gate selection, the frequency of the pixel signal is increased significantly as compared to that of a select signal. Therefore, a high operation rate is required for data line driving circuit unit 30.

In order to write a pixel signal sent from data line driving circuit unit 30 into pixel 22, the stray capacitance typical of the capacitance with the gate electrode must be charged, in addition to the pixel capacitance and storage capacitance. Therefore, a high driving capability is required for the data line driving circuit. Thus, a high operating rate, high driving capability, and high ON current are required for the data line driving circuit.

The required properties differ for each of pixel 22, scanning line driving circuit unit 28 and data line driving circuit unit 30. A method of fabricating a liquid crystal display device including different types of thin film transistors such as a thin film transistor of a GOLD structure as one type thereof to accommodate the different properties will be described hereinafter.

Similarly as described in the first embodiment, silicon nitride film 2 and silicon oxide film 3 are formed on glass substrate 1. An island-shaped polycrystalline silicon film is formed on each region of silicon oxide film 2 corresponding to predetermined regions R1-R3 where respective thin film transistors are to be formed at glass substrate 1 (refer to FIG. 71). A thin film transistor of a different type is to be formed at each of regions R1-R3.

Figure 71:
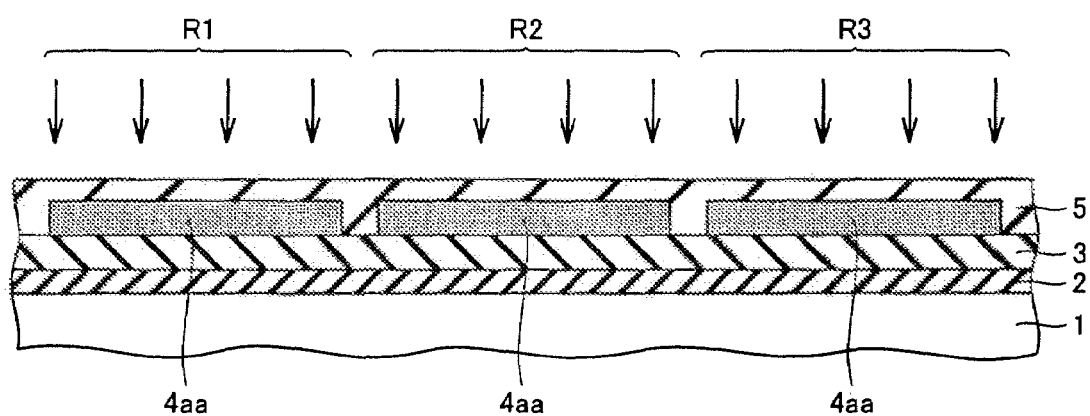
FIG. 71 is a sectional view of the liquid crystal display device of the thirteenth embodiment, representing a step of a fabrication method thereof.

A gate insulating film 5 of a silicon oxide film is deposited so as to cover the polycrystalline silicon film. Referring to FIG. 71, boron is implanted into the polycrystalline silicon film with a dosage of $1\times10^{12}$ atom/cm$^2$ and acceleration energy of 60 KeV, for example, to control the threshold value of the thin film transistor, whereby island-shaped impurity regions 4aa are provided.

Referring to 72, predetermined photolithography is applied to form a resist pattern 62a required to provide a thin film transistor of an n type GOLD structure at region R1, and to form a resist pattern 62b covering the area of regions R2 and R3 where a thin film transistor of an n type LDD structure and a general P type thin film transistor are to be formed, respectively.

Using resist patterns 62a and 62b as masks, phosphorus is implanted into impurity regions 4aa with a dosage of $1\times10^{13}$ atom/cm$^2$ and acceleration energy of 80 KeV, for example, whereby impurity regions 4ab and 4ac are obtained. The implanted amount thereof corresponds to the amount of implantation of the GOLD region. Then, ashing and chemical treatment are applied to remove resist patterns 62a and 62b.

Figure 73:
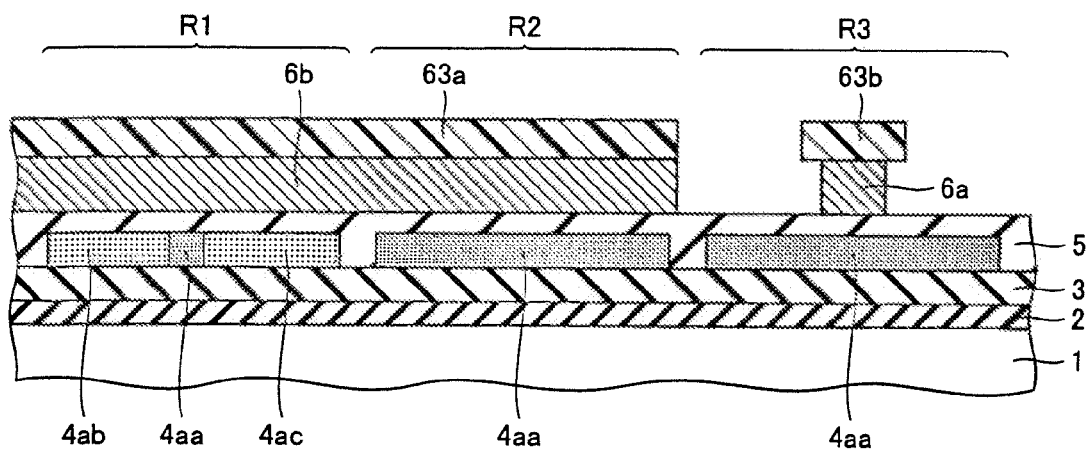
FIG. 73 is a sectional view of the semiconductor device of the thirteenth embodiment, representing a step carried out after the step of FIG. 72.

Then, a chromium film of approximately 200 nm in film thickness (not shown) is formed all over gate insulation film 5 by sputtering. Predetermined photolithography is applied to form a resist pattern 63b required to create a pattern of a gate electrode at region R3, and to form a resist pattern 63a all over in regions R1 and R2 (refer to FIG. 73).

Using resist patterns 63a and 63b as masks, the chromium film is subjected to wet etching, whereby gate electrode 6a is obtained at region R3. The chromium film at regions R1 and R2 identified as chromium film 6b remains. Then, ashing and chemical treatment are applied to remove resist patterns 63a and 63b.

Figure 74:
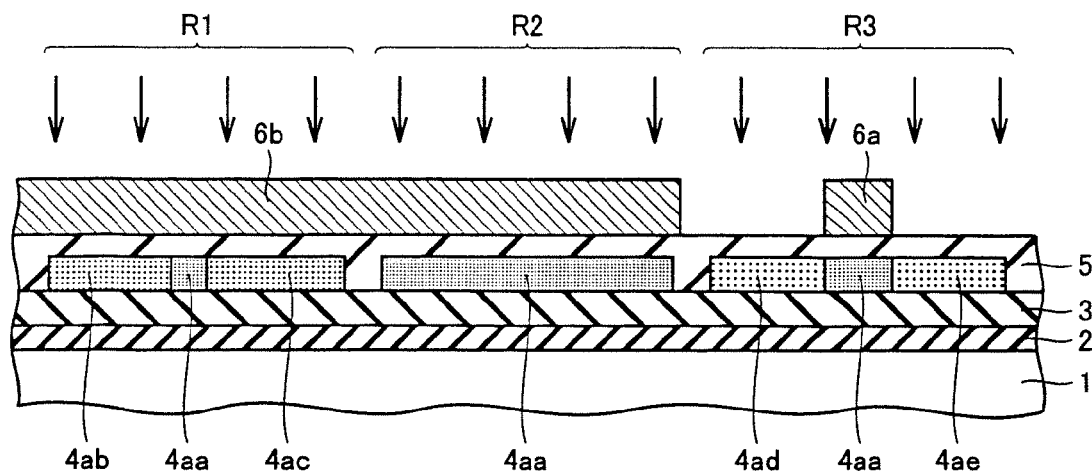
FIG. 74 is a sectional view of the semiconductor device of the thirteenth embodiment, representing a step carried out after the step of FIG. 73.

Referring to FIG. 74, using the remaining chromium film 6b and gate electrode 6a as masks, boron is implanted with a dosage of $1 \times 10^{15}$ atom/cm$^2$ and acceleration energy of 60 KeV, for example, to form impurity regions 4ad and 4ae identified as the source region and drain region, respectively, of a p type thin film transistor at impurity region 4aa located at region R3. At this stage, boron is not implanted into regions R1 and R2 since the area is covered by chromium film 6b.

Figure 75:
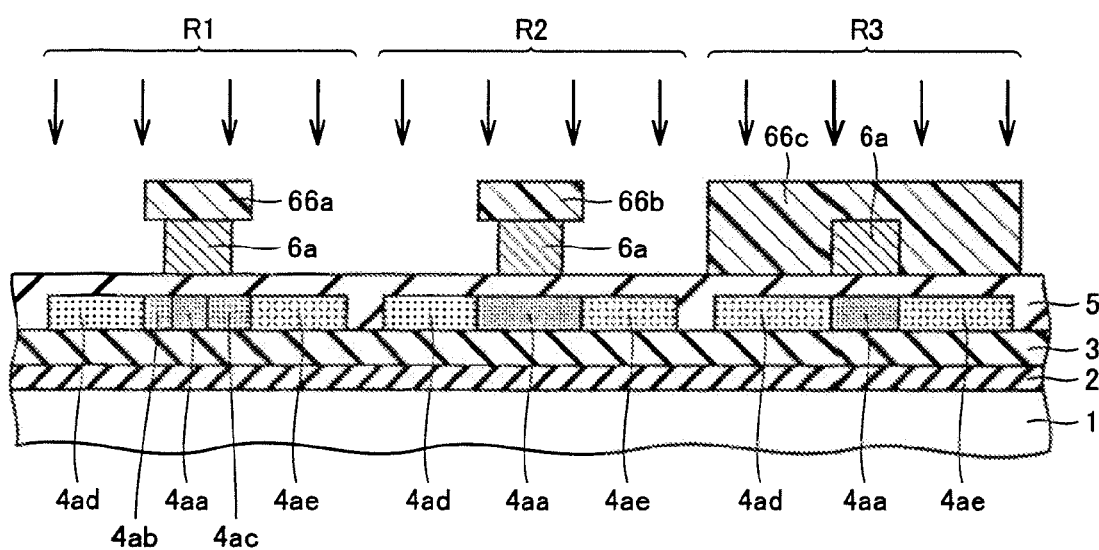
FIG. 75 is a sectional view of the semiconductor device of the thirteenth embodiment, representing a step carried out after the step of FIG. 74.

Referring to FIG. 75, predetermined photolithography is applied to form resist patterns 66a and 66b required to create a pattern of a gate electrode at regions R1 and R2, and to form resist pattern 66c all over in region R3.

At this stage, resist pattern 66a is formed so as to overlap in plane with impurity regions 4ab and 4ac. Particularly, resist pattern 66a is formed such that the overlapping length in the direction of the channel length between resist pattern 66a and impurity region 4ac located at the drain side is longer than the overlapping length in the direction of the channel length between resist pattern 66a and impurity region 4ab located at the source side. The overlapping region in plane between resist pattern 66a and impurity regions 4ab and 4ac is identified as the GOLD region.

Using resist patterns 66a, 66b and 66c as masks, chromium film 6b is etched, resulting in a gate electrode 6a at each of regions R1 and R2. At this stage, gate electrode 6a formed at region R3 is not subjected to etching since it is covered by resist pattern 66c.

Application of wet etching allows the side of the chromium film identified as the gate electrode to be etched. The amount of etching thereof can be controlled by the duration of overetching.

Using the remaining resist patterns 66a, 66b and 66c as masks, phosphorus is implanted with a dosage of $1 \times 10^{14}$ atom/cm$^2$ and acceleration energy of 80 KeV, for example, to obtain an impurity region 4ad and an impurity region 4ae identified as a source region and drain region, respectively, of a thin film transistor of an n type GOLD structure at impurity regions 4ab and 4ac, respectively, located at region R1.

At region (the impurity region) 4aa located at region R2, impurity region 4ad and impurity region 4ae identified as the source region and drain region, respectively, of a thin film transistor of an n type LDD structure are obtained. At this stage, phosphorus is not implanted into region R3 due to the coverage of resist pattern 6c. Then, ashing and chemical treatment are applied to remove resist patterns 66a, 66b and 66c.

Figure 76:
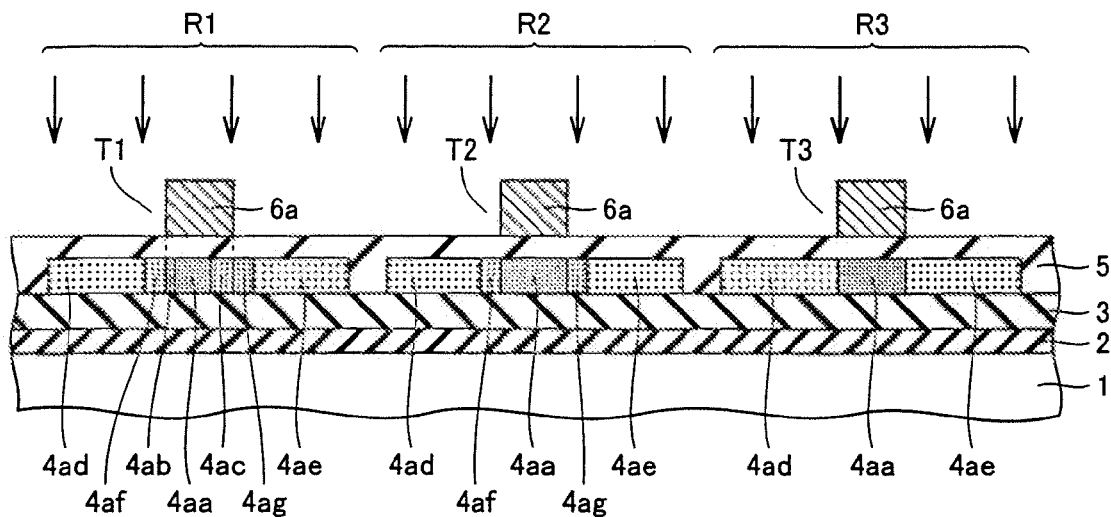
FIG. 76 is a sectional view of the semiconductor device of the thirteenth embodiment, representing a step carried out after the step of FIG. 75.

Referring to FIG. 76, using gate electrode 6a as a mask, phosphorus is implanted with a dosage of $1 \times 10^{13}$ atom/cm$^2$ and acceleration energy of 80 KeV, for example, to obtain impurity region 4af and impurity region 4ag identified as the LDD regions at the source side and the drain side, respectively, of the thin film transistor of an n type GOLD structure at the remaining impurity regions 4ab and 4ac, respectively, located at region R1.

At the area of remaining impurity regions 4ab and 4ac at region R2, impurity region 4af and impurity region 4ag identified as to the LDD regions at the source side and drain side, respectively, of the thin film transistor of an n type LDD structure are obtained.

Although phosphorus is implanted also into boron-implanted impurity regions 4ad and 4ae identified as the source region and drain region, respectively, of the p type thin film transistor at region R3, implantation of phosphorus into impurity regions 4ad and 4ae at region R3 is of no concern since the implanted amount of phosphorus is sufficiently smaller than the implanted amount of boron.

Figure 77:
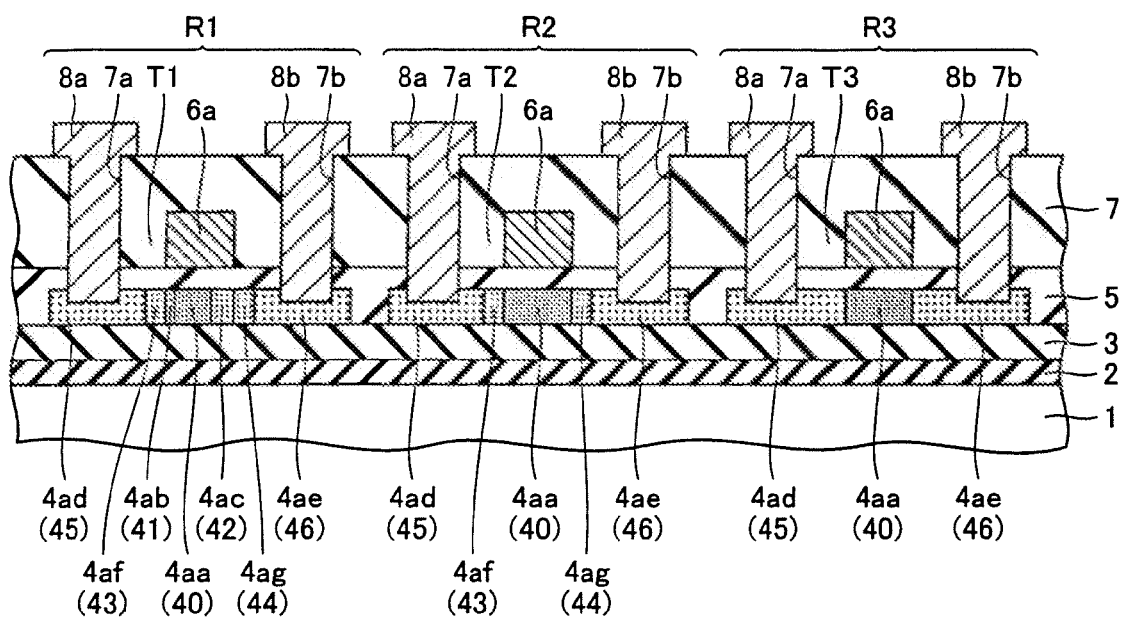
FIG. 77 is a sectional view of the semiconductor device of the thirteenth embodiment, representing a step carried out after the step of FIG. 76.

In a manner similar to that described in the first embodiment, an interlayer insulating film 7 of a silicon oxide film is deposited on glass substrate 1, as shown in FIG. 77. Interlayer insulation film 7 is then subjected to predetermined photolithography, whereby a resist pattern (not shown) required to produce a contact hole is formed.

Using that resist pattern as a mask, interlayer insulation film 7 and gate insulation film 5 are subjected to anisotropic etching, whereby a contact hole 7a exposing the surface of impurity region 4ad and a contact hole 7b exposing the surface of impurity region 4ae are formed at regions R1-R3.

Then, a multilayer film of chromium and aluminum (not shown) is formed on interlayer insulation film 7 so as to fill contact holes 7a and 7b. Predetermined photolithography is applied on the multilayer film to form a resist pattern (not shown) required to produce an electrode. Using that resist pattern as a mask, wet etching is applied to result in source electrode 8a and drain electrode 8b at respective regions R1-R3.

Thus, a thin film transistor T1 of an n type GOLD structure, a thin film transistor T2 of an n type LDD structure, and a general p type thin film transistor T3 are formed at regions R1, R2, and R3, respectively.

At thin film transistor T1 of an n type GOLD structure, impurity region 4ad and impurity region 4ae are identified as source region 45 and drain region 46, respectively. Impurity regions 4ab and 4ac are identified as GOLD regions 41 and 42. Impurity regions 4af and 4ag are identified as LDD regions 43 and 44. At GOLD regions 41 and 42, the length in the direction of the channel length of GOLD region 42 located at the drain side is set longer than the length in the direction of the channel length of GOLD region 41 located at the source side.

At thin film transistor T2 of an n type LDD structure, impurity region 4ad and impurity region 4ae are identified as source region 45 and drain region 46, respectively. Impurity regions 4af and 4ag are identified as LDD regions 43 and 44. At p type thin film transistor T3, impurity region 4ad and impurity region 4ae are identified as source region 45 and drain region 46, respectively.

In the liquid crystal display device set forth above, the thin film transistor of a GOLD structure and the thin film transistor of an LDD structure are arranged appropriately based on a predetermined layout in accordance with respective properties. For example, at circuitry where an ON current is required such as a liquid crystal driving circuit, a thin film transistor of a GOLD structure is employed. At circuitry where a relatively low OFF current is required such as a pixel thin film transistor, a thin film transistor of an LDD structure is employed.

A thin film transistor of an LDD structure has a smaller size as compared to a thin film transistor of a GOLD structure. Therefore, by appropriately arranging thin film transistors of an LDD structure, increase of the area occupied by the circuitry in a liquid crystal display device can be suppressed.

Comparison of the occupying area of the gate in a thin film transistor of a GOLD structure and a thin film transistor of an LDD structure is specifically set forth hereinafter. The thin film transistor of a GOLD structure of interest has the following parameters: gate width 10 µm; effective gate length 5 µm; overlapping length of GOLD region 42 at drain side 1.5 µm; length in the direction of channel length of LDD region 44 at the drain side 0.3 µm; overlapping length of GOLD region 41 at source side 0.5 µm; length in direction of channel length of LDD region 44 at source side 0.3 µm; and width of gate electrode 6a in direction of channel length 7 µm.

The thin film transistor of an LDD structure of interest has the following parameters: gate width of 10 μm; effective gate length 5 μm; respective length in direction of channel length of LDD region 45 at drain side and source side 0.3 μm.

Figures 78, 79:
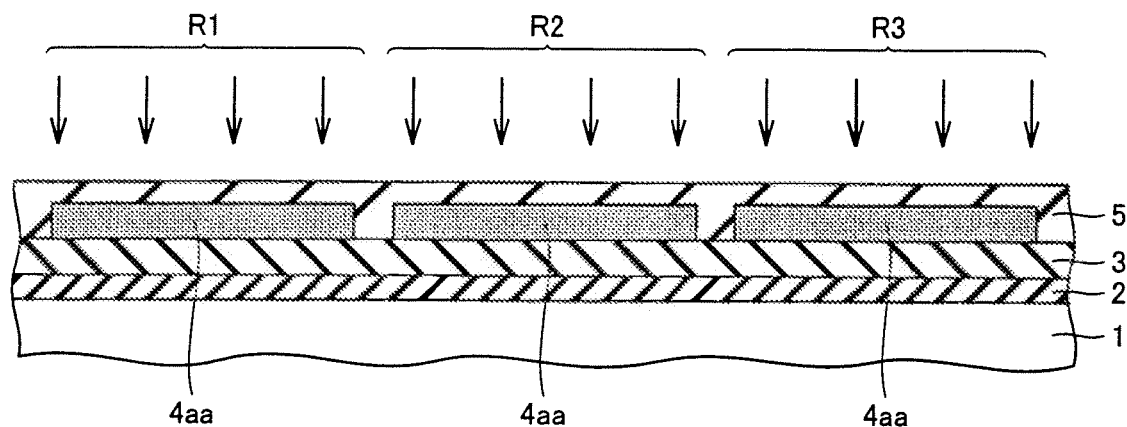
FIG. 78 represents the gate occupying area in a thin film transistor of the thirteenth embodiment.
FIG. 79 is a sectional view of a liquid crystal display device according to a fourteenth embodiment of the present invention, representing a step of a fabrication method thereof.

As shown in FIG. 78, the occupying area of the gate in the thin film transistor of a GOLD structure of the present invention is approximately 70 μm² whereas the occupying area of a thin film transistor of a conventional LDD structure is approximately 50 μm². It is therefore appreciated that the gate occupying area of the thin film transistor of an LDD structure is approximately 70% of the occupying area of the gate of a thin film transistor of a GOLD structure.

In a liquid crystal display device, the area occupied by the logic circuitry is relatively large. By employing a thin film transistor of an LDD structure in the logic circuit, increase of the occupying area of the circuitry can be minimized.

By appropriate arrangement of a thin film transistor of a GOLD structure, a thin film transistor of an LDD structure, or the like corresponding to the current property and the like required in each circuitry in such a liquid crystal display device, increase of the occupying area of circuitry can be suppressed to the minimum while exploiting the maximum performance of the liquid crystal display device.

Figure 72:
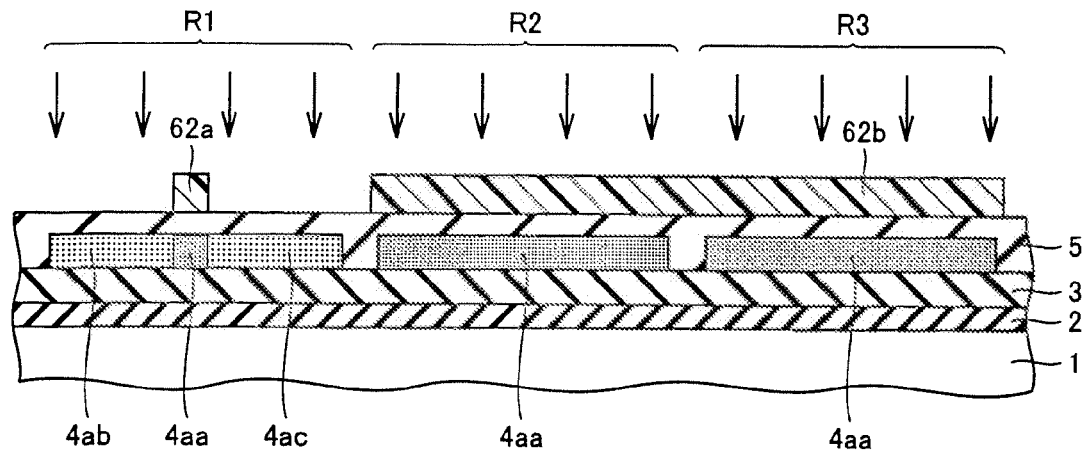
FIG. 72 is a sectional view of the semiconductor device of the thirteenth embodiment, representing a step carried out after the step of FIG. 71.

In accordance with the fabrication method of a liquid crystal display device set forth above, a thin film transistor of a GOLD structure can be formed simultaneous to formation of other types of thin film transistors such as of an LDD structure or general thin film transistor by just adding a mask directed to forming a resist pattern (FIG. 72) identified as a mask for implantation.

Fourteenth Embodiment

The fourteenth embodiment is directed to another example of a liquid crystal display device including different types of thin film transistors such as a thin film transistor of a GOLD structure. First, a fabrication method of such another liquid crystal display device will be described hereinafter. By a step similar to that of FIG. 71 described previously, island-shaped impurity regions 4aa are formed for the formation of different types of thin film transistors in regions R1-R3, as shown in FIG. 79.

Figure 80:
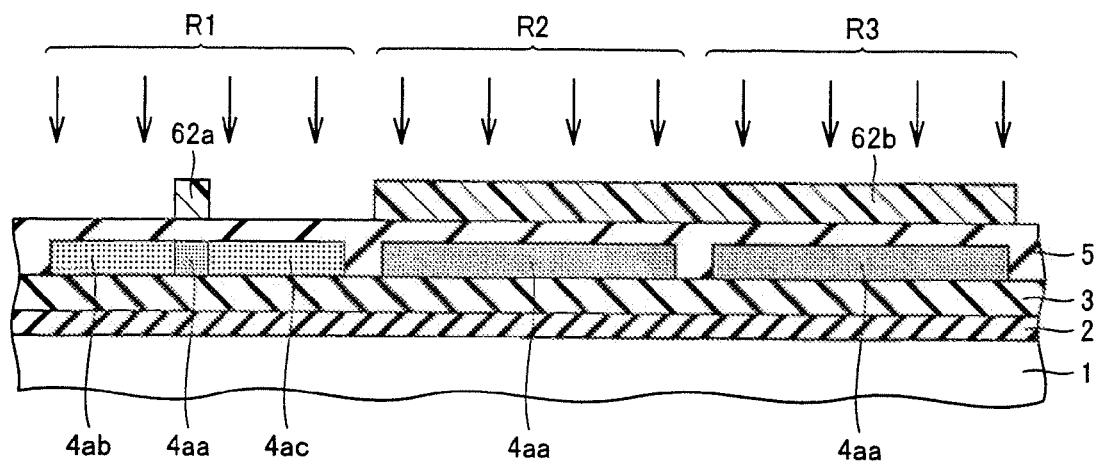
FIG. 80 is a sectional view of the semiconductor device of the fourteenth embodiment, representing a step carried out after the step of FIG. 79.

Referring to FIG. 80, predetermined photolithography is applied to form a resist pattern 62a required for the formation of a thin film transistor of an n type GOLD structure at region R1, and to form a resist pattern 62b all over in region R2 where a thin film transistor of an n type SD (Single Drain) structure is to be provided and in region R3 where a general p type thin film transistor is to be provided.

Using resist patterns 62a and 62b as masks, phosphorus is implanted with a dosage of $1 \times 10^{13}$ atom/cm² and acceleration energy of 80 KeV, for example, to form impurity regions 4ab and 4ac. The implanted amount thereof corresponds to the amount of implantation of the GOLD region. Then, ashing and chemical treatment are applied to remove resist patterns 62a and 62b.

Then, a chromium film of approximately 200 nm in film thickness (not shown) is formed all over gate insulation film 5 by sputtering. Predetermined photolithography is applied to form a resist pattern 63b required to create a pattern of a gate electrode at region R3, and to form a resist pattern 63a all over in regions R1 and R2 (refer to FIG. 81).

Figure 81:
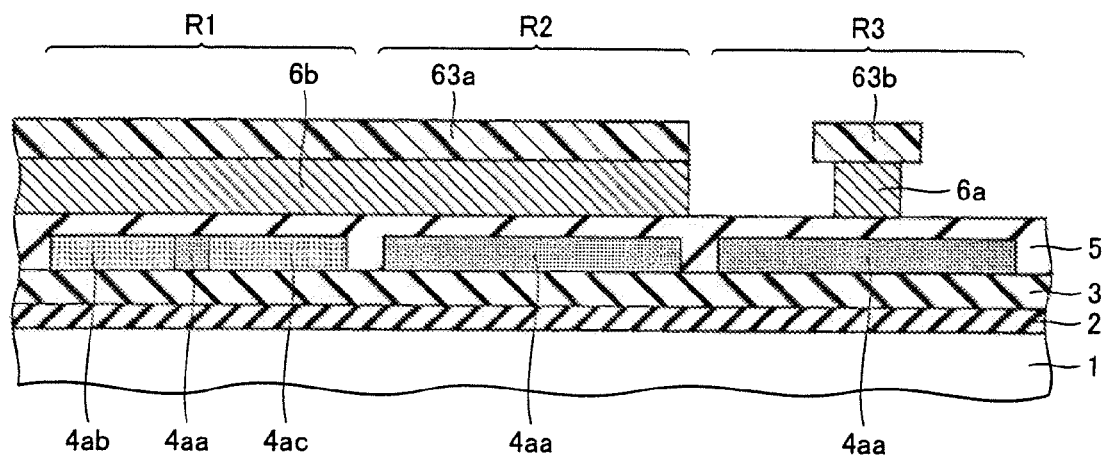
FIG. 81 is a sectional view of the semiconductor device of the fourteenth embodiment, representing a step carried out after the step of FIG. 80.

Using resist patterns 63a and 63b as masks, the chromium film is subjected to wet etching, whereby gate electrode 6a is obtained at region R3, as shown in FIG. 81. The chromium film at regions R1 and R2 identified as chromium film 6b remains. Then, ashing and chemical treatment are applied to remove resist patterns 63a and 63b.

Figure 82:
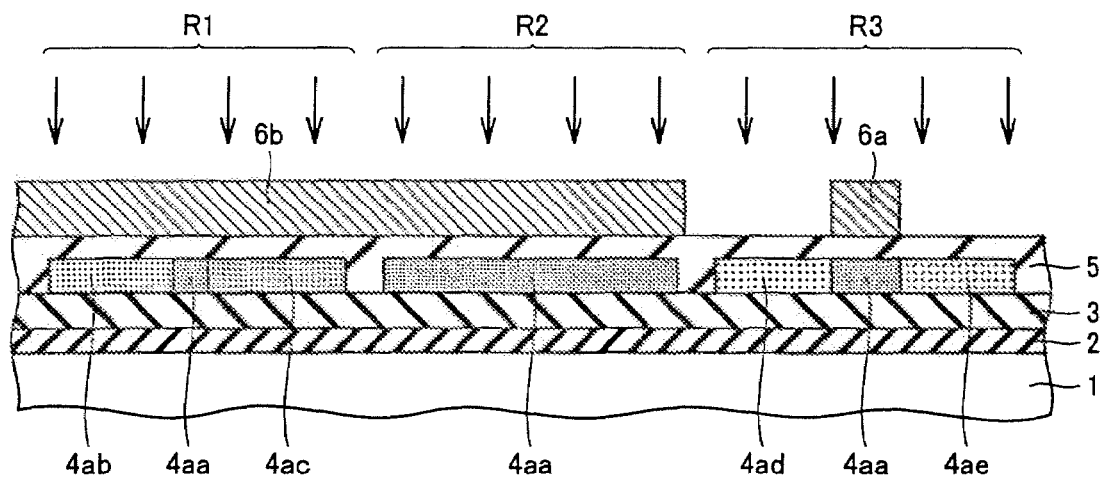
FIG. 82 is a sectional view of the semiconductor device of the fourteenth embodiment, representing a step carried out after the step of FIG. 81.

Referring to FIG. 82, using the remaining chromium film 6b and gate electrode 6a as masks, boron is implanted with a dosage of $1 \times 10^{15}$ atom/cm² and acceleration energy of 60 KeV, for example, to form impurity regions 4ad and 4ae identified as the source region and drain region, respectively, of a p type thin film transistor at impurity region 4aa located at region R3. At this stage, boron is not implanted into regions R1 and R2 since the area is covered by chromium film 6b.

Figure 83:
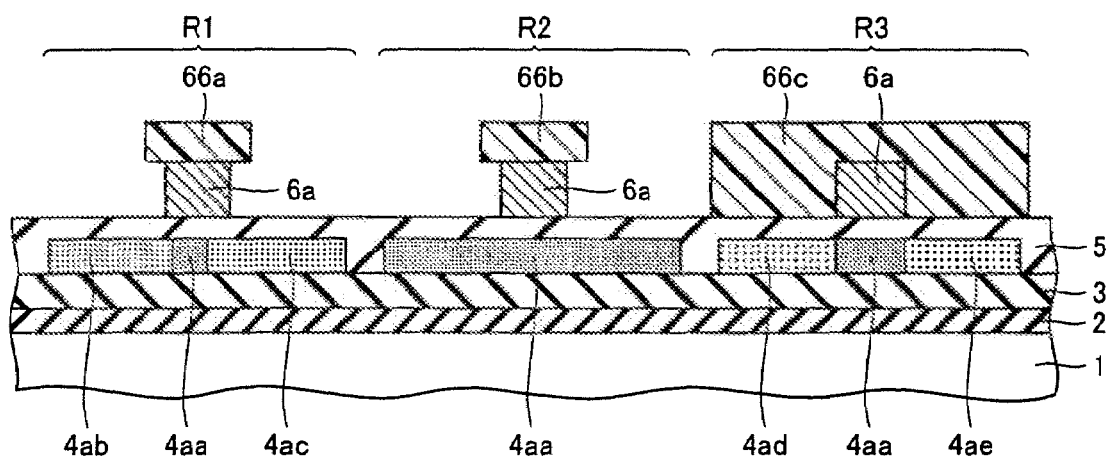
FIG. 83 is a sectional view of the semiconductor device of the fourteenth embodiment, representing a step carried out after the step of FIG. 82.

Referring to FIG. 83, predetermined photolithography is applied to form resist patterns 66a and 66b required to create a pattern of a gate electrode at regions R1 and R2, and to form resist pattern 66c all over in region R3.

At this stage, resist pattern 66a is formed so as to overlap in plane with impurity regions 4ab and 4ac. Particularly, resist pattern 66a is formed such that the overlapping length in the direction of the channel length between resist pattern 66a and impurity region 4ac located at the drain side is longer than the overlapping length in the direction of the channel length between resist pattern 66a and impurity region 4ab located at the source side. The overlapping region in plane between resist pattern 66a and impurity regions 4ab and 4ac is identified as the GOLD region.

Using resist patterns 66a, 66b and 66c as masks, chromium film 6b is etched, resulting in a gate electrode 6a at each of regions R1 and R2. At this stage, gate electrode 6a formed at region R3 is not subjected to etching since it is covered by resist pattern 66c. Then, ashing and chemical treatment are applied to remove resist patterns 66a, 66b and 66c.

As shown in FIG. 84, predetermined photolithography is applied to form a resist pattern 67 all over region R3. Using gate electrode 6a and resist patterns 67 as masks, phosphorus is implanted with a dosage of $1 \times 10^{14}$ atom/cm² and acceleration energy of 80 KeV, for example, to obtain impurity region 4ad and impurity region 4ae identified as a source region and drain region, respectively, of a thin film transistor of an n type GOLD structure at impurity regions 4ab and 4ac, respectively, located at region R1.

At impurity regions 4ab and 4ac remaining at region R2, impurity region 4ad and impurity region 4ae identified as the source region and drain region, respectively, of a thin film transistor of an n type LDD structure are obtained. At this stage, phosphorus is not implanted into region R3 due to the coverage of resist pattern 67. Then, ashing and chemical treatment are applied to remove resist pattern 67.

By a step similar to that of FIG. 77 described previously, interlayer insulating film 7 of a silicon oxide film is deposited on glass substrate 1, as shown in FIG. 85. Contact hole 7a exposing the surface of impurity region 4ad and contact hole 7b exposing the surface of impurity region 4ae at regions R1-R3 are formed in interlayer insulating film 7. Then, source electrode 8a and drain electrode 8b are formed at respective regions R1-R3 so as to fill contact holes 7a and 7b.

Thus, a thin film transistor T4 of an n type GOLD structure, a thin film transistor T5 of an n type SD structure, and a general p type thin film transistor T6 are formed at regions R1, R2 and R3, respectively.

At thin film transistor T4 of an n type GOLD structure, impurity region 4ad and impurity region 4ae are identified as source region 45 and drain region 46, respectively. Impurity regions 4ab and 4ac are identified as GOLD regions 41 and 42. Impurity regions 4af and 4ag are identified as LDD regions 43 and 44. At GOLD regions 41 and 42, the length in the direction of the channel length of GOLD region 42 located at the drain side is set longer than the length in the direction of the channel length of GOLD region 41 located at the source side.

At thin film transistor T5 of an n type SD structure, impurity region 4ad and impurity region 4ae are identified as source region 45 and drain region 46, respectively. At p type thin film transistor T6, impurity region 4ad and impurity region 4ae are identified as source region 45 and drain region 46, respectively.

In the liquid crystal display device set forth above, the thin film transistor of a GOLD structure and the thin film transistor of an SD structure are arranged appropriately based on a predetermined layout in accordance with respective properties. For example, at circuitry where breakdown voltage is not required such as a logic circuit, a thin film transistor of an SD structure is employed. At circuitry where breakdown voltage is required such as a liquid crystal driving circuit or pixel unit (thin film transistor), a thin film transistor of a GOLD structure is employed.

A thin film transistor of an LDD structure has a smaller size as compared to a thin film transistor of a GOLD structure. Therefore, by appropriately arranging thin film transistors of an LDD structure, increase of the area occupied by the circuitry in a liquid crystal display device can be suppressed.

Comparison of the occupying area of the gate in a thin film transistor of a GOLD structure and a thin film transistor of an SD structure is specifically set forth hereinafter. The thin film transistor of a GOLD structure of interest has the following parameters: gate width 10 μm; effective gate length 5 μm; overlapping length of GOLD region 42 at drain side 1.5 μm; overlapping length of GOLD region 41 at source side 0.5 μm; and width of gate electrode 6a in direction of channel length 7 μm. The thin film transistor of an SD structure of interest has the following parameters: gate width 10 μm; and effective gate length 5 μm.

As shown in FIG. 86, the occupying area of the gate in the thin film transistor of a GOLD structure of the present invention is approximately 70 μm$^2$ whereas the occupying area of a thin film transistor of a conventional SD structure is approximately 50 μm$^2$. It is therefore appreciated that the gate occupying area of the thin film transistor of an SD structure is approximately 70% of the occupying area of the gate of a thin film transistor of a GOLD structure.

In a liquid crystal display device, the area occupied by the logic circuitry is relatively large. By employing a thin film transistor of an SD structure structure in the logic circuit, increase of the occupying area of the circuitry can be minimized.

By appropriate arrangement of a thin film transistor of a GOLD structure, a thin film transistor of an SD structure, or the like corresponding to the breakdown voltage property and the like required in each circuitry in such a liquid crystal display device, increase of the occupying area of circuitry can be suppressed to the minimum while exploiting the maximum performance of the liquid crystal display device.

In accordance with the fabrication method of a liquid crystal display device set forth above, a thin film transistor of a GOLD structure can be formed simultaneous to formation of other types of thin film transistors such as of an LDD structure or general thin film transistor by just adding a mask directed to forming a resist pattern (FIG. 80) identified as a mask for implantation.

The liquid crystal display device of the thirteenth and fourteenth embodiments was described in which a thin film transistor with a GOLD region at both the drain side and source side was employed as a thin film transistor of a GOLD structure. The present invention is not limited thereto. For example, a thin film transistor having a GOLD region at only the drain side may be employed.

Furthermore, although an example having a general p type thin film transistor formed at region R3 was described, a thin film transistor of an LDD structure or a thin film transistor of a GOLD structure, or a thin film transistor having a combined structure of an LDD structure and GOLD structure may be formed. Accordingly, the breakdown voltage of the p type thin film transistor can be improved.

Respective embodiments of a thin film transistor set forth above are described based on a planar type thin film transistor having a gate electrode formed with the gate insulation film therebetween on a semiconductor layer where a source region, a drain region, and the like are formed.

A thin film transistor of a GOLD structure of the present invention is not limited to such a planar type thin film transistor. A reverse stagger type thin film transistor having a semiconductor layer that is to function as a source region and a drain region and the like formed on a gate electrode with a gate insulation film therebetween may be employed.

In such a thin film transistor of a reverse stagger structure, the parasitic capacitance of the thin film transistor can be reduced without degrading the source-drain breakdown voltage, likewise a planar type thin film transistor, by setting the GOLD length (first overlapping length) in the direction of the channel region of an overlapping region between the gate electrode and one GOLD region arranged opposite to each other, starting from the region where a plane including one side of the gate electrode intersects the semiconductor layer up to the channel region, shorter than the GOLD length (second overlapping length) in the direction of the channel length of the overlapping region between the gate electrode and the other GOLD region arranged opposite to each other, starting from the region where the plane including the other side of the gate electrode intersects the semiconductor layer up to the channel region.

In such a thin film transistor of the reverse stagger structure, a gate electrode is formed, and then a semiconductor layer is formed on the gate electrode with the gate insulation film therebetween. By forming a predetermined implantation mask of a resist pattern or the like in association with the location of the gate electrode and conduct ion implantation towards the semiconductor layer, a predetermined GOLD region, LDD region, source region and drain region can be formed, likewise a planar type thin film transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor device, comprising: forming an electrode on a substrate having a main surface;

forming a predetermined semiconductor layer on said substrate;

forming an insulation film on said substrate between said step of forming an electrode and said step of forming a semiconductor layer;

forming a first mask material so as to cross said semiconductor layer;

introducing impurity ions of a predetermined conductivity type into said semiconductor layer using said first mask material as a mask to form a pair of first impurity regions having a predetermined impurity concentration at a portion of said semiconductor layer located at one region and another region with said mask material therebetween, a portion of said semiconductor layer located right under said mask material being a channel region;

forming on said semiconductor layer a second mask material covering said channel region entirely and respective portions of said first impurity regions constituting a pair; and introducing impurity ions of a predetermined conductivity type into said semiconductor layer using said second mask material as a mask to form a pair of second impurity regions having an impurity concentration higher than said predetermined impurity concentration at a portion of said first impurity regions located at one side and another side with said channel region therebetween, wherein in said step of forming an electrode, said electrode has one side and another side opposite to each other, and all of said channel region and respective portions of said one pair of first impurity regions are formed overlapping with and facing said electrode; and a distance starting from a first region where a plane including said one side of said electrode intersects one of said first impurity regions up to a side of said channel region closest to the first region is set shorter than a distance starting from a second region where a plane including said another side of said electrode intersects the other of said first impurity regions up to a side of said channel region closest to the second region.

* * * * *